US012564032B2

(12) United States Patent
Na et al.

(10) Patent No.: US 12,564,032 B2
(45) Date of Patent: Feb. 24, 2026

(54) SEMICONDUCTOR DEVICE WITH IMPROVED RELIABILITY OF A CONNECTION RELATION BETWEEN A THROUGH VIA AND A LOWER WIRING LAYER

(71) Applicant: SAMSUNG ELECTRONICS CO., LTD., Suwon-si (KR)

(72) Inventors: Sang Cheol Na, Suwon-si (KR); Kyoung Woo Lee, Suwon-si (KR); Min Chan Gwak, Suwon-si (KR); Guk Hee Kim, Suwon-si (KR); Young Woo Kim, Suwon-si (KR); Anthony Dongick Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 510 days.

(21) Appl. No.: 18/127,895

(22) Filed: Mar. 29, 2023

(65) Prior Publication Data

US 2023/0326831 A1 Oct. 12, 2023

(30) Foreign Application Priority Data

Aug. 4, 2022 (KR) ........................ 10-2022-0097089

(51) Int. Cl.
H10D 30/43 (2025.01)
H01L 23/48 (2006.01)
(Continued)

(52) U.S. Cl.
CPC ........... H01L 23/481 (2013.01); H10D 30/43 (2025.01); H10D 30/611 (2025.01);
(Continued)

(58) Field of Classification Search
CPC . H01L 23/481; H01L 23/485; H01L 23/5286; H01L 21/76898; H01L 23/5226;
(Continued)

(56) References Cited

U.S. PATENT DOCUMENTS 8,877,626 B2 * 11/2014 Lee ........................ H10B 43/27
257/288
9,112,045 B2 * 8/2015 Kim ................... H10D 30/0413
(Continued)

FOREIGN PATENT DOCUMENTS

WO 2008/035261 A1 3/2008

OTHER PUBLICATIONS

Communication dated Nov. 28, 2023, issued by the European Patent Office in counterpart European Application No. 23165051.6.
(Continued)

*Primary Examiner* — Maliheh Malek
(74) *Attorney, Agent, or Firm* — Sughrue Mion, PLLC

(57) ABSTRACT

A semiconductor device is provided. The semiconductor device includes: a first substrate; an active pattern extending on the first substrate; a gate electrode extending on the active pattern; a source/drain region on the active pattern; a first interlayer insulating layer on the source/drain region; a sacrificial layer on the first substrate; a lower wiring layer on a lower surface of the sacrificial layer; a through via trench extending to the lower wiring layer by passing through the first interlayer insulating layer and the sacrificial layer in a vertical direction; a through via inside the through via trench and connected to the lower wiring layer; a recess inside the sacrificial layer and protruding from a sidewall of the through via trench in the second horizontal direction; and a through via insulating layer extending along the sidewall of the through via trench and into the recess.

20 Claims, 52 Drawing Sheets

(51) Int. Cl.

| | |
|---|---|
| *H10D 30/60* | (2025.01) |
| *H10D 30/67* | (2025.01) |
| *H10D 62/10* | (2025.01) |
| *H10D 64/01* | (2025.01) |

(52) U.S. Cl.
CPC ..... *H10D 30/6729* (2025.01); *H10D 30/6735* (2025.01); *H10D 62/121* (2025.01); *H10D 64/017* (2025.01)

(58) Field of Classification Search
CPC . H01L 23/528; H01L 23/535; H01L 23/5283; H10D 30/6729; H10D 30/6735; H10D 62/121; H10D 64/017; H10D 30/014; H10D 30/6757; H10D 64/254; H10D 64/256; H10D 30/60; H10D 30/62; H10D 62/10; H10D 62/118; H10D 62/124; H10D 62/235; H10D 64/20; H10D 64/689; H10D 30/701; H10D 30/481–485; H10D 30/47; H10D 30/43–435; H10D 30/019–0198; H10D 30/501–509; H10D 62/119–123; H10D 30/611; H10D 30/615; H10D 30/023; H10D 84/014–0142; H10D 84/0177; B82Y 10/00; Y10S 977/938
See application file for complete search history.

(56) References Cited

U.S. PATENT DOCUMENTS

| | | | | |
|---|---|---|---|---|
| 9,214,351 | B2 * | 12/2015 | Hsiao | G11C 16/26 |
| 9,553,105 | B2 * | 1/2017 | Lee | H10D 30/0413 |
| 9,634,097 | B2 * | 4/2017 | Rabkin | H10B 43/27 |
| 9,941,293 | B1 * | 4/2018 | Pang | H10B 43/35 |
| 9,991,277 | B1 * | 6/2018 | Tsutsumi | H10B 43/27 |
| 9,997,462 | B2 * | 6/2018 | Ha | H10B 43/27 |
| 10,170,638 | B1 * | 1/2019 | Reznicek | H10D 62/151 |
| 10,453,824 | B1 * | 10/2019 | Mochizuki | H01L 21/0245 |
| 10,818,792 | B2 * | 10/2020 | Frougier | H10D 84/83 |
| 10,872,859 | B2 * | 12/2020 | Kim | H10D 64/251 |
| 10,892,337 | B2 * | 1/2021 | Glass | H10D 84/853 |
| 10,985,057 | B2 * | 4/2021 | Jourdain | H01L 21/3212 |
| 11,121,080 | B2 * | 9/2021 | Sasaki | H01L 23/481 |
| 11,264,327 | B2 * | 3/2022 | Chiang | H10D 30/014 |
| 11,380,706 | B2 * | 7/2022 | Park | H10B 41/27 |
| 11,974,434 | B2 * | 4/2024 | Park | H10D 64/037 |
| 12,191,352 | B2 * | 1/2025 | Ando | H10D 30/62 |
| 12,230,692 | B2 * | 2/2025 | Hung | H10D 30/6757 |
| 12,356,680 | B2 * | 7/2025 | Zhou | H10D 30/014 |
| 12,369,353 | B2 * | 7/2025 | Park | H10D 84/0177 |
| 2011/0068466 | A1 * | 3/2011 | Chen | H01L 21/76898 257/737 |

| | | | | |
|---|---|---|---|---|
| 2014/0269078 | A1 * | 9/2014 | Hsiao | G11C 16/0483 365/185.17 |
| 2014/0273373 | A1 * | 9/2014 | Makala | H10D 84/038 438/270 |
| 2016/0043100 | A1 * | 2/2016 | Lee | H01L 23/535 257/324 |
| 2016/0104719 | A1 * | 4/2016 | Jung | H10B 43/27 257/324 |
| 2016/0133643 | A1 * | 5/2016 | Choi | H10B 43/27 438/269 |
| 2017/0186765 | A1 * | 6/2017 | Koval | G11C 16/26 |
| 2019/0067321 | A1 * | 2/2019 | Song | H10B 43/27 |
| 2019/0067323 | A1 * | 2/2019 | Xu | H10B 43/27 |
| 2019/0081068 | A1 * | 3/2019 | Huang | H10B 43/27 |
| 2019/0287864 | A1 * | 9/2019 | Cheng | H10D 62/121 |
| 2020/0044023 | A1 * | 2/2020 | Reznicek | H10D 62/151 |
| 2020/0266169 | A1 * | 8/2020 | Kang | H10D 84/0149 |
| 2020/0402906 | A1 * | 12/2020 | Lim | H10B 41/27 |
| 2021/0043649 | A1 * | 2/2021 | Park | H10B 43/27 |
| 2021/0134721 | A1 * | 5/2021 | Chiang | H10D 30/6713 |
| 2021/0210613 | A1 * | 7/2021 | Cho | H10D 64/017 |
| 2021/0217846 | A1 * | 7/2021 | Hashemi | H10D 62/116 |
| 2021/0335709 | A1 * | 10/2021 | Wang | H10D 30/014 |
| 2021/0351079 | A1 * | 11/2021 | Su | H10D 84/0128 |
| 2022/0037496 | A1 * | 2/2022 | Chen | H10D 30/014 |
| 2022/0052157 | A1 * | 2/2022 | Chang | H10D 64/256 |
| 2022/0059460 | A1 * | 2/2022 | Do | H01L 23/485 |
| 2022/0077062 | A1 * | 3/2022 | Van Dal | H10D 84/038 |
| 2022/0122970 | A1 * | 4/2022 | Do | H01L 23/50 |
| 2022/0131004 | A1 * | 4/2022 | Chen | H01L 21/76897 |
| 2022/0181500 | A1 * | 6/2022 | Ha | H10D 64/015 |
| 2023/0011153 | A1 * | 1/2023 | Kim | H10D 30/6735 |
| 2023/0031546 | A1 * | 2/2023 | Park | H10D 30/43 |
| 2023/0122379 | A1 * | 4/2023 | Min | H10D 62/121 257/347 |
| 2023/0178618 | A1 * | 6/2023 | Bhuiyan | H10D 30/6713 257/288 |
| 2024/0128335 | A1 * | 4/2024 | You | H10D 64/01 |
| 2024/0213316 | A1 * | 6/2024 | Jhan | H10D 30/6735 |
| 2024/0243171 | A1 * | 7/2024 | Kim | H10D 62/118 |
| 2024/0290855 | A1 * | 8/2024 | Bae | H10D 84/0193 |
| 2024/0321989 | A1 * | 9/2024 | Jo | H10D 30/43 |
| 2025/0072116 | A1 * | 2/2025 | Li | H10D 87/00 |
| 2025/0098264 | A1 * | 3/2025 | Na | H10D 84/83 |
| 2025/0107209 | A1 * | 3/2025 | Chang | H10D 30/6211 |
| 2025/0220961 | A1 * | 7/2025 | Lee | H10D 30/6729 |
| 2025/0234712 | A1 * | 7/2025 | Park | H10K 59/122 |
| 2025/0241012 | A1 * | 7/2025 | Lee | H10D 84/83 |
| 2025/0255106 | A1 * | 8/2025 | Lee | H10K 59/122 |
| 2025/0261428 | A1 * | 8/2025 | Kim | H10D 30/014 |

OTHER PUBLICATIONS

Communication dated Dec. 8, 2023, issued by the European Patent Office in counterpart European Application No. 23165051.6.

* cited by examiner

SEMICONDUCTOR DEVICE WITH IMPROVED RELIABILITY OF A CONNECTION RELATION BETWEEN A THROUGH VIA AND A LOWER WIRING LAYER

CROSS-REFERENCE TO RELATED APPLICATION

This application claims priority from Korean Patent Application No. 10-2022-0097089, filed on Aug. 4, 2022, in the Korean Intellectual Property Office, the disclosure of which is incorporated herein by reference in its entirety.

BACKGROUND

1. Field

The present disclosure relates to a semiconductor device.

2. Description of Related Art

As a scaling technique for increasing a density of a semiconductor device, a multi-gate transistor for forming a silicon body of a fin or nano-wire shape on a substrate and forming a gate on a surface of the silicon body has been suggested.

Because this multi-gate transistor uses a three-dimensional channel, the multi-gate transistor may be scaled. Also, even though a gate length of the multi-gate transistor is not increased, a current control capability may be improved. In addition, a short channel effect (SCE) in which a potential of a channel region is affected by a drain voltage may be suppressed effectively.

SUMMARY

One or more embodiments provide a semiconductor device in which a lower wiring layer, which is a power rail or a ground rail, is disposed below a substrate, a sacrificial layer is disposed between a lower surface of the substrate and a lower wiring layer, and a through via insulating layer vertically overlapped with the lower wiring layer is disposed inside the sacrificial layer. The through via insulating layer disposed inside the sacrificial layer may serve as an etch stop layer in a process of forming a lower wiring trench in which a lower wiring layer is formed. Accordingly, the semiconductor device may prevent the lower wiring trench from being excessively etched or slightly etched, thereby improving reliability of a connection relation between a through via and a lower wiring layer.

According to some embodiments, a semiconductor device includes: a first substrate including a first surface and a second surface opposite the first surface; an active pattern extending in a first horizontal direction on the first surface of the first substrate; a gate electrode extending in a second horizontal direction different from the first horizontal direction on the active pattern; a source/drain region on at least one side of the gate electrode on the active pattern; a first interlayer insulating layer on the source/drain region; a sacrificial layer on the second surface of the first substrate; a lower wiring layer on a lower surface of the sacrificial layer; a through via trench extending to the lower wiring layer by passing through the first interlayer insulating layer and the sacrificial layer in a vertical direction; a through via inside the through via trench and connected to the lower wiring layer; a recess inside the sacrificial layer and protruding from a sidewall of the through via trench in the second horizontal direction; and a through via insulating layer including a first portion extending along the sidewall of the through via trench and a second portion in the recess. The second portion of the through via insulating layer is in contact with an uppermost surface of the lower wiring layer.

According to some embodiments, a semiconductor device includes: a first substrate including a first surface and a second surface opposite the first surface; an active pattern extending in a first horizontal direction on the first surface of the first substrate; a gate electrode extending in a second horizontal direction different from the first horizontal direction on the active pattern; an interlayer insulating layer surrounding a sidewall of the gate electrode; a sacrificial layer on the second surface of the first substrate; a lower wiring trench on a lower surface of the sacrificial layer; a lower wiring layer inside the lower wiring trench and spaced apart from the sacrificial layer; a through via connected to the lower wiring layer and passing through the interlayer insulating layer and the sacrificial layer in a vertical direction; and a through via insulating layer including a first portion extending along a sidewall of the through via and a second portion protruding from the first portion in the second horizontal direction. A lower surface of the second portion of the through via insulating layer and the lower surface of the sacrificial layer are provided on a first common plane, and an upper surface of the second portion of the through via insulating layer and an upper surface of the sacrificial layer are provided on a second common plane, and the second portion of the through via insulating layer is in contact with an uppermost surface of the lower wiring layer.

According to some embodiments, a semiconductor device includes: a first substrate including a first surface and a second surface opposite the first surface; an active pattern extending in a first horizontal direction on the first surface of the first substrate; a plurality of nanosheets spaced apart from each other in a vertical direction on the active pattern; a gate electrode extending in a second horizontal direction different from the first horizontal direction on the active pattern, the gate electrode surrounding the plurality of nanosheets; a source/drain region on at least one side of the gate electrode on the active pattern; a first interlayer insulating layer on the source/drain region; a sacrificial layer on the second surface of the first substrate, the sacrificial layer including silicon germanium (SiGe); a second substrate on a lower surface of the sacrificial layer, the second substrate including silicon (Si); a lower wiring layer inside the second substrate; a lower wiring insulating layer between the lower wiring layer and the second substrate; a through via trench extending through the first interlayer insulating layer and the sacrificial layer in the vertical direction to the lower wiring layer; a through via inside the through via trench and connected to the lower wiring layer; a source/drain contact inside the first interlayer insulating layer, the source/drain contact being connected to the source/drain region, and the source/drain contact being in contact with the through via; a recess inside the sacrificial layer, the recess protruding from a sidewall of the through via trench in the second horizontal direction; and a through via insulating layer including a first portion along the sidewall of the through via trench and a second portion inside the recess. The second portion of the through via insulating layer is in contact with an uppermost surface of the lower wiring layer, and the uppermost surface of the lower wiring layer is lower than an upper surface of the sacrificial layer.

The present disclosure is not limited to the specific embodiments set forth herein.

BRIEF DESCRIPTION OF DRAWINGS

The above and other aspects and features will be more apparent from the following description of embodiments with reference to the attached drawings, in which:

FIG. 1 is a schematic layout view illustrating a semiconductor device according to some embodiments;

FIG. 3 is a cross-sectional view taken along line B-B' of FIG. 1;

FIG. 4 is a cross-sectional view taken along line C-C' of FIG. 1;

FIGS. 6 to 34 are views illustrating intermediate operations of a method of manufacturing a semiconductor device according to some embodiments;

FIG. 35 is a cross-sectional view illustrating a semiconductor device according to some other embodiments;

Figure 37:
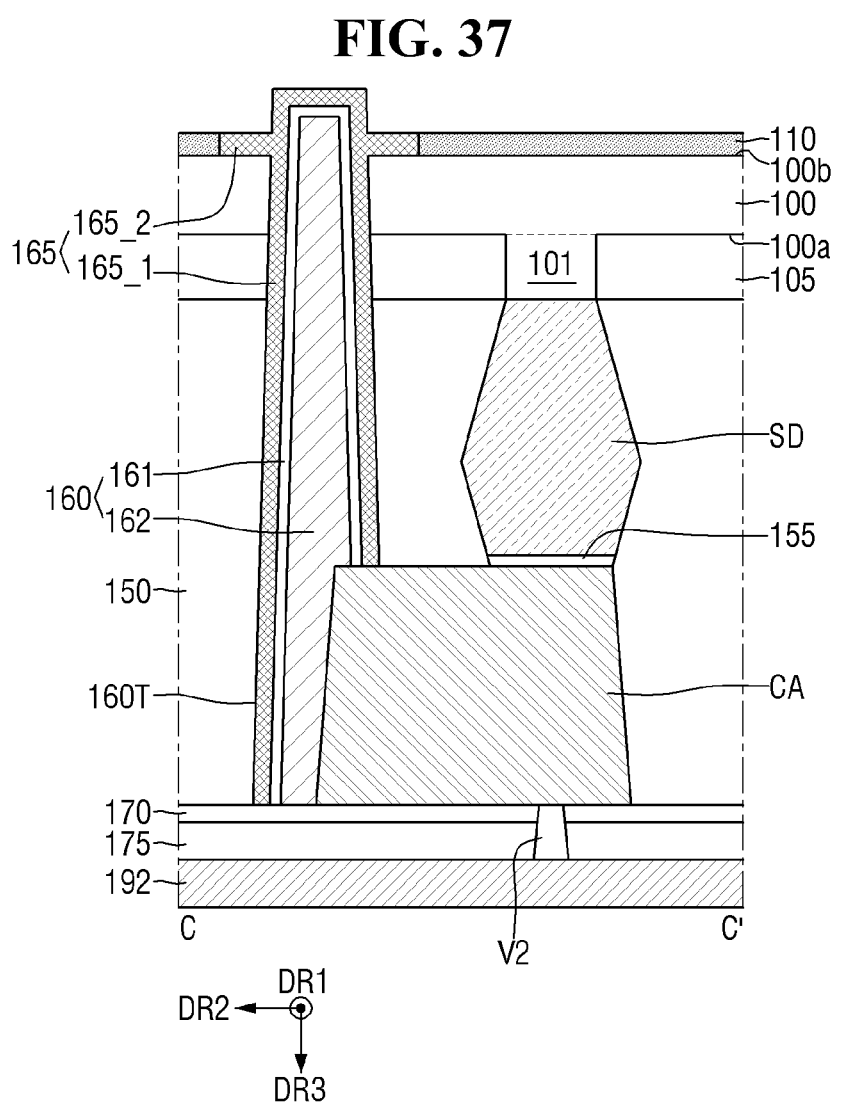

FIGS. 37 to 41 are views illustrating operations of a method of manufacturing a semiconductor device according to some embodiments;

FIGS. 44 to 49 are views illustrating operations of a method of manufacturing a semiconductor device according to some embodiments;

FIG. 50 is a schematic layout view illustrating a semiconductor device according to some other embodiments;

DETAILED DESCRIPTION

Embodiments will now be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. A semiconductor device according to some embodiments includes a multi-bridge channel field effect transistor (MBCFET™) including a nanosheet by way of example, but embodiments are not limited thereto. In some other embodiments, the semiconductor device may include a fin-type transistor (FinFET) that includes a channel region of a fin-type pattern shape.

Hereinafter, a semiconductor device according to some embodiments will be described with reference to FIGS. 1 to 5.

Figure 1:
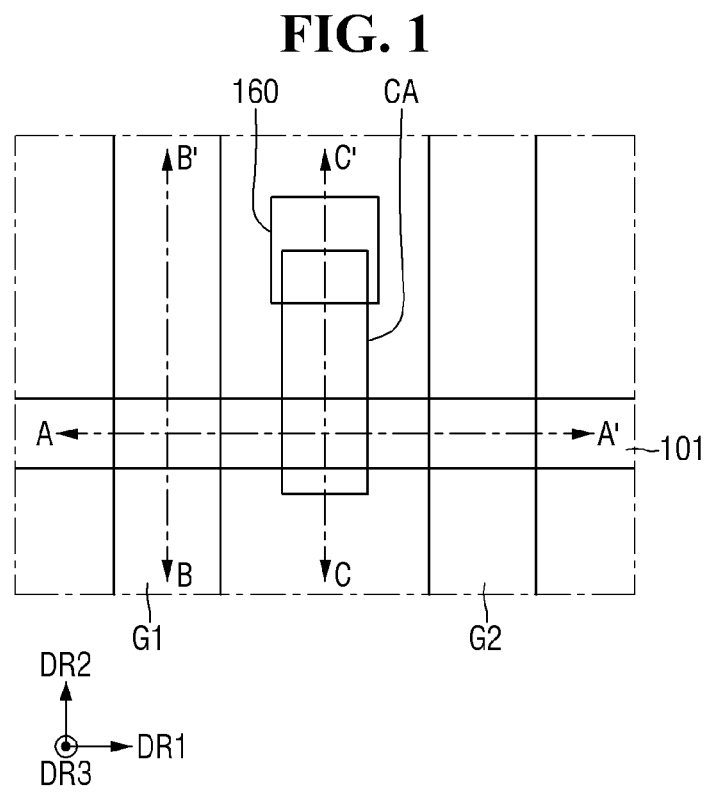
Figure 2:
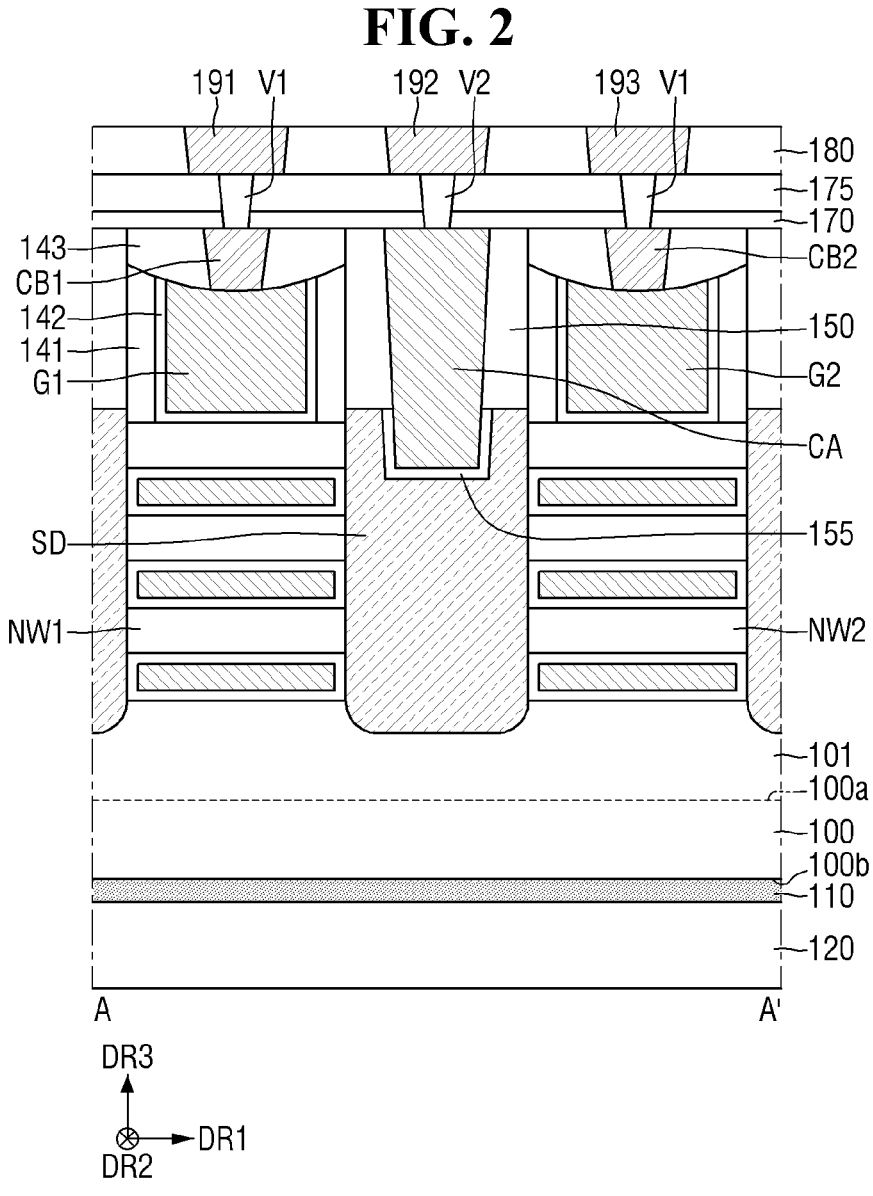
FIG. 2 is a cross-sectional view taken along line A-A' of FIG. 1.
Figure 3:
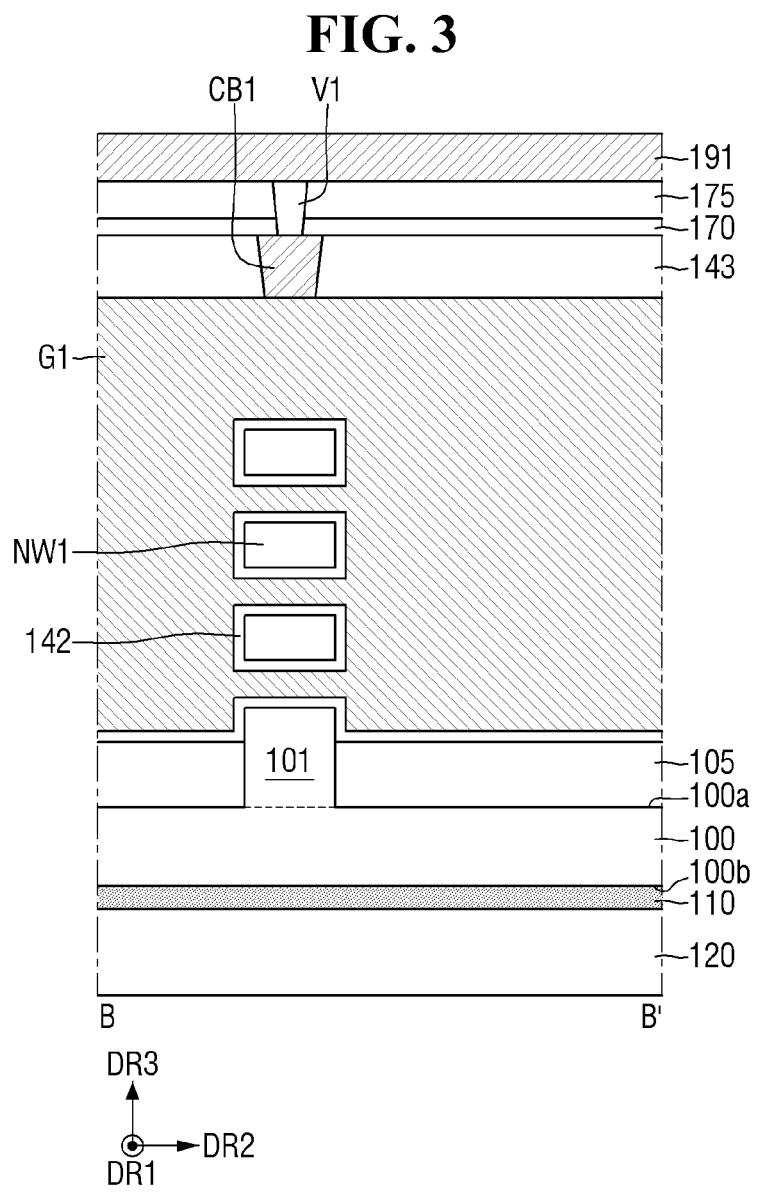
Figure 4:
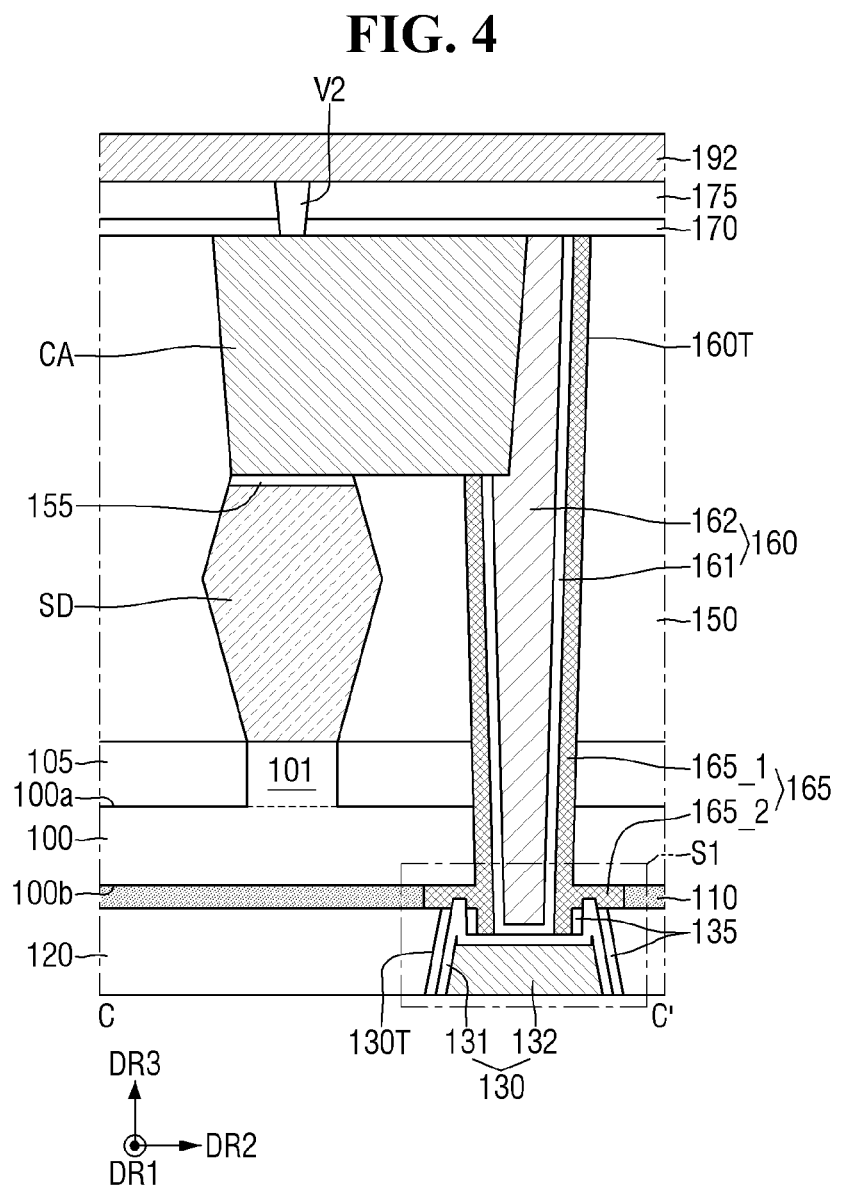
Figure 5:
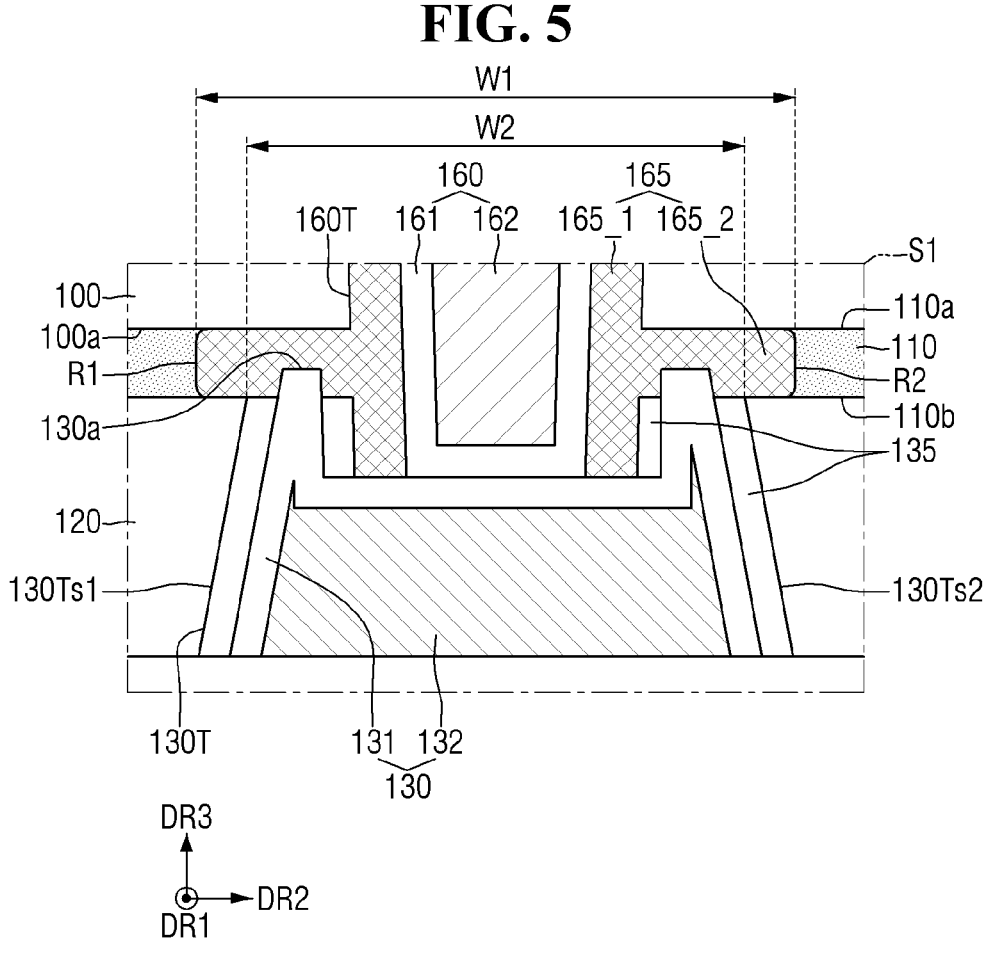
FIG. 5 is an enlarged view illustrating a region S1 of FIG. 4.

FIG. 1 is a schematic layout view illustrating a semiconductor device according to some embodiments. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is an enlarged view illustrating a region S1 of FIG. 4.

Referring to FIGS. 1 to 5, the semiconductor device according to some embodiments includes a first substrate 100, an active pattern 101, a field insulating layer 105, first and plurality of second nanosheets NW1 and NW2, a sacrificial layer 110, a second substrate 120, a lower wiring layer 130, a lower wiring insulating layer 135, first and second gate electrodes G1 and G2, a gate spacer 141, a gate insulating layer 142, a capping pattern 143, a source/drain region SD, a first interlayer insulating layer 150, a silicide layer 155, a through via 160, a through via insulating layer 165, a source/drain contact CA, first and second gate contacts CB1 and CB2, an etch stop layer 170, a second interlayer insulating layer 175, first and second vias V1 and V2, a third interlayer insulating layer 180, and first to third upper wiring layers 191, 192 and 193.

The first substrate 100 may be a silicon substrate or a silicon-on-insulator (SOI). Alternatively, the first substrate 100 may include silicon germanium, silicon germanium on insulator (SGOI), indium antimonide, lead telluride compound, indium arsenide, indium phosphide, gallium arsenide, or gallium antimonide, but embodiments are not limited thereto.

The first substrate 100 may include a first surface 100*a* and a second surface 100*b* opposite the first surface 100*a*. For example, the first surface 100*a* of the first substrate 100 may be an upper surface of the first substrate 100, and the second surface 100*b* of the first substrate 100 may be a lower surface of the first substrate 100.

Hereinafter, each of a first horizontal direction DR1 and a second horizontal direction DR2 may be a direction parallel with the first surface 100*a* of the first substrate 100. The second horizontal direction DR2 may be different from the first horizontal direction DR1. The vertical direction DR3 may be perpendicular to each of the first horizontal direction DR1 and the second horizontal direction DR2.

The active pattern 101 may extend in the first horizontal direction DR1 on the first surface 100*a* of the first substrate 100. The active pattern 101 may protrude from the first surface 100*a* of the first substrate 100 in the vertical direction DR3. For example, the active pattern 101 may be a portion of the first substrate 100, or may include an epitaxial layer grown from the first substrate 100.

The field insulating layer 105 may be disposed on the first surface 100*a* of the first substrate 100. The field insulating layer 105 may surround a sidewall of the active pattern 101. For example, an upper surface of the active pattern 101 may be protrude in the vertical direction DR3 past an upper surface of the field insulating layer 105, but embodiments are not limited thereto. In some other embodiments, the upper surface of the active pattern 101 may be formed on the same plane as the upper surface of the field insulating layer 105. The field insulating layer 105 may include, for example, an oxide layer, a nitride layer, an oxynitride layer, or their combination layer.

The plurality of first nanosheets NW1 may be disposed on the active pattern 101. The plurality of first nanosheets NW1 may be disposed at a portion where the active pattern 101 and the first gate electrode G1 cross each other. The plurality of first nanosheets NW1 may include a plurality of nanosheets stacked to be spaced apart from each other in the vertical direction DR3. The plurality of second nanosheets NW2 may be disposed on the active pattern 101. The plurality of second nanosheets NW2 may be disposed at a portion where the active pattern 101 and the second gate electrode G2 cross each other. The plurality of second nanosheets NW2 may be spaced apart from the plurality of first nanosheets NW1 in the first horizontal direction DR1. The plurality of second nanosheets NW2 may include a plurality of nanosheets stacked to be spaced apart from each other in the vertical direction DR3.

In FIGS. 2 and 3, each of the plurality of first and second nanosheets NW1 and NW2 is shown to include three nanosheets stacked to be spaced apart from one another in the vertical direction DR3, but this is for convenience of description, and embodiments are not limited thereto. In some other embodiment, each of the plurality of first and second nanosheets NW1 and NW2 may include four or more nanosheets stacked to be spaced apart from each other in the vertical direction DR3.

The sacrificial layer 110 may be disposed on the second surface 100b of the first substrate 100. An upper surface 110a of the sacrificial layer 110 may be in contact with the second surface 100b of the first substrate 100. For example, the sacrificial layer 110 may be disposed to be conformal. The sacrificial layer 110 may include a material different from that of the first substrate 100. The sacrificial layer 110 may include a material having an etching selectivity with respect to the material included in the first substrate 100. For example, the sacrificial layer 110 may include silicon germanium (SiGe). That is, for example, the first substrate 100 may include silicon (Si), and the sacrificial layer 110 may include silicon germanium (SiGe).

The second substrate 120 may be disposed on a lower surface 110b of the sacrificial layer 110, which is disposed on the second surface 100b of the first substrate 100. The second substrate 120 may be in contact with the lower surface 110b of the sacrificial layer 110. The second substrate 120 may include a material different from that of the sacrificial layer 110. The second substrate 120 may include a material having an etching selectivity with respect to the sacrificial layer 110. For example, the second substrate 120 may include silicon (Si). That is, the second substrate 120 may include silicon (Si), and the sacrificial layer 110 may include silicon germanium (SiGe).

The first gate electrode G1 may extend in the second horizontal direction DR2 on the active pattern 101 and the field insulating layer 105. The first gate electrode G1 may surround the plurality of first nanosheets NW1. The second gate electrode G2 may extend in the second horizontal direction DR2 on the active pattern 101 and the field insulating layer 105. The second gate electrode G2 may be spaced apart from the first gate electrode G1 in the first horizontal direction DR1. The second gate electrode G2 may surround the plurality of second nanosheets NW2.

Each of the first and second gate electrodes G1 and G2 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination. Each of the first and second gate electrodes G1 and G2 may include a conductive metal oxide, a conductive metal oxynitride, and the like, and may include oxidized forms of the aforementioned materials.

The gate spacer 141 may extend in the second horizontal direction DR2 along both sidewalls of the first gate electrode G1 on the field insulating layer 105 and the upper surface of the uppermost nanosheet of the plurality of first nanosheets NW1. In addition, the gate spacer 141 may extend in the second horizontal direction DR2 along both sidewalls of the second gate electrode G2 on the field insulating layer 105 and the upper surface of the uppermost nanosheet of the plurality of second nanosheets NW2. The gate spacer 141 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or their combination, but embodiments are not limited thereto.

The source/drain region SD may be disposed on at least one side of each of the first and second gate electrodes G1 and G2 on the active pattern 101. For example, the source/drain region SD may be disposed between the first gate electrode G1 and the second gate electrode G2 on the active pattern 101. The source/drain region SD may be in contact with each of the plurality of first nanosheets NW1 and the plurality of second nanosheets NW2. For example, an upper surface of the source/drain region SD may be formed to be higher than the upper surface of the uppermost nanosheet of the plurality of first nanosheets NW1, but embodiments are not limited thereto.

The gate insulating layer 142 may be disposed between each of the first and second gate electrodes G1 and G2 and the gate spacer 141. The gate insulating layer 142 may be disposed between each of the first and second gate electrodes G1 and G2 and the active pattern 101. The gate insulating layer 142 may be disposed between each of the first and second gate electrodes G1 and G2 and the field insulating layer 105. The gate insulating layer 142 may be disposed between the first gate electrode G1 and the plurality of first nanosheets NW1. The gate insulating layer 142 may be disposed between the second gate electrode G2 and the plurality of second nanosheets NW2.

The gate insulating layer 142 may be disposed between each of the first and second gate electrodes G1 and G2 and the source/drain region SD. For example, the gate insulating layer 142 may be in contact with the source/drain region SD, but embodiments are not limited thereto. In some other embodiments, an inner spacer may be disposed between each of the first and second gate electrodes G1 and G2 and the source/drain region SD.

The gate insulating layer 142 may include at least one of silicon oxide, silicon oxynitride, silicon nitride, or a high dielectric constant material having a dielectric constant greater than that of the silicon oxide. The high dielectric constant material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other embodiments may include a negative capacitance (NC) FET based on a negative capacitor. For example, the gate insulating layer 142 may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected in series, and the capacitance of each capacitor has a positive value, the total capacitance is more reduced than the capacitance of each individual capacitor. On the other hand, when at least one of capacitances of two or more capacitors connected in series has a negative value, the total capacitance may have a positive value and may be greater than an absolute value of each individual capacitance.

When a ferroelectric material layer having a negative capacitance and a paraelectric material layer having a positive capacitance are connected in series, the total capacitance value of the ferroelectric material layer and the paraelectric material layer, which are connected in series, may be increased. Based on the total capacitance value that is increased, a transistor having a ferroelectric material layer may have a subthreshold swing (SS) less than 60 mV/decade at a room temperature.

The ferroelectric material layer may have ferroelectric characteristics. The ferroelectric material layer may include at least one of, for example, hafnium oxide, hafnium zirconium oxide, barium strontium titanium oxide, barium titanium oxide, or lead zirconium titanium oxide. In this case, for example, the hafnium zirconium oxide may be a material doped with zirconium (Zr) in hafnium oxide. For another example, the hafnium zirconium oxide may be a compound of hafnium (Hf) and zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant included in the ferroelectric material layer may be varied depending on the ferroelectric material of the ferroelectric material layer.

When the ferroelectric material layer includes hafnium oxide, the dopant included in the ferroelectric material layer may include at least one of gadolinium (Gd), silicon (Si), zirconium (Zr), aluminum (Al), or yttrium (Y).

When the dopant is aluminum (Al), the ferroelectric material layer may include aluminum of 3 at % to 8 at % (atomic %). In this case, a ratio of the dopant may be a ratio of aluminum to a sum of hafnium and aluminum.

When the dopant is silicon (Si), the ferroelectric material layer may include silicon of 2 at % to 10 at %. When the dopant is yttrium (Y), the ferroelectric material layer may include yttrium of 2 at % to 10 at %. When the dopant is gadolinium (Gd), the ferroelectric material layer may include gadolinium of 1 at % to 7 at %. When the dopant is zirconium (Zr), the ferroelectric material layer may include zirconium of 50 at % to 80 at %.

The paraelectric material layer may have paraelectric characteristics. The paraelectric material layer may include, for example, at least one of silicon oxide or metal oxide having a high dielectric constant. The metal oxide included in the paraelectric material layer may include, but is not limited to, at least one of hafnium oxide, zirconium oxide, or aluminum oxide.

The ferroelectric material layer and the paraelectric material layer may include the same material. Although the ferroelectric material layer has ferroelectric characteristics, the paraelectric material layer may not have ferroelectric characteristics. For example, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, 0.5 nm to 10 nm, but is not limited thereto. Because a threshold thickness indicating ferroelectric characteristics may be varied depending on each ferroelectric material, the thickness of the ferroelectric material layer may be varied depending on the ferroelectric material.

For example, the gate insulating layer 142 may include one ferroelectric material layer. For another example, the gate insulating layer 142 may include a plurality of ferroelectric material layers spaced apart from each other. The gate insulating layer 142 may have a stacked layer structure in which a plurality of ferroelectric material layers and a plurality of paraelectric material layers are alternately stacked.

The capping pattern 143 may extend in the second horizontal direction DR2 on each of the first gate electrode G1, the gate insulating layer 142 and the gate spacer 141. Also, the capping pattern 143 may extend in the second horizontal direction DR2 on each of the second gate electrode G2, the gate insulating layer 142, and the gate spacer 141. For example, the capping pattern 143 may be in contact with an upper surface of the gate spacer 141, but embodiments are not limited thereto. In some other embodiments, the capping pattern 143 may be disposed between the gate spacers 141.

The capping pattern 143 may include at least one of, for example, silicon nitride (SiN), silicon oxynitride (SiON), silicon oxide (SiO$_2$), silicon carbonitride (SiCN), silicon oxycarbonitride (SiOCN), or their combination, but embodiments are not limited thereto.

The first interlayer insulating layer 150 may be disposed on the field insulating layer 105. The first interlayer insulating layer 150 may cover the source/drain regions SD. The first interlayer insulating layer 150 may surround a sidewall of each of the gate spacer 141 and the capping pattern 143. For example, an upper surface of the first interlayer insulating layer 150 may be formed on the same plane as that of the capping pattern 143, but embodiments are not limited thereto. In some other embodiments, the first interlayer insulating layer 150 may the upper surface of the capping pattern 143.

The first interlayer insulating layer 150 may include, for example, at least one of silicon oxide, silicon nitride, silicon oxynitride, or a low dielectric constant material. For example, the low dielectric constant material may include Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCyclo-TetraSiloxane (OMCTS), HexaMethylDiSiloxane (HMDS), TriMethylSilyl Borate (TMSB), DiAcetoxyDitertiaryButox-ySiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluori-nated Carbon, silica aerogels, silica xerogels, mesoporous silica or their combination, but embodiments are not limited thereto.

A through via trench 160T may extend into the second substrate 120 by passing through the first interlayer insulating layer 150, the field insulating layer 105, the first substrate 100, and the sacrificial layer 110 in the vertical direction DR3. For example, the through via trench 160T may be formed between the first gate electrode G1 and the second gate electrode G2. The through via trench 160T may be spaced apart from each of the first gate electrode G1 and the second gate electrode G2 in the first horizontal direction DR1. For example, the through via trench 160T may be spaced apart from the active pattern 101 in the second horizontal direction DR2.

A first recess R1 may be formed inside the sacrificial layer 110. The first recess R1 may protrude from a first sidewall of the through via trench 160T in a reverse direction of the second horizontal direction DR2. For example, an upper surface of the first recess R1 may be formed on the same plane as the upper surface of the sacrificial layer 110. Also, a lower surface of the first recess R1 may be formed on the same plane as the lower surface of the sacrificial layer 110.

A second recess R2 may be formed inside the sacrificial layer 110. The second recess R2 may protrude in the second horizontal direction DR2 from a second sidewall of the through via trench 160T opposite the first sidewall of the through via trench 160T in the second horizontal direction DR2. For example, an upper surface of the second recess R2 may be formed on the same plane as the upper surface of the sacrificial layer 110. In addition, a lower surface of the second recess R2 may be formed on the same plane as the lower surface of the sacrificial layer 110. Although the first recess R1 and the second recess R2 are described to be provided separately, for example, the first recess R1 and the second recess R2 may protrude in a lateral direction from the sidewall of the through via trench 160T and thus may be integrally formed.

The through via insulating layer 165 may be disposed along the sidewall of the through via trench 160T. For example, the through via insulating layer 165 may be disposed to be conformal. The through via insulating layer 165 may include a first portion 165_1 and a second portion 165_2. The first portion 165_1 of the through via insulating layer 165 may be disposed along the sidewall of the through via trench 160T. For example, the first portion 165_1 of the through via insulating layer 165 may extend to the upper surface of the first interlayer insulating layer 150. Also, the first portion 165_1 of the through via insulating layer 165 may extend to the inside of the second substrate 120.

The second portion 165_2 of the through via insulating layer 165 may be disposed inside each of the first recess R1 and the second recess R2. For example, the second portion

165_2 of the through via insulating layer 165 may fill the inside of each of the first recess R1 and the second recess R2. The second portion 165_2 of the through via insulating layer 165 may protrude in a lateral direction from the first portion 165_1 of the through via insulating layer 165.

For example, the second portion 165_2 of the through via insulating layer 165 disposed inside the first recess R1 may protrude in a reverse direction of the second horizontal direction DR2 from the first portion 165_1 of the through via insulating layer 165 disposed along the first sidewall of the through via trench 160T. In addition, the second portion 165_2 of the through via insulating layer 165 disposed inside the second recess R2 may protrude from the first portion 165_1 of the through via insulating layer 165 disposed along the second sidewall of the through via trench 160T in the second horizontal direction DR2.

An upper surface of the second portion 165_2 of the through via insulating layer 165 may be formed on the same plane as the upper surface of the sacrificial layer 110. In addition, a lower surface of the second portion 165_2 of the through via insulating layer 165 may be formed on the same plane as the lower surface of the sacrificial layer 110. Although the second portions 165_2 of the through via insulating layer 165 disposed inside the first recess R1 and the second recess R2 are described to be provided separately, for example, the second portions 165_2 of the through via insulating layer 165 disposed inside the first recess R1 and the second recess R2 may protrude in a lateral direction from the first portion 165_1 of the through via insulating layer 165 and may be integrally formed.

The through via insulating layer 165 may include an insulating material. For example, the through via insulating layer 165 may include at least one of silicon nitride (SiN), silicon oxide (SiO$_2$), silicon oxynitride (SiON), silicon oxy-carbide (SiOC), or silicon oxycarbonitride (SiOCN), but embodiments are not limited thereto.

The through via 160 may be disposed on the through via insulating layer 165 inside the through via trench 160T. For example, the through via 160 may overlap the sacrificial layer 110 in the second horizontal direction DR2. That is, a lower surface of the through via 160 may be formed to be lower than the lower surface 110b of the sacrificial layer 110. The through via 160 may include a through via bather layer 161 and a through via filling layer 162.

The through via barrier layer 161 may be disposed on the through via insulating layer 165 along the sidewall of the through via trench 160T. The through via barrier layer 161 may be disposed along a bottom surface of the through via trench 160T. For example, the through via barrier layer 161 may be disposed to be conformal. For example, an upper-most surface of the through via barrier layer 161 may be formed on the same plane as that of the first interlayer insulating layer 150, but embodiments are not limited thereto.

The through via barrier layer 161 may include one of, for example, titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and their combination, but embodiments are not limited thereto.

The through via filling layer 162 may be disposed on the through via barrier layer 161 inside the through via trench 160T. The through via filling layer 162 may fill the inside of the through via trench 160T on the through via barrier layer 161. For example, an upper surface of the through via filling layer 162 may be formed on the same plane as the uppermost surface of the first interlayer insulating layer 150, but embodiments are not limited thereto.

The through via filling layer 162 may include at least one of, for example, molybdenum (Mo), copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh), but embodiments are not limited thereto.

The lower wiring trench 130T may be formed on the second surface 100b of the first substrate 100. For example, the lower wiring trench 130T may be formed inside the second substrate 120 on the lower surface 110b of the sacrificial layer 110. For example, as the lower wiring trench 130T approaches the lower surface 110b of the sacrificial layer 110, its width in the second horizontal direction DR2 may be reduced.

For example, the lower wiring trench 130T may overlap each of the through via 160 and the through via insulating layer 165 in the vertical direction DR3. For example, the lower surface of the second portion 165_2 of the through via insulating layer 165 may be exposed through the lower wiring trench 130T. Also, the first portion 165_1 of the through via insulating layer 165 and the through via 160 may be exposed through the lower wiring trench 130T. In this case, the through via barrier layer 161 forming the bottom surface of the through via trench 160T may be exposed through the lower wiring trench 130T.

For example, a width W2 of the through via trench 160T in the second horizontal direction DR2, at a position adjacent to the second portion 165_2 of the through via insulating layer 165, may be smaller than a width W1 of the second portion 165_2 of the through via insulating layer 165 in the second direction DR2. In this case, the width W1 of the second portion 165_2 of the through via insulating layer 165 in the second horizontal direction DR2 may be referred to as a width in the second horizontal direction DR2 between a sidewall of the second portion 165_2 of the through via insulating layer 165, which is in contact with the sacrificial layer 110 inside the first recess R1, and a sidewall of the second portion 165_2 of the through via insulating layer 165, which is in contact with the sacrificial layer 110 inside the second recess R2.

For example, the lower surface of the second portion 165_2 of the through via insulating layer 165 disposed inside the first recess R1 may be in contact with the second substrate 120 disposed on a first sidewall 130Ts1 of the lower wiring trench 130T. In addition, the lower surface of the second portion 165_2 of the through via insulating layer 165 disposed inside the second recess R2 may be in contact with the second substrate 120 disposed on a second sidewall 130Ts2 of the lower wiring trench 130T opposite the first sidewall 130Ts1 of the lower wiring trench 130T in the second horizontal direction DR2.

The lower wiring insulating layer 135 may be disposed along the sidewall of the lower wiring trench 130T. For example, the lower wiring insulating layer 135 may be in contact with the lower surface 110b of the sacrificial layer 110. The lower wiring insulating layer 135 may include an insulating material. For example, the lower wiring insulating layer 135 may include the same material as that of the through via insulating layer 165, but embodiments are not limited thereto. In some other embodiments, the lower wiring insulating layer 135 and the through via insulating layer 165 may include different materials. The lower wiring insulating layer 135 may include at least one of, for example, silicon nitride (SiN), silicon oxide (SiO$_2$), silicon oxynitride (SiON), silicon oxycarbide (SiOC), or silicon oxycarbonitride (SiOCN), but embodiments are not limited thereto.

The lower wiring layer 130 may be disposed inside the lower wiring trench 130T. At least a portion of the lower wiring layer 130 may be disposed inside the second portion 165_2 of the through via insulating layer 165. An uppermost surface 130a of the lower wiring layer 130 may be in contact with the second portion 165_2 of the through via insulating layer 165. Also, the lower wiring layer 130 may be in contact with a lowermost surface of the first portion 165_1 of the through via insulating layer 165 and a lowermost surface of the through via 160. For example, the lower wiring layer 130 may be in contact with the through via barrier layer 161 forming a bottom surface of the through via 160. For example, the lower wiring layer 130 may be spaced apart from the through via filling layer 162 in the vertical direction DR3, but embodiments are not limited thereto. For example, the lower wiring layer 130 may be either a power rail to which a power source is supplied or a ground rail that is grounded.

The uppermost surface 130a of the lower wiring layer 130 may be formed to be lower than the upper surface of the second portion 165_2 of the through via insulating layer 165. That is, the uppermost surface 130a of the lower wiring layer 130 may be formed to be lower than the upper surface 110a of the sacrificial layer 110. In addition, the uppermost surface 130a of the lower wiring layer 130 may be formed to be higher than the lower surface of the second portion 165_2 of the through via insulating layer 165. That is, the uppermost surface 130a of the lower wiring layer 130 may be formed to be lower than the lower surface 110b of the sacrificial layer 110.

For example, a width of the lower wiring layer 130 in the second horizontal direction DR2, at a position adjacent to the second portion 165_2 of the through via insulating layer 165, may be smaller than the width W1 of the second portion 165_2 of the through via insulating layer 165 in the second horizontal direction DR2. For example, at least a portion of the lower wiring insulating layer 135 may be disposed between the lower wiring layer 130 and the first portion 165_1 of the through via insulating layer 165, but embodiments are not limited thereto.

The lower wiring layer 130 may include a lower wiring barrier layer 131 and a lower wiring filling layer 132. The lower wiring barrier layer 131 may be disposed along sidewalls and upper surface of the lower wiring trench 130T. For example, the lower wiring barrier layer 131 may be disposed to be conformal. For example, at least a portion of the lower wiring barrier layer 131 may be disposed inside the second portion 165_2 of the through via insulating layer 165. The lower wiring layer 130 may be insulated from the second substrate 120 through the lower wiring insulating layer 135.

The lower wiring barrier layer 131 includes one of, for example, cobalt (Co), titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and their combination, but embodiments are not limited thereto.

The lower wiring filling layer 132 may be disposed on the lower wiring barrier layer 131 inside the lower wiring trench 130T. The lower wiring filling layer 132 may fill the inside of the lower wiring trench 130T on the lower wiring barrier layer 131. For example, a lower surface of the lower wiring filling layer 132 may be formed on the same plane as the lower surface of the second substrate 120, but embodiments are not limited thereto.

The lower wiring filling layer 132 includes at least one of, for example, molybdenum (Mo), copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh), but embodiments are not limited thereto.

The source/drain contact CA may be disposed inside the first interlayer insulating layer 150. The source/drain contact CA may be connected to the source/drain region SD. For example, an upper surface of the source/drain contact CA may be formed on the same plane as that of the through via 160. For example, the upper surface of the source/drain contact CA may be formed on the same plane as the upper surface of the first interlayer insulating layer 150, but embodiments are not limited thereto.

The source/drain contact CA may be in contact with the through via 160. For example, the source/drain contact CA may be in contact with the through via filling layer 162. The source/drain contact CA may overlap the through via 160 in the vertical direction DR3. Although the source/drain contact CA is shown as being formed as a single layer in FIGS. 2 and 4, this is for convenience of description, and embodiments are not limited thereto. That is, the source/drain contact CA may be formed of a multi-layer. The source/drain contact CA may include a conductive material.

The silicide layer 155 may be disposed between the source/drain region SD and the source/drain contact CA. The silicide layer 155 may be disposed along a boundary surface between the source/drain region SD and the source/drain contact CA. The silicide layer 155 may include, for example, a metal silicide material.

The first gate contact CB1 may be connected to the first gate electrode G1 by passing through the capping pattern 143 in the vertical direction DR3. The second gate contact CB2 may be connected to the second gate electrode G2 by passing through the capping pattern 143 in the vertical direction DR3. For example, upper surfaces of the first gate contact CB1 and the second gate contact CB2 may be formed on the same plane as the upper surface of the capping pattern 143, but embodiments are not limited thereto.

Although FIGS. 2 and 3 show that each of the first and second gate contacts CB1 and CB2 is formed as a single layer, this is for convenience of description, and embodiments are not limited thereto. That is, each of the first and second gate contacts CB1 and CB2 may be formed of a multi-layer. Each of the first and second gate contacts CB1 and CB2 may include a conductive material.

The etch stop layer 170 may be disposed on upper surfaces of the first interlayer insulating layer 150, the capping pattern 143, the first and second gate contacts CB1 and CB2, the source/drain contact CA, and the through via 160. FIGS. 2 to 4 show that the etch stop layer 170 is formed as a single layer, but embodiments are not limited thereto. In some other embodiments, the etch stop layer 170 may be formed of a multi-layer. The etch stop layer 170 may include at least one of, for example, aluminum oxide, aluminum nitride, hafnium oxide, zirconium oxide, silicon oxide, silicon nitride, silicon oxynitride, or a low dielectric constant material. The second interlayer insulating layer 175 may be disposed on the etch stop layer 170. For example, the second interlayer insulating layer 175 may include at least one of silicon oxide, silicon nitride, silicon oxynitride, or a low dielectric constant material.

The first via V1 may be connected to each of the first gate contact CB1 and the second gate contact CB2 by passing through the second interlayer insulating layer 175 and the etch stop layer 170 in the vertical direction DR3. The second via V2 may be connected to the source/drain contact CA by passing through the second interlayer insulating layer 175 and the etch stop layer 170 in the vertical direction DR3. Although FIGS. 2 to 4 show that each of the first and second vias V1 and V2 is formed as a single layer, this is for convenience of description, and embodiments are not limited thereto. That is, each of the first and second vias V1 and V2 may be formed of a multi-layer. Each of the first and second vias V1 and V2 may include a conductive material.

The third interlayer insulating layer 180 may be disposed on the second interlayer insulating layer 175. The third interlayer insulating layer 180 may include at least one of, for example, silicon oxide, silicon nitride, silicon oxynitride, or a low dielectric constant material. Each of the first to third upper wiring layers 191, 192 and 193 may be disposed inside the third interlayer insulating layer 180. For example, each of the first to third upper wiring layers 191, 192 and 193 may be sequentially spaced apart from one another in the first horizontal direction DR1. For example, each of the first to third upper wiring layers 191, 192 and 193 may extend in the second horizontal direction DR2, but embodiments are not limited thereto.

For example, the first upper wiring layer 191 may be disposed on the first via V1 disposed on the first gate contact CB1. The first upper wiring layer 191 may be connected to the first via V1 disposed on the first gate contact CB1. The second upper wiring layer 192 may be disposed on the second via V2 disposed on the source/drain contact CA. The second upper wiring layer 192 may be connected to the second via V2 disposed on the source/drain contact CA. The third upper wiring layer 193 may be disposed on the first via V1 disposed on the second gate contact CB2. The third upper wiring layer 193 may be connected to the first via V1 disposed on the second gate contact CB2.

Although FIGS. 2 to 4 show that each of the first to third upper wiring layers 191, 192 and 193 is formed as a single layer, this is for convenience of description, and embodiments are not limited thereto. That is, each of the first to third upper wiring layers 191, 192 and 193 may be formed of a multi-layer. Each of the first to third upper wiring layers 191, 192 and 193 may include a conductive material.

In the semiconductor device according to some embodiments, the lower wiring layer 130 which is a power rail or a ground rail may be disposed below the first substrate 100, the sacrificial layer 110 may be disposed between the lower surface of the first substrate 100 and the lower wiring layer 130, and the through via insulating layer 165, which overlaps the lower wiring layer 130 in the vertical direction DR3, may be disposed inside the sacrificial layer 110. The through via insulating layer 165 disposed inside the sacrificial layer 110 may serve as an etch stop layer in the process of forming the lower wiring trench 130T in which the lower wiring layer 130 is formed. Therefore, the semiconductor device according to some embodiments may improve reliability of a connection relation between the through via 160 and the lower wiring layer 130 by preventing the lower wiring trench 130T from being excessively or less etched.

Hereinafter, a method of manufacturing a semiconductor device according to some embodiments will be described with reference to FIGS. 6 to 34.

FIGS. 6 to 34 are views illustrating operations of a method of manufacturing a semiconductor device shown in FIGS. 1 to 5.

Figure 6:
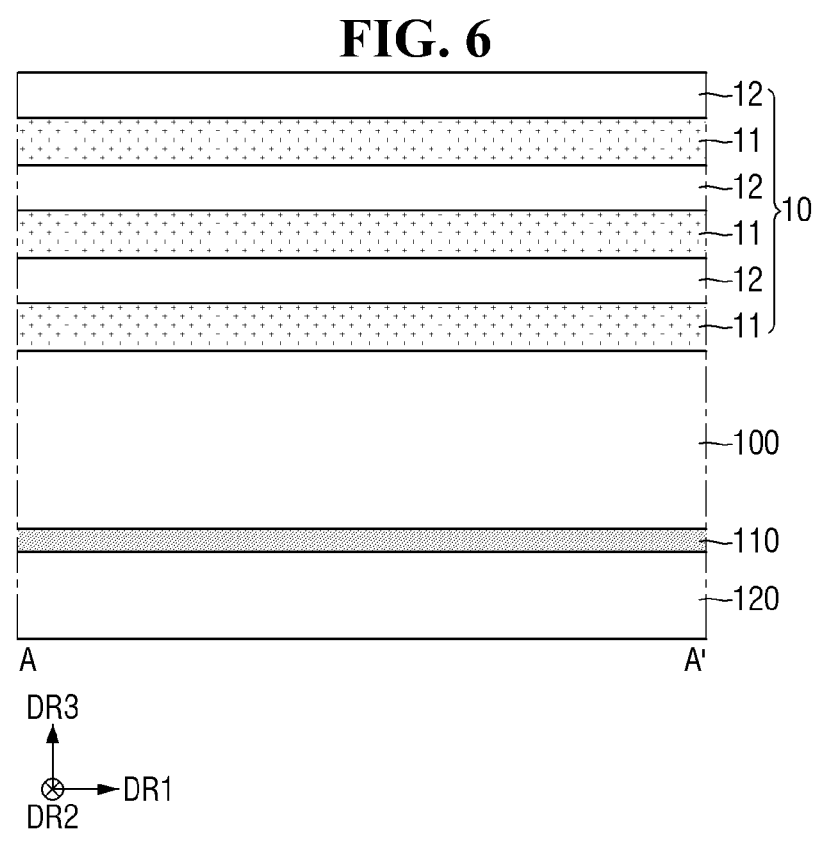
Figure 7:
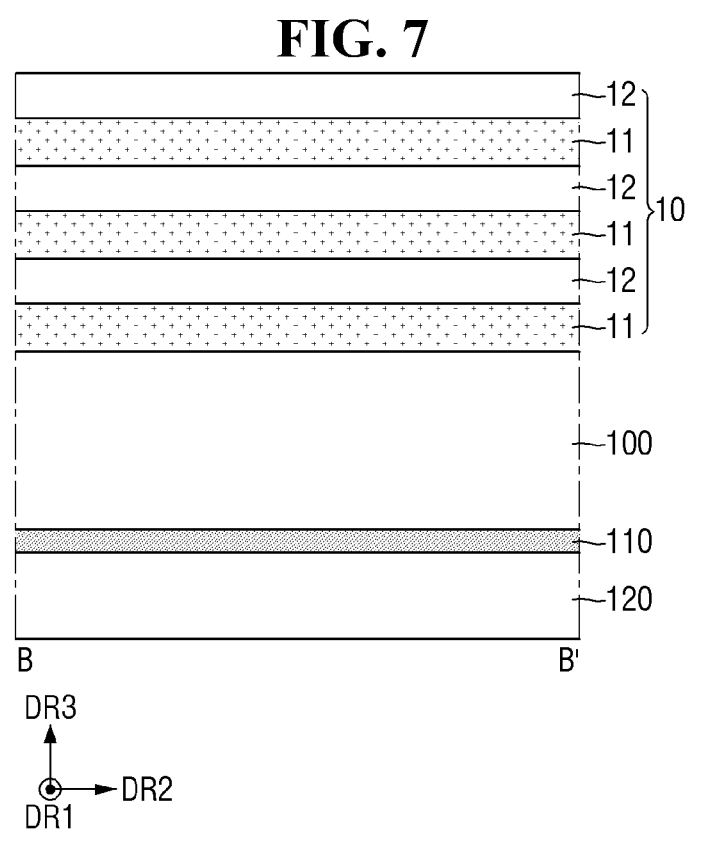

Referring to FIGS. 6 and 7, a sacrificial layer 110 and a first substrate 100 may be sequentially formed on a second substrate 120. For example, the sacrificial layer 110 may be epitaxially grown to be formed on the second substrate 120.

A stacked structure 10 may be formed on the first substrate 100. The stacked structure 10 may include first semiconductor layers 11 and second semiconductor layers 12, which are alternately stacked on the first substrate 100. For example, a first semiconductor layer 11 may be formed at a lowermost portion of the stacked structure 10, and a second semiconductor layer 12 may be formed at an uppermost portion of the stacked structure 10, but embodiments are not limited thereto. In some other embodiments, a first semiconductor layer 11 may be also formed at the uppermost portion of the stacked structure 10. The first semiconductor layer 11 may include, for example, silicon germanium (SiGe). The second semiconductor layer 12 may include, for example, silicon (Si).

Figure 8:
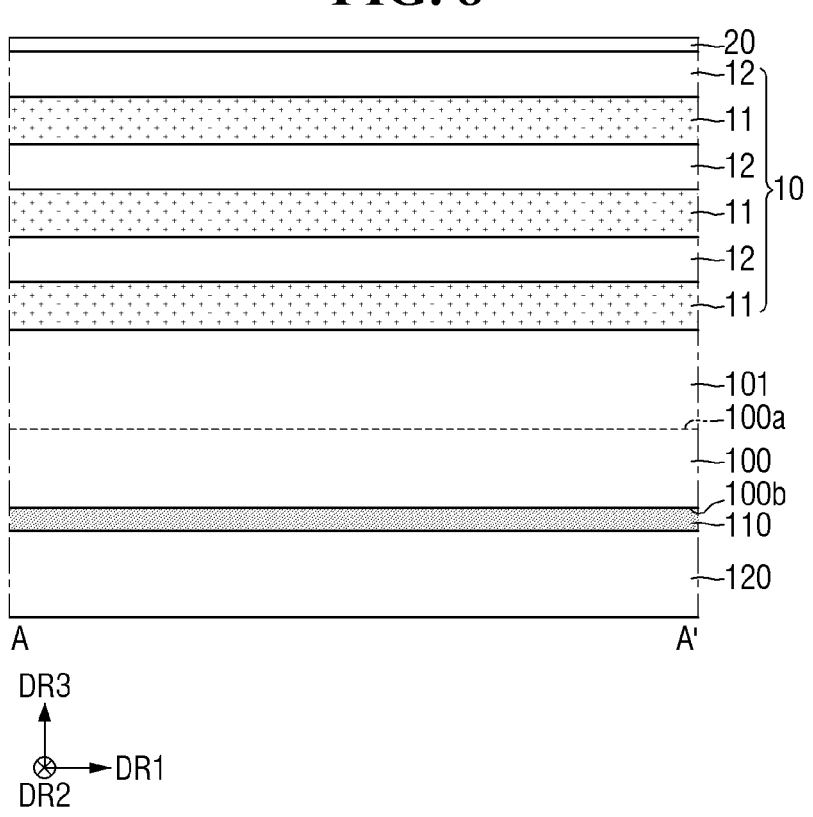
Figure 9:
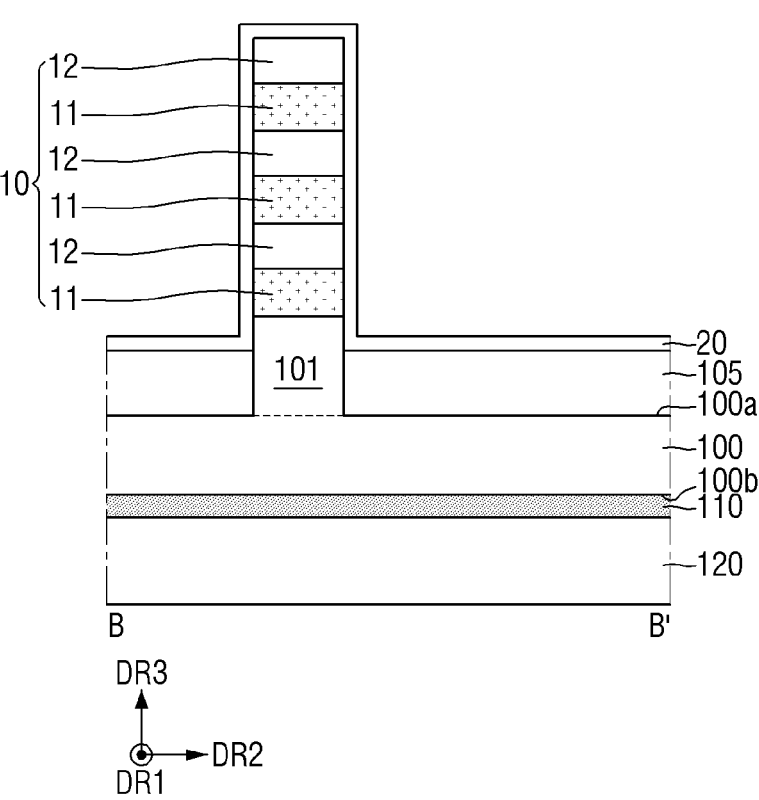

Referring to FIGS. 8 and 9, a portion of the stacked structure 10 may be etched. While the stacked structure 10 is being etched, a portion of the first substrate 100 may be also etched. Through the etching process, an active pattern 101 may be defined below the stacked structure 10 on a first surface 100a that is an upper surface of the first substrate 100. The active pattern 101 may extend in the first horizontal direction DR1.

A field insulating layer 105 may be formed on the first surface 100a of the first substrate 100. The field insulating layer 105 may surround sidewalls of the active pattern 101. For example, an upper surface of the active pattern 101 may be formed to be higher than an upper surface of the field insulating layer 105.

A pad oxide layer 20 may be formed to cover the upper surface of the field insulating layer 105, exposed sidewalls of the active pattern 101 and sidewalls and upper surface of the stacked structure 10. For example, the pad oxide layer 20 may be formed to be conformal. The pad oxide layer 20 may include, for example, silicon oxide ($SiO_2$).

Figure 10:
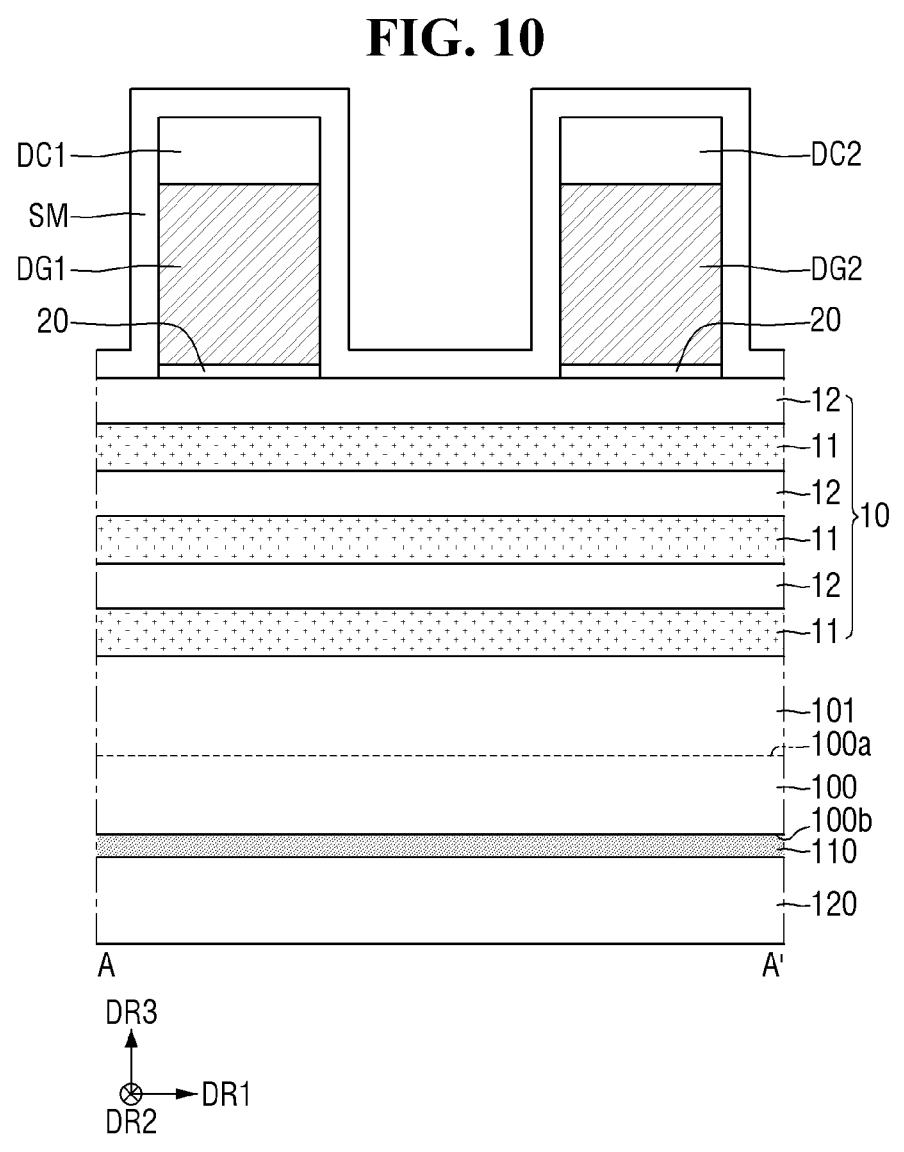
Figure 11:
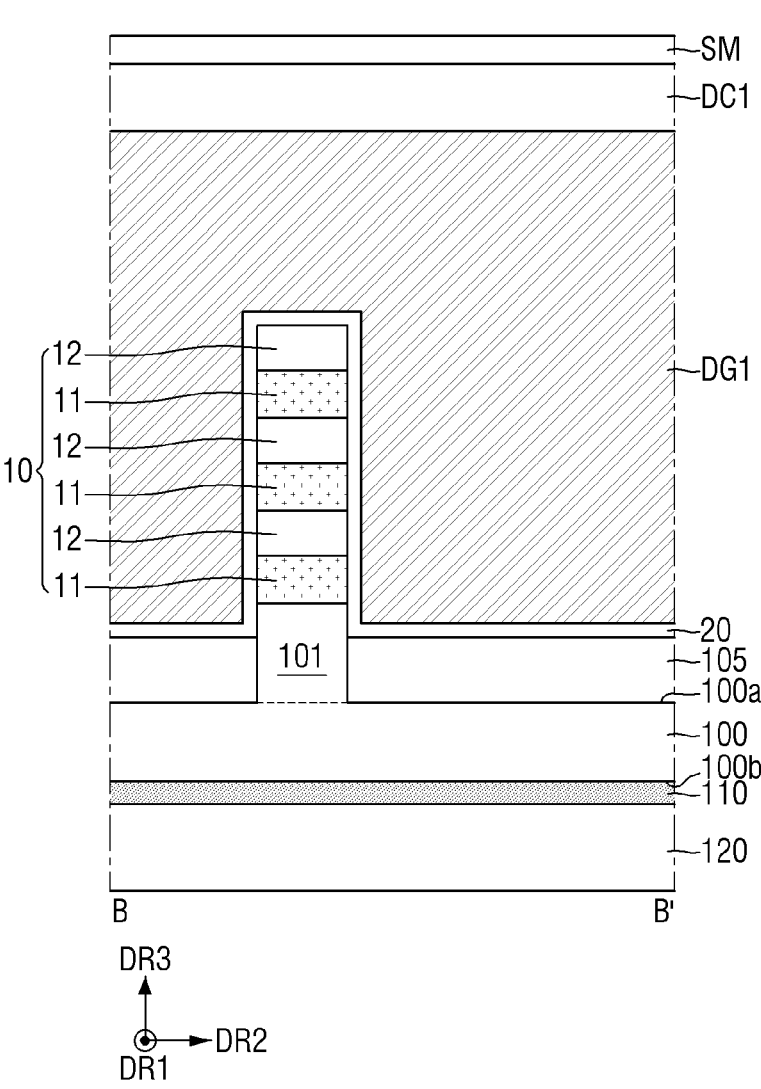
Figure 12:
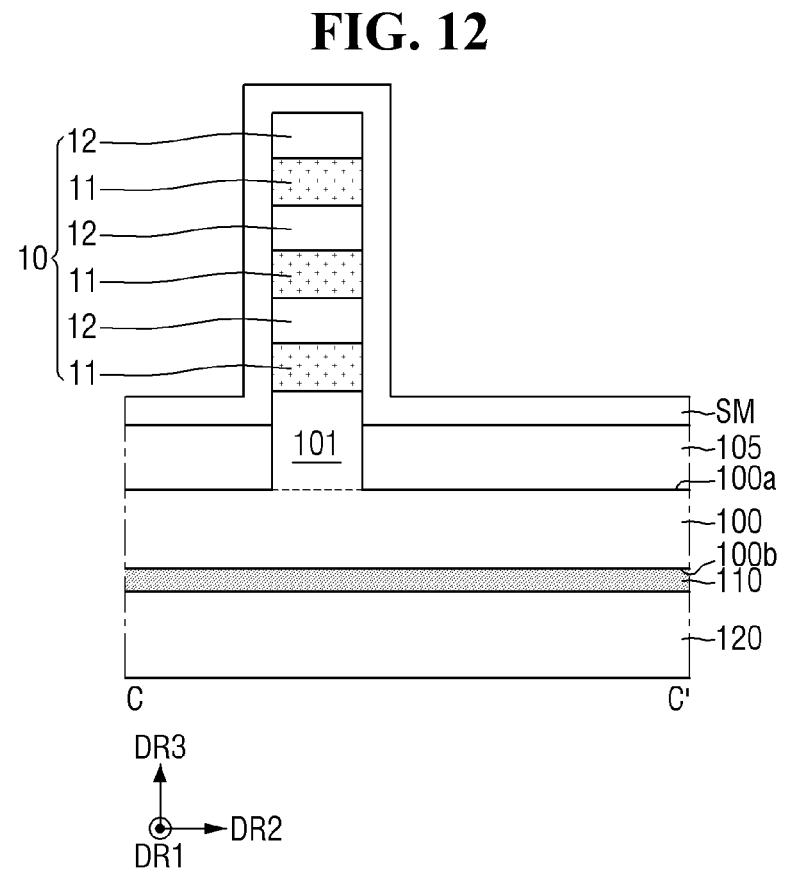

Referring to FIGS. 10 to 12, first and second dummy gates DG1 and DG2, and first and second dummy capping patterns DC1 and DC2 which extend in the second horizontal direction DR2 on the pad oxide layer 20 may be formed on the stacked structure 10 and the field insulating layer 105. The first dummy capping pattern DC1 may be formed on the first dummy gate DG1. Also, the second dummy capping pattern DC2 may be formed on the second dummy gate DG2. The second dummy gate DG2 and the second dummy capping pattern DC2 may be respectively spaced apart from the first dummy gate DG1 and the first dummy capping pattern DC1 in the first horizontal direction DR1.

While the first and second dummy gates DG1 and DG2 and the first and second dummy capping patterns DC1 and DC2 are being formed, the remaining pad oxide layer 20, except a portion overlapped with each of the first and second dummy gates DG1 and DG2 in the vertical direction DR3 on the first substrate 100, may be removed.

A spacer material layer SM may be formed to cover sidewalls of each of the first and second dummy gates DG1 and DG2, sidewalls and upper surface of each of the first and second dummy capping patterns DC1 and DC2, exposed sidewalls and upper surface of the stacked structure 10, and the upper surface of the field insulating layer 105. For example, the spacer material layer SM may be formed to be conformal. The spacer material layer SM may include at least one of, for example, silicon nitride (SiN), silicon oxycarbonitride (SiOCN), silicon boron carbonitride (SiBCN), silicon carbonitride (SiCN), silicon oxynitride (SiON), or their combination.

Figure 13:
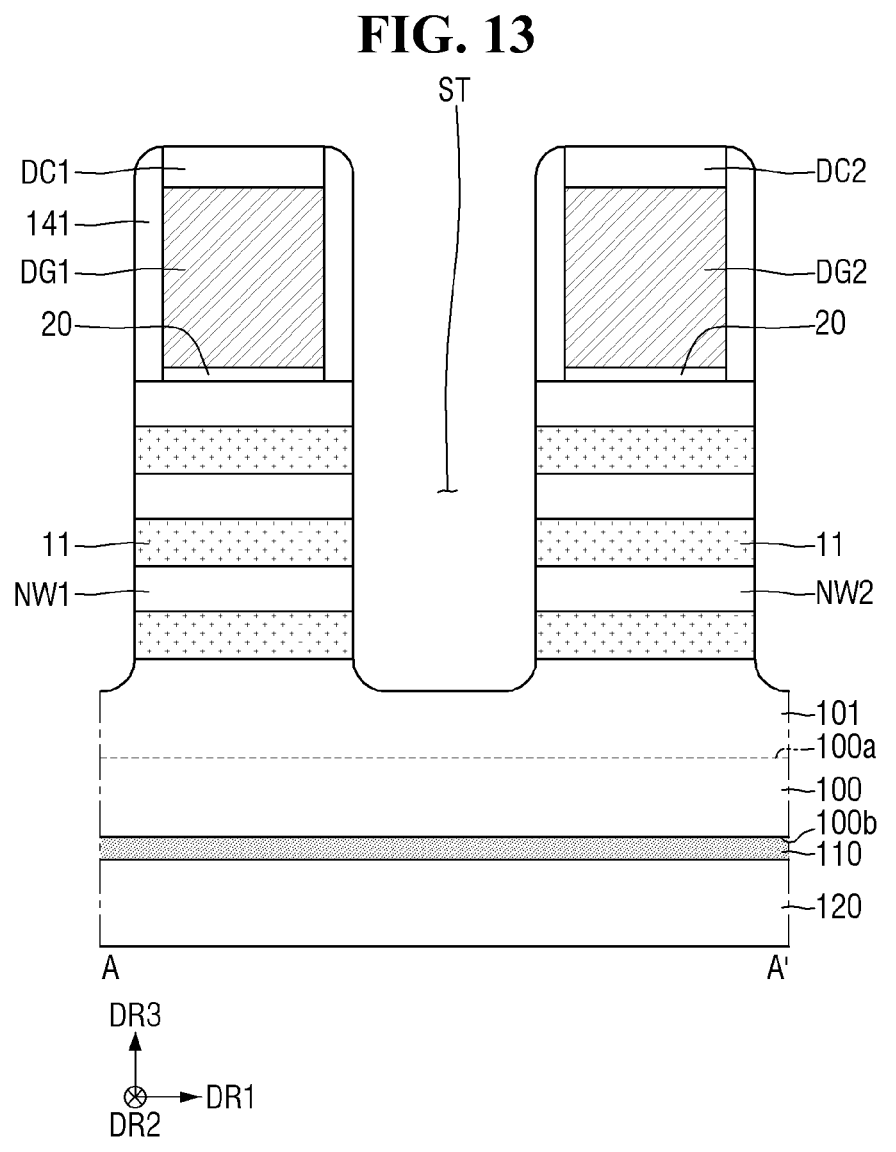
Figure 14:
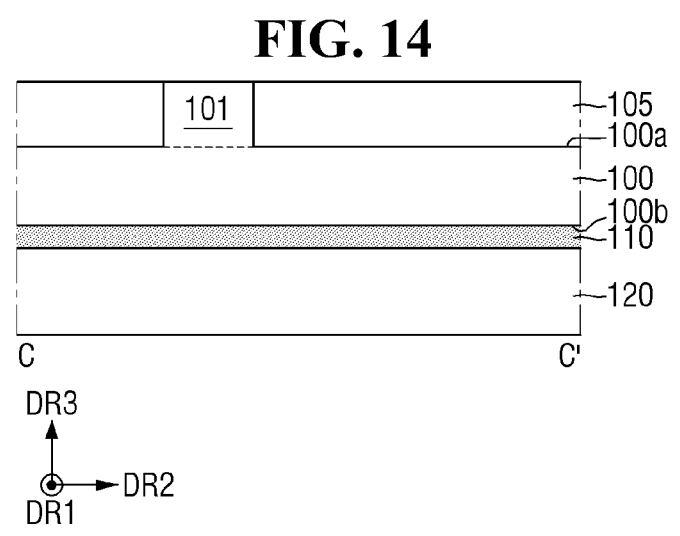

Referring to FIGS. 13 and 14, the stacked structure (10 of FIGS. 10 to 12) may be etched using the first and second dummy capping patterns DC1 and DC2 and the first and second dummy gates DG1 and DG2 as masks to form a source/drain trench ST. For example, the source/drain trench ST may extend into the active pattern 101.

While the source/drain trench ST is being formed, the spacer material layer (SM of FIGS. 10 to 12) formed on the upper surfaces of the first and second dummy capping patterns DC1 and DC2 and a portion of each of the first and second dummy capping patterns DC1 and DC2 may be removed. The spacer material layer (SM of FIGS. 10 to 12) remaining on sidewalls of each of the first and second dummy capping patterns DC1 and DC2 and the first and second dummy gates DG1 and DG2 may be referred to as a gate spacer 141. After the source/drain trench ST is formed, the second semiconductor layers (12 of FIGS. 10 to 12) remaining below the first dummy gate DG1 may be referred to as a plurality of first nanosheets NW1. In addition, after the source/drain trench ST is formed, the second semiconductor layers (12 of FIGS. 10 to 12) remaining below the second dummy gate DG2 may be referred to as a plurality of second nanosheets NW2.

Figure 15:
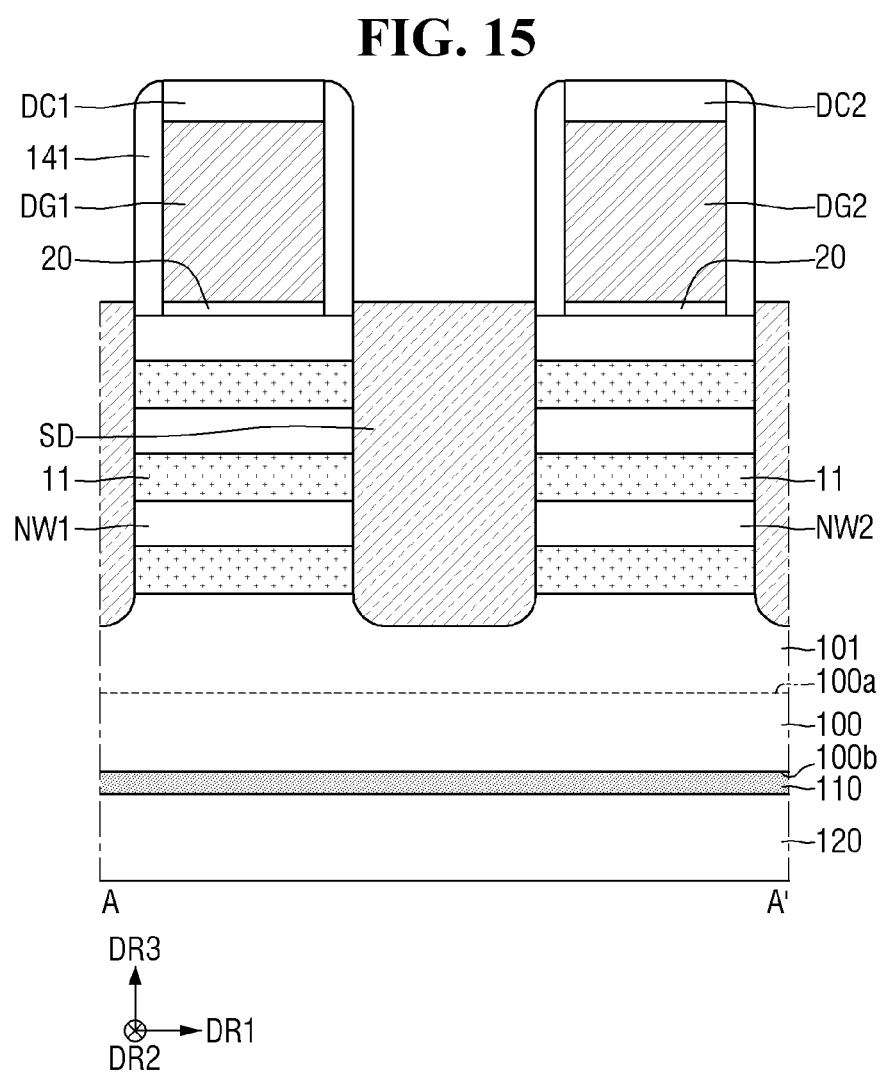
Figure 16:
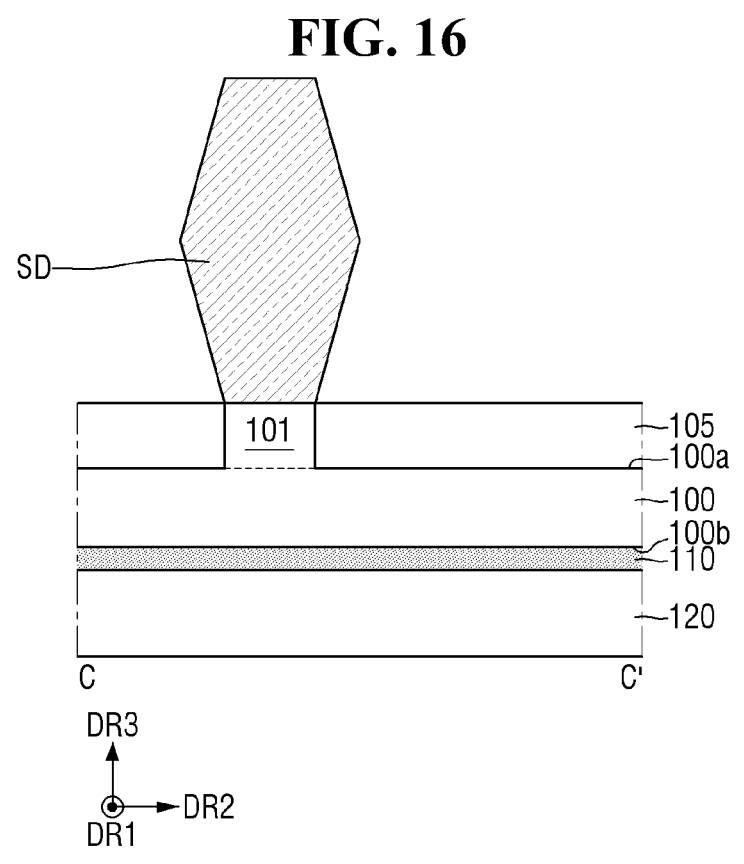

Referring to FIGS. 15 and 16, a source/drain region SD may be formed inside the source/drain trench ST. For example, an upper surface of the source/drain region SD may be formed to be higher than an upper surface of the uppermost nanosheet of the plurality of first nanosheets NW1, but embodiments are not limited thereto.

Figure 17:
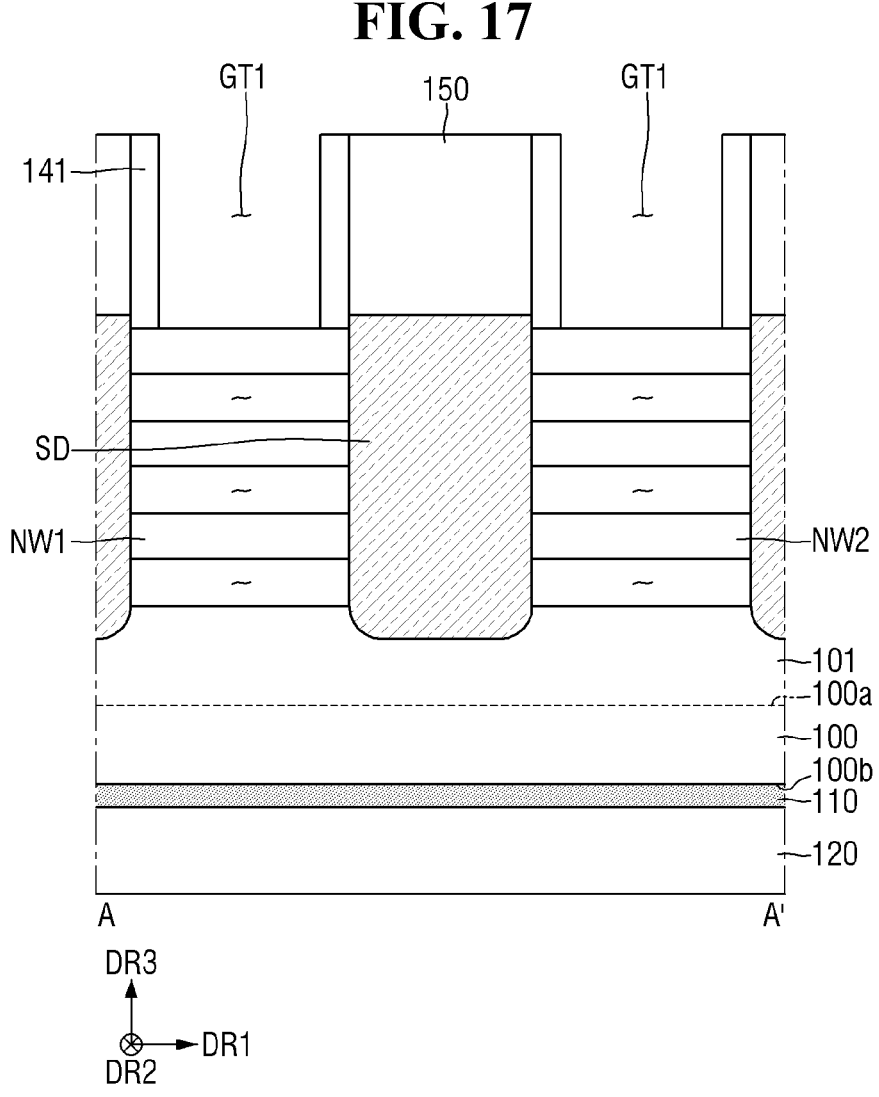
Figure 18:
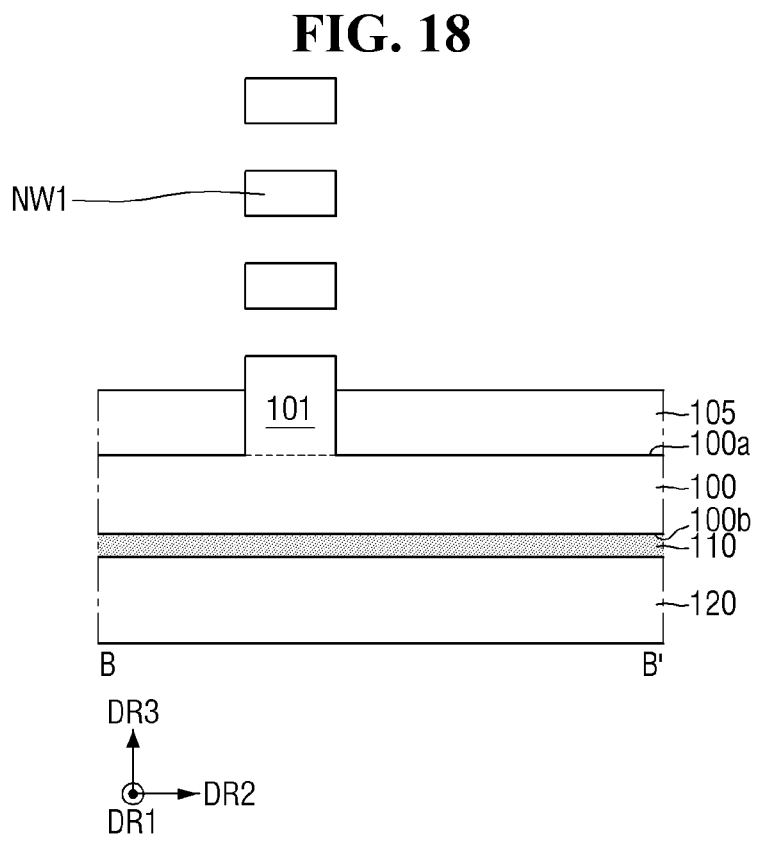
Figure 19:
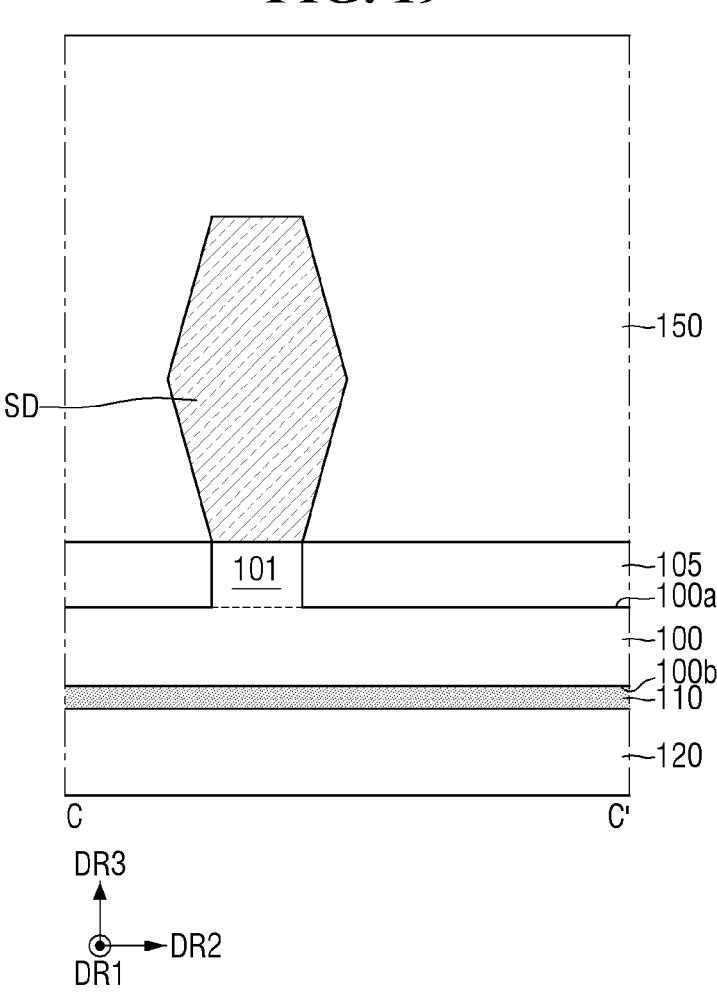

Referring to FIGS. 17 to 19, a first interlayer insulating layer 150 may be formed to cover sidewalls and upper surface of the source/drain region SD, the gate spacer 141, and each of the first and second dummy capping patterns (DC1 and DC2 of FIG. 15). The upper surfaces of the first and second dummy gates (DG1 and DG2 of FIG. 15) may be exposed through a planarization process. Each of the first and second dummy gates (DG1 and DG2 of FIG. 15), the pad oxide layer (20 of FIG. 15) and the first semiconductor layer (11 of FIG. 15) may be removed. A portion from which the first dummy gate (DG1 of FIG. 15) is removed may be referred to as a first gate trench GT1. In addition, a portion from which the second dummy gate (DG2 of FIG. 15) is removed may be referred to as a second gate trench GT2.

Figure 20:
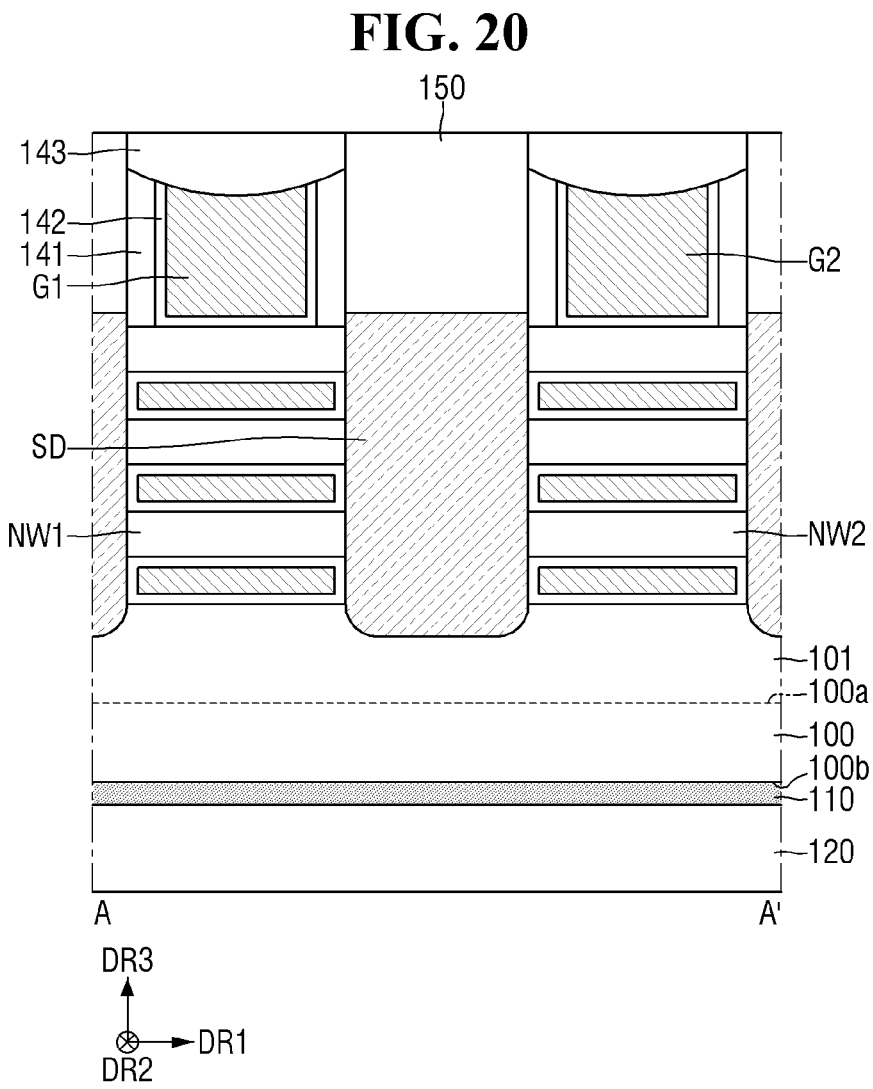
Figure 21:
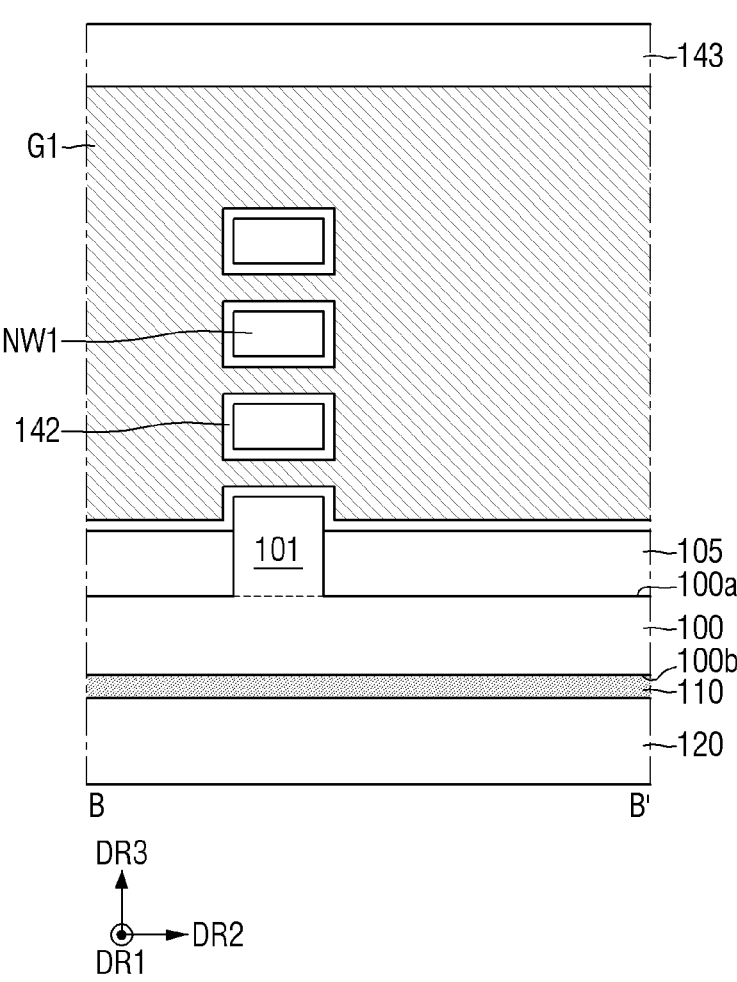

Referring to FIGS. 20 and 21, a gate insulating layer 142 may be formed at the portion from which each of the first and second dummy gates (DG1 and DG2 of FIG. 15), the pad oxide layer (20 of FIG. 15) and the first semiconductor layer (11 of FIG. 15) is removed. For example, the gate insulating layer 142 may be formed to be conformal.

A first gate electrode G1 may be formed on the gate insulating layer 142 at the portion from which each of the first dummy gate (DG1 of FIG. 15), the pad oxide layer (20 of FIG. 15) and the sacrificial layer (11 of FIG. 15) is removed. The first gate electrode G1 may surround the plurality of first nanosheets NW1. In addition, a second gate electrode G2 may be formed on the gate insulating layer 142 at the portion from which each of the second dummy gate (DG2 of FIG. 15), the pad oxide layer (20 of FIG. 15) and the first semiconductor layer (11 of FIG. 15) is removed. The second gate electrode G2 may surround the plurality of second nanosheets NW2.

A portion of an upper portion of each of the gate spacer 141, the gate insulating layer 142, the first gate electrode G1 and the second gate electrode G2 may be etched. A capping pattern 143 may be formed at the portion from which a portion of the upper portion of each of the gate spacer 141, the gate insulating layer 142, the first gate electrode G1 and the second gate electrode G2 is etched. For example, an upper surface of the capping pattern 143 may be formed on the same plane as an upper surface of the first interlayer insulating layer 150, but embodiments are not limited thereto.

Figure 22:
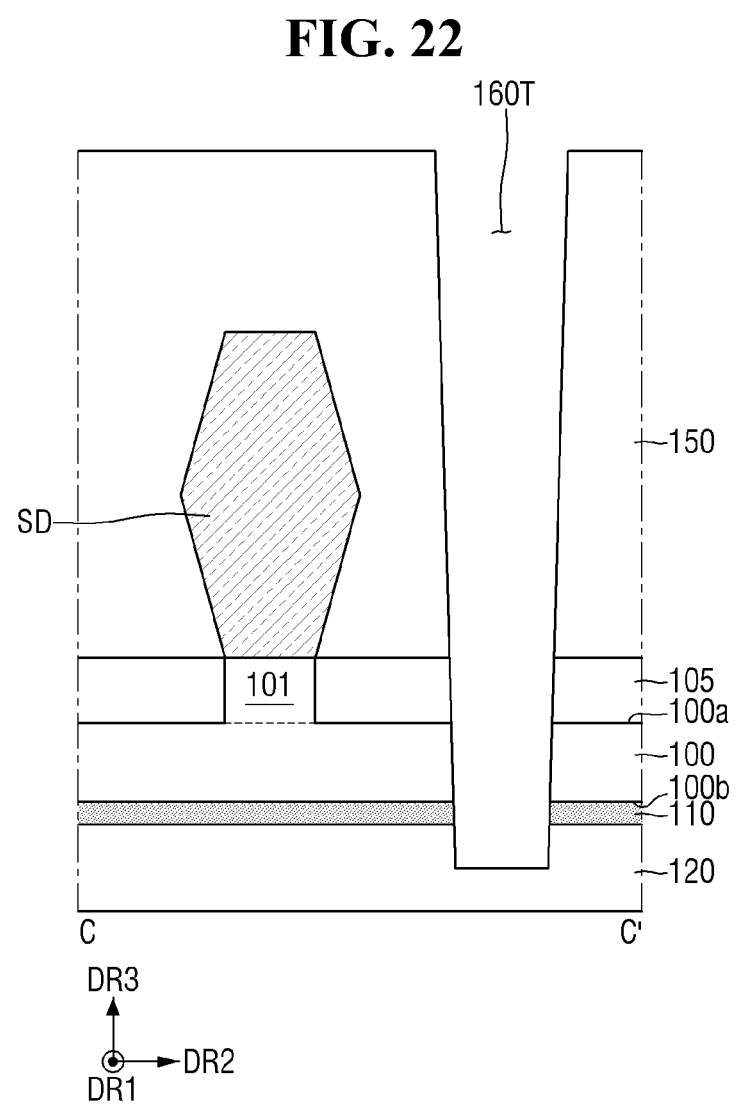

Referring to FIG. 22, a through via trench 160T, which extends into the second substrate 120 by passing through the first interlayer insulating layer 150, the field insulating layer 105, the first substrate 100 and the sacrificial layer 110 in the vertical direction DR3, may be formed. For example, the through via trench 160T may be spaced apart from the source/drain region SD in the second horizontal direction DR2. Also, the through via trench 160T may be formed between the first gate electrode G1 and the second gate electrode G2.

Figure 23:
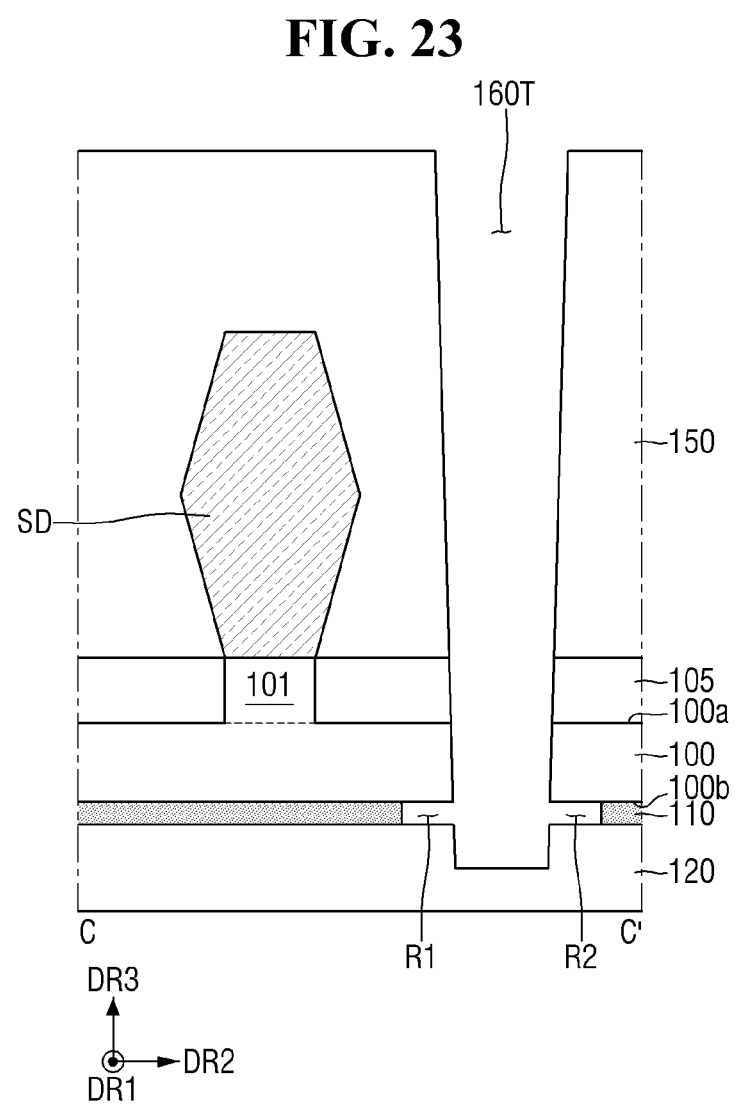

Referring to FIG. 23, a portion of the sacrificial layer 110, which is exposed to the through via trench 160T, may be etched. A portion of the sacrificial layer 110 may be etched through a wet etching process. Through this etching process, a first recess R1 and a second recess R2 may be formed inside the sacrificial layer 110 adjacent to the through via trench 160T.

Figure 24:
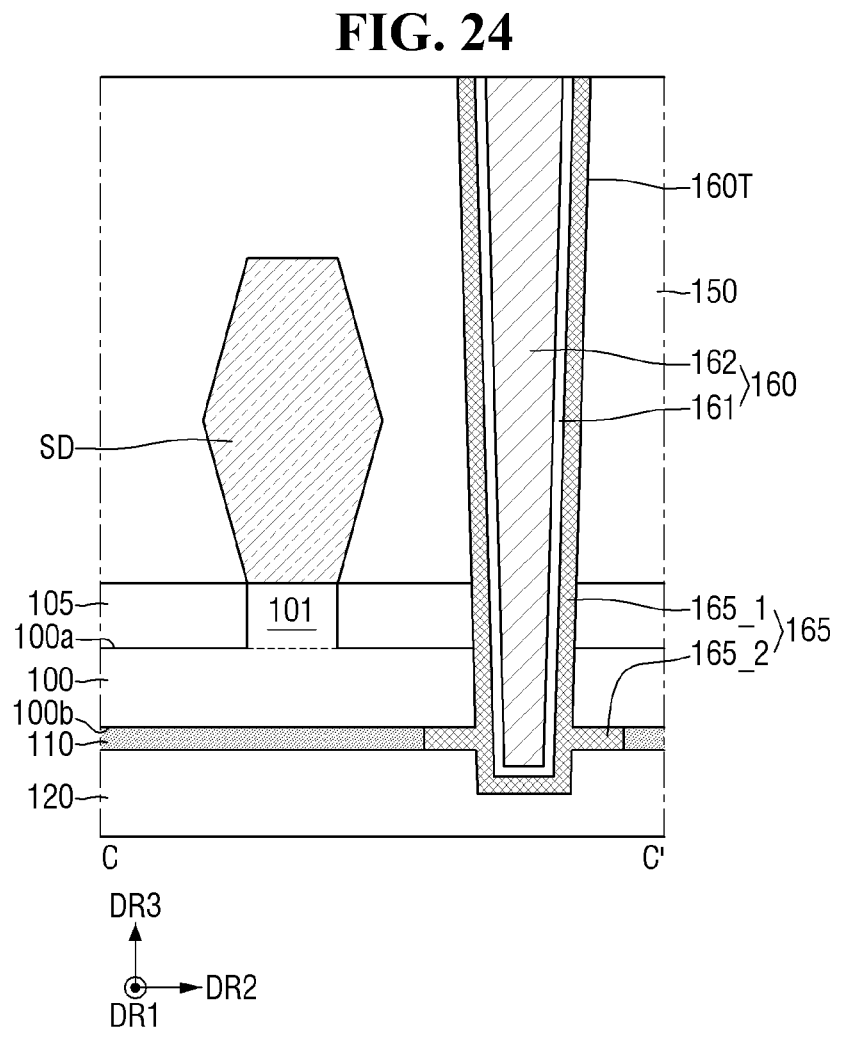

Referring to FIG. 24, a through via insulating layer 165 may be formed along sidewalls and a bottom surface of the through via trench 160T. In addition, the through via insulating layer 165 may fill the inside of each of the first recess R1 and the second recess R2. For example, the through via insulating layer 165 may be formed to be conformal. In this case, a portion of the through via insulating layer 165 formed along the sidewalls and the bottom surface of the through via trench 160T may be referred to as a first portion 165_1 of the through via insulating layer 165. Also, a portion of the through via insulating layer 165 formed inside each of the first recess R1 and the second recess R2 may be referred to as a second portion 165_2 of the through via insulating layer 165.

A through via 160, which includes a through via barrier layer 161 and a through via filling layer 162, may be formed on the through via insulating layer 165 inside the through via trench 160T. For example, the through via barrier layer 161 may be formed on the through via insulating layer 165 inside the through via trench 160T. For example, the through via barrier layer 161 may be formed to be conformal. The through via filling layer 162 may be formed on the through via barrier layer 161 inside the through via trench 160T. The through via filling layer 162 may fill the inside of the through via trench 160T.

Figure 25:
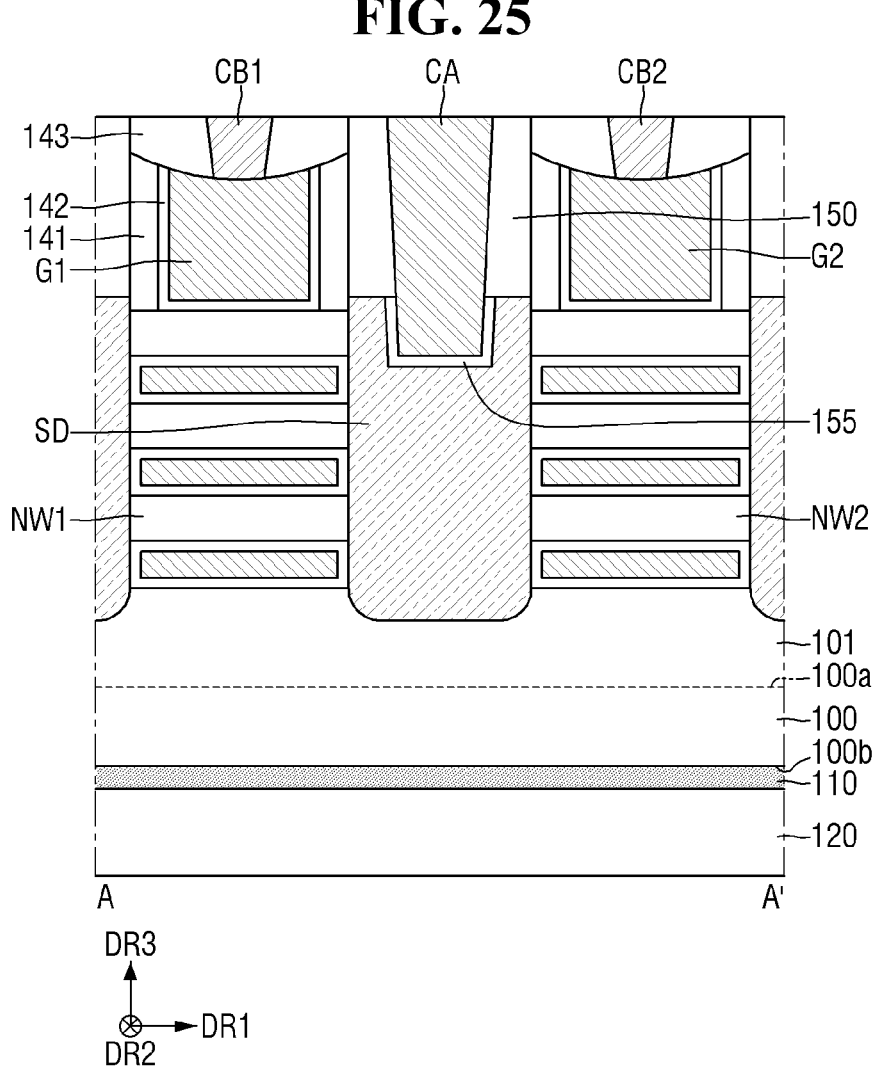
Figure 26:
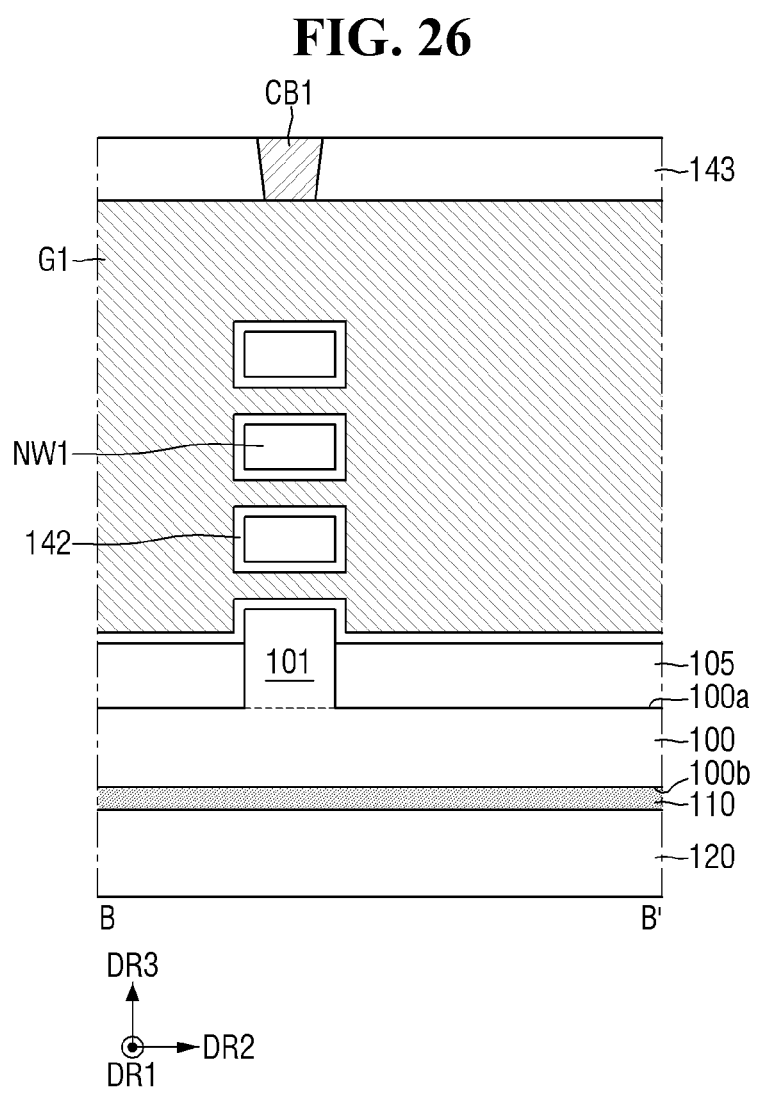
Figure 27:
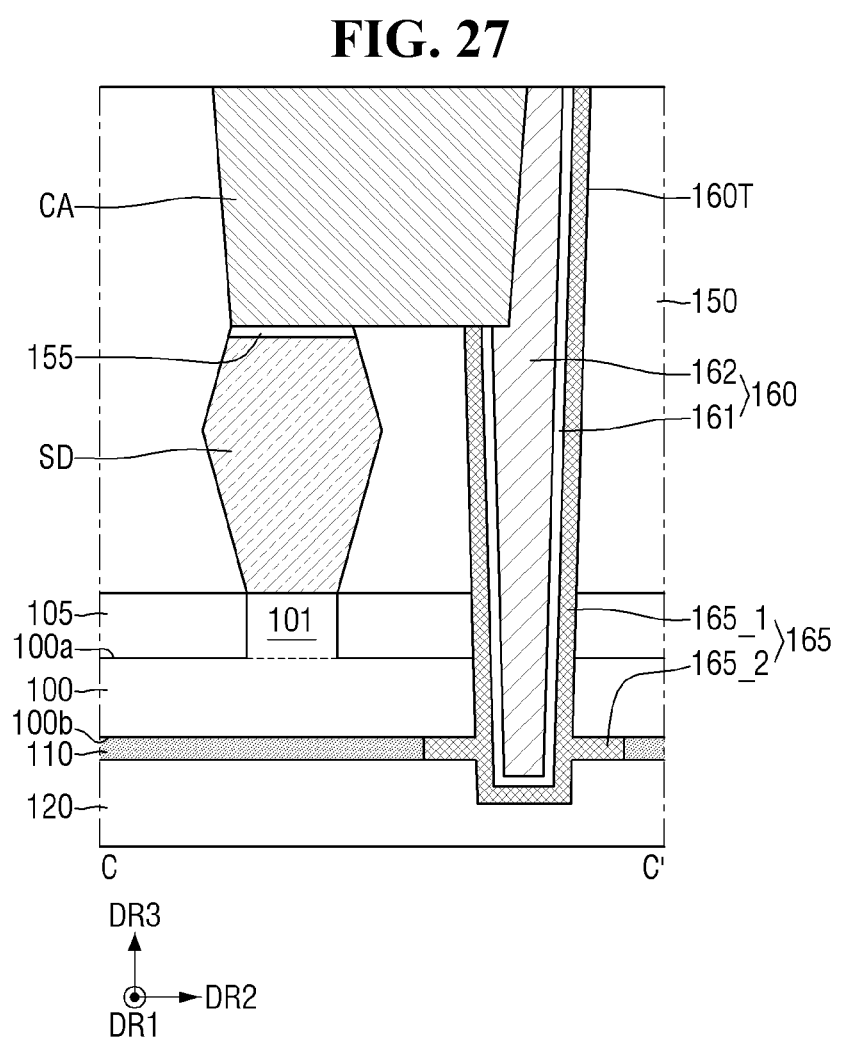

Referring to FIGS. 25 to 27, a first gate contact CB1 and a second gate contact CB2, which are respectively connected to the first gate electrode G1 and the second gate electrode G2, may be formed by passing through the capping pattern 143 in the vertical direction DR3. In addition, a source/drain contact CA connected to the source/drain region SD may be formed by passing through the first interlayer insulating layer 150 in the vertical direction DR3. A silicide layer 155 may be formed between the source/drain region SD and the source/drain contact CA.

For example, the source/drain contact CA may be also formed at a portion from which a portion of each sidewall of the through via 160 and the through via insulating layer 165 is etched. For this reason, the source/drain contact CA may be in contact with the through via 160. Also, the source/drain contact CA may overlap the through via 160 in the vertical direction DR3.

Figure 28:
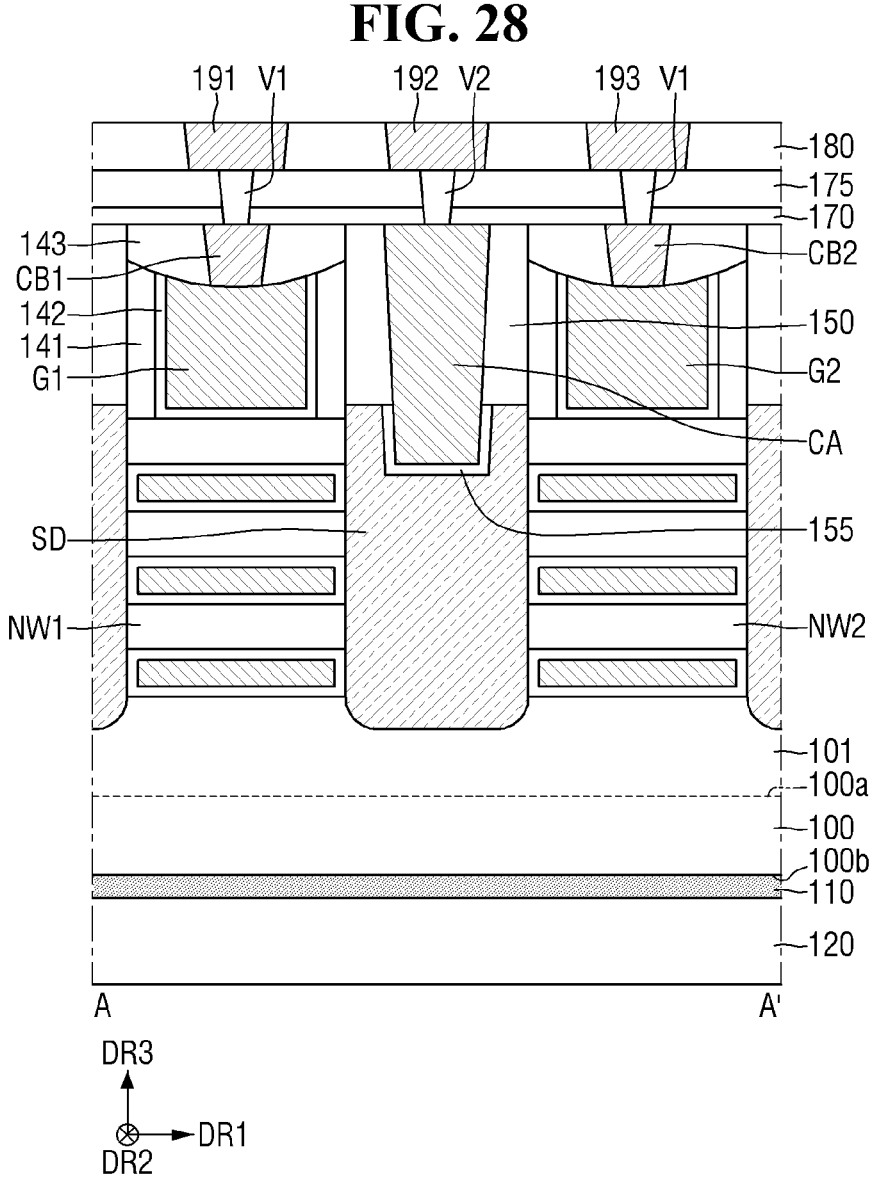
Figure 29:
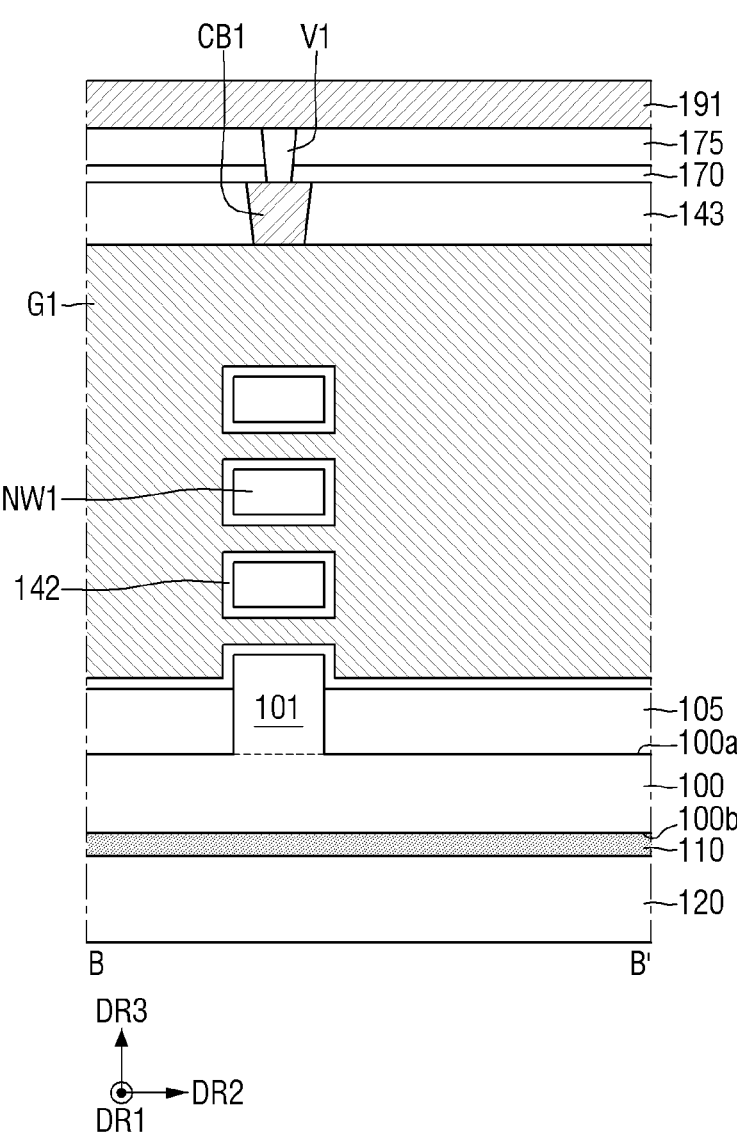
Figure 30:
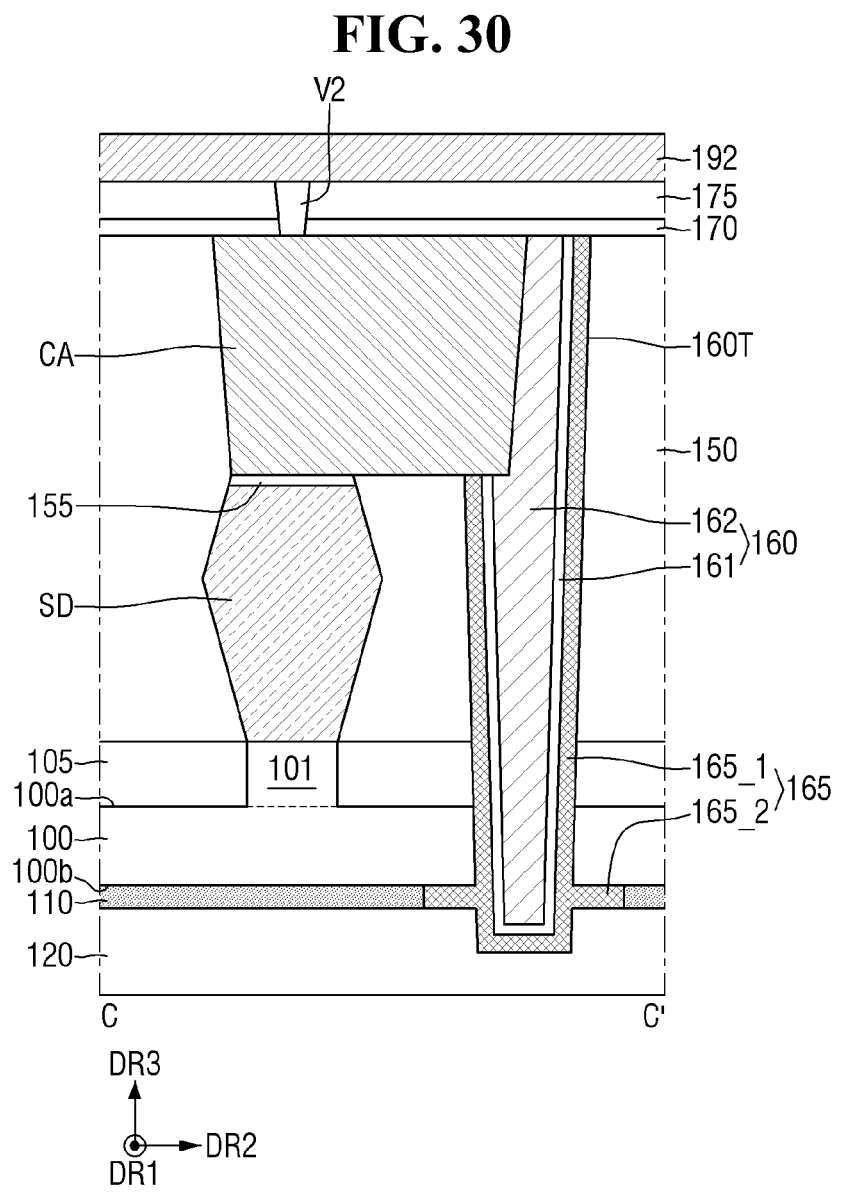

Referring to FIGS. 28 to 30, an etch stop layer 170 and a second interlayer insulating layer 175 may be sequentially formed on an upper surface of each of the first interlayer insulating layer 150, the capping pattern 143, the first and second gate contacts CB1 and CB2, the source/drain contact CA and the through via 160. A first via V1 connected to each of the first gate contact CB1 and the second gate contact CB2 may be formed by passing through the second interlayer insulating layer 175 and the etch stop layer 170 in the vertical direction DR3. In addition, a second via V2 connected to the source/drain contact CA may be formed by passing through the second interlayer insulating layer 175 and the etch stop layer 170 in the vertical direction DR3.

A third interlayer insulating layer 180 may be formed on an upper surface of each of the second interlayer insulating layer 175, the first via V1 and the second via V2. First to third upper wiring layers 191, 192 and 193 may be formed inside the third interlayer insulating layer 180. For example, the first to third upper wiring layers 191, 192 and 193 may be sequentially spaced apart from one another in the first horizontal direction DR1. For example, the first to third upper wiring layers 191, 192 and 193 may extend in the second horizontal direction DR2.

The first upper wiring layer 191 may be connected to the first via V1 on the first gate contact CB1. The second upper wiring layer 192 may be connected to the second via V2 on the source/drain contact CA. The third upper wiring layer 193 may be connected to the first via V1 on the second gate contact CB2.

Figure 31:
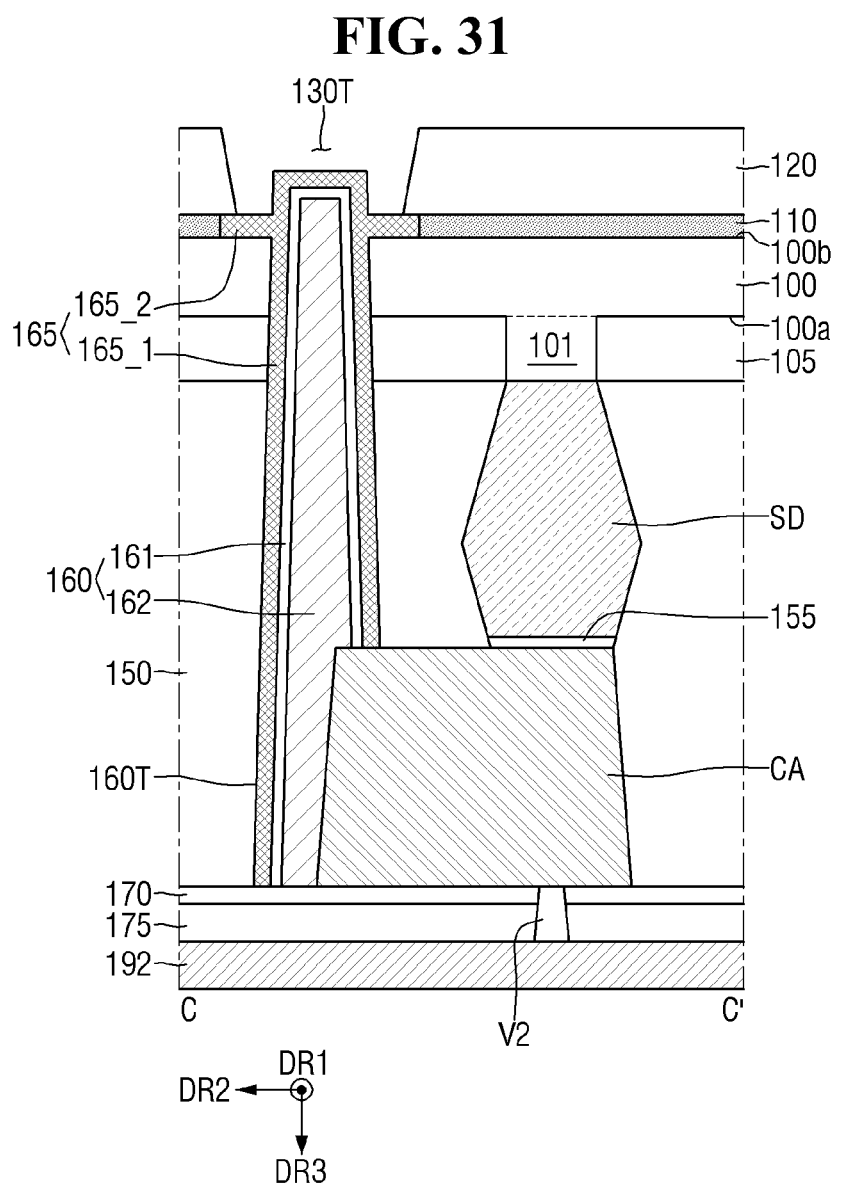

Referring to FIG. 31, after the manufacturing process shown in FIGS. 28 to 30 is performed, upper and lower portions may be inverted. In a state that the upper and lower portions are inverted, a lower wiring trench 130T may be formed inside the second substrate 120. The lower wiring trench 130T may be formed inside the second substrate 120 overlapped with the second portion 165_2 of the through via insulating layer 165 in the vertical direction DR3. The through via insulating layer 165 may be exposed through the lower wiring trench 130T.

Figure 32:
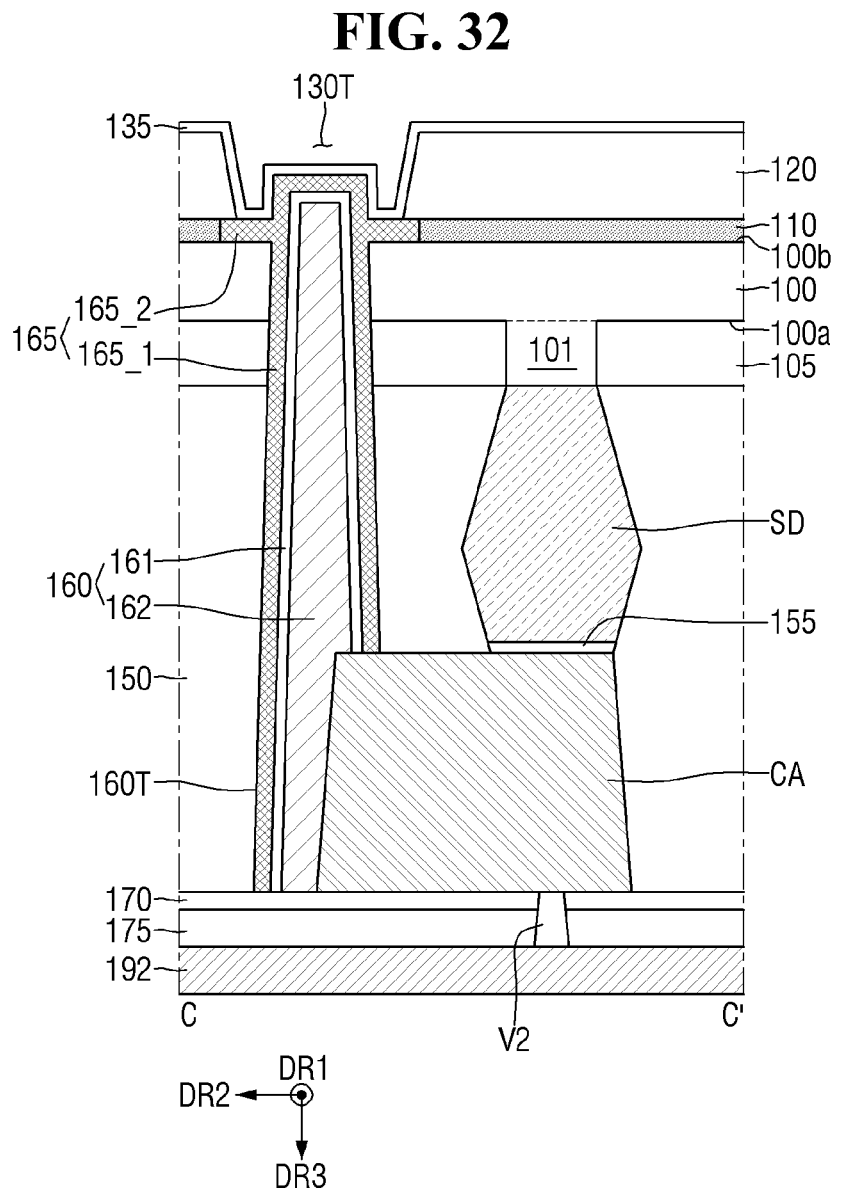

Referring to FIG. 32, a lower wiring insulating layer 135 may be formed inside the lower wiring trench 130T and on the exposed surface of the second substrate 120. For example, the lower wiring insulating layer 135 may be formed to be conformal.

Figure 33:
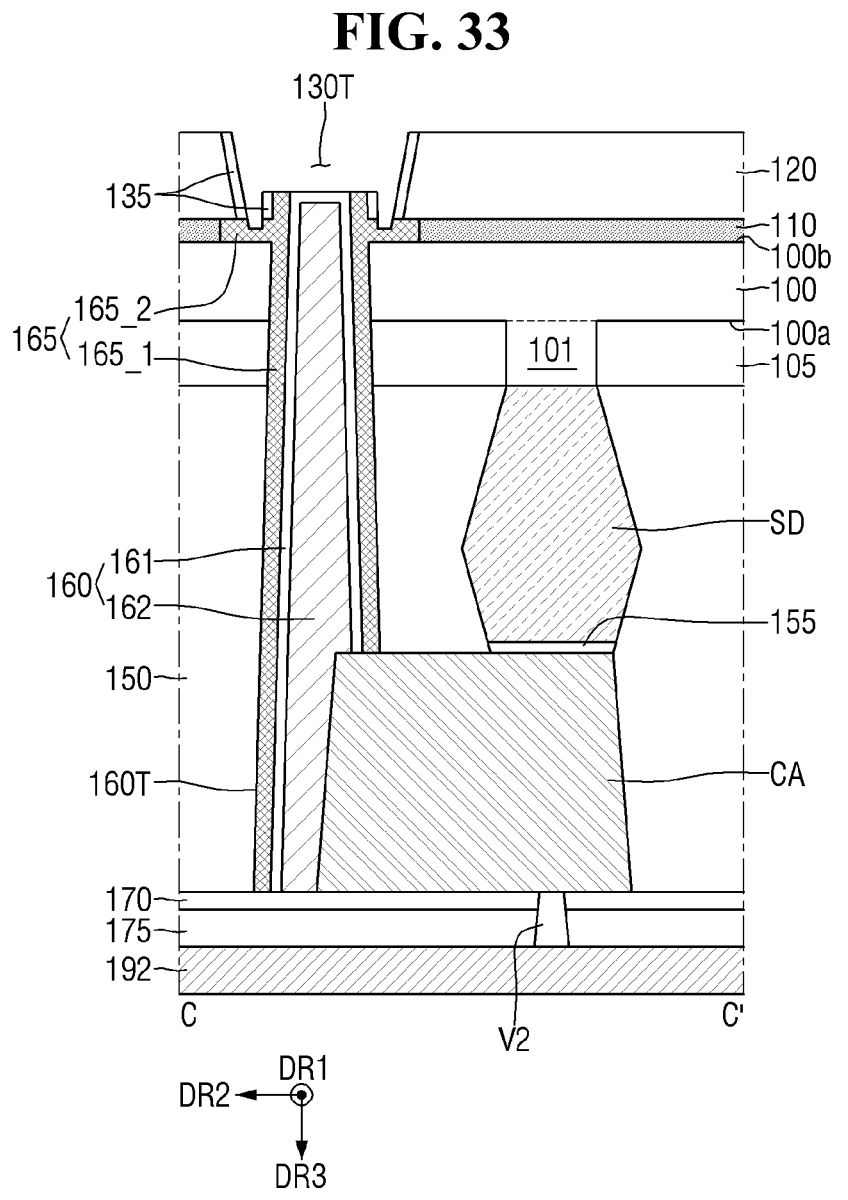

Referring to FIG. 33, for example, a portion of the lower wiring insulating layer 135 may be removed by an etch-back etching process. For example, the lower wiring insulating layer 135 formed on the uppermost surface of the first portion 165_1 of the through via insulating layer 165 and the upper surface of the second portion 165_2 of the through via insulating layer 165 may be removed through the etch-back etching process. For example, a portion of the second portion 165_2 of the through via insulating layer 165 may be also removed. However, for example, a portion of the lower wiring insulating layer 135 formed on the first portion 165_1 of the through via insulating layer 165 may remain without being etched, but embodiments are not limited thereto. In addition, the lower wiring insulating layer 135 formed on the surface of the second substrate 120 adjacent to the lower wiring trench 130T may be removed through the etch-back etching process.

Figure 34:
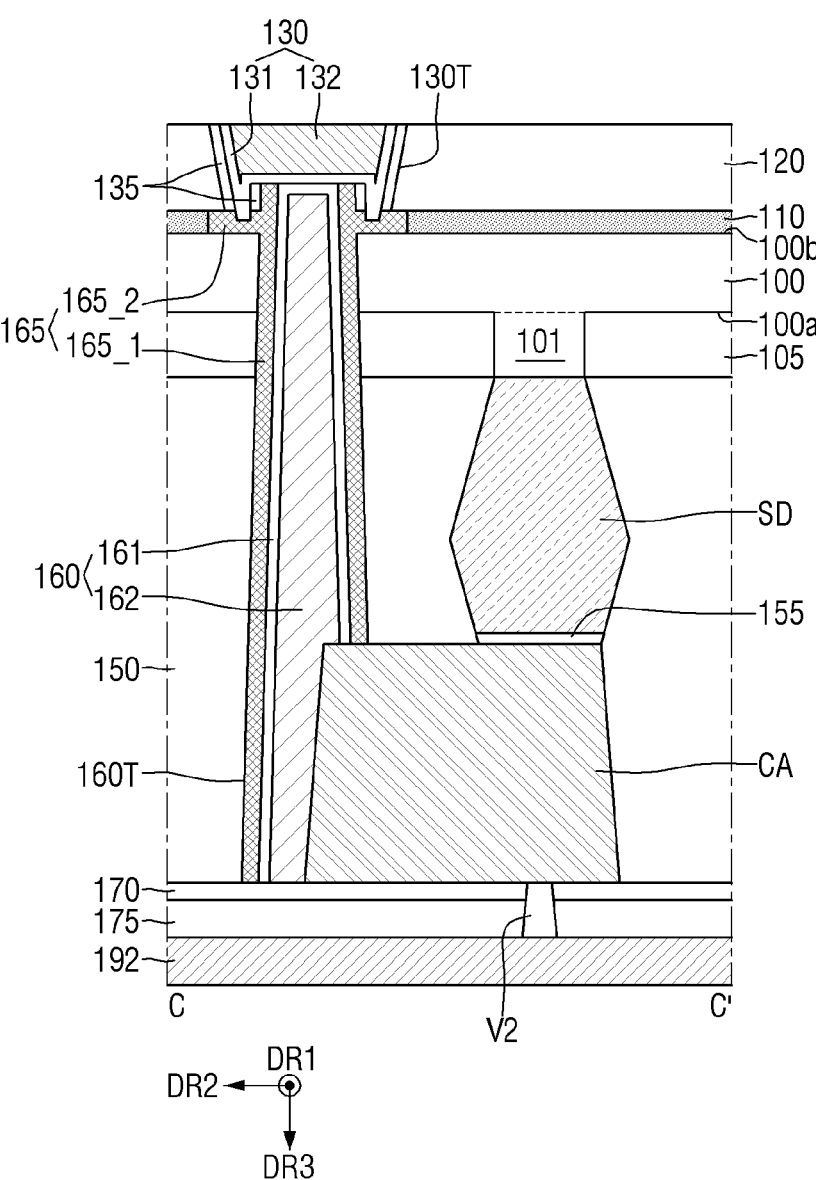

Referring to FIG. 34, a lower wiring barrier layer 131 and a lower wiring filling layer 132 may be sequentially formed inside the lower wiring trench 130T. Therefore, the lower wiring layer 130 may be formed inside the lower wiring trench 130T. After the manufacturing process is performed, the semiconductor device shown in FIGS. 2 to 5 may be manufactured by inversion of the upper and lower portions.

Hereinafter, a semiconductor device according to some other embodiments will be described with reference to FIGS. 35 and 36. The following description will be based on differences from the semiconductor device shown in FIGS. 1 to 5.

Figure 35:
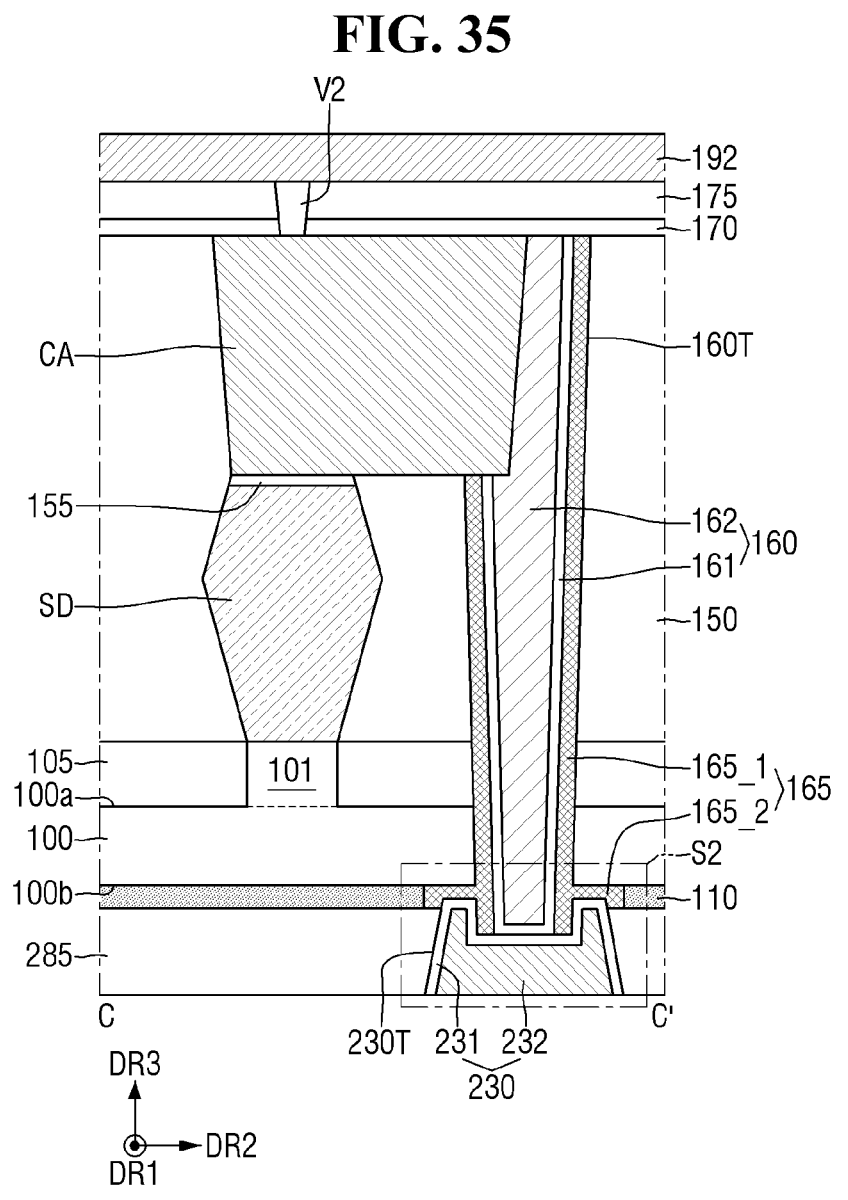

FIG. 35 is a cross-sectional view illustrating a semiconductor device according to some other embodiments. FIG. 36 is an enlarged view illustrating a region S2 of FIG. 35.

Figure 36:
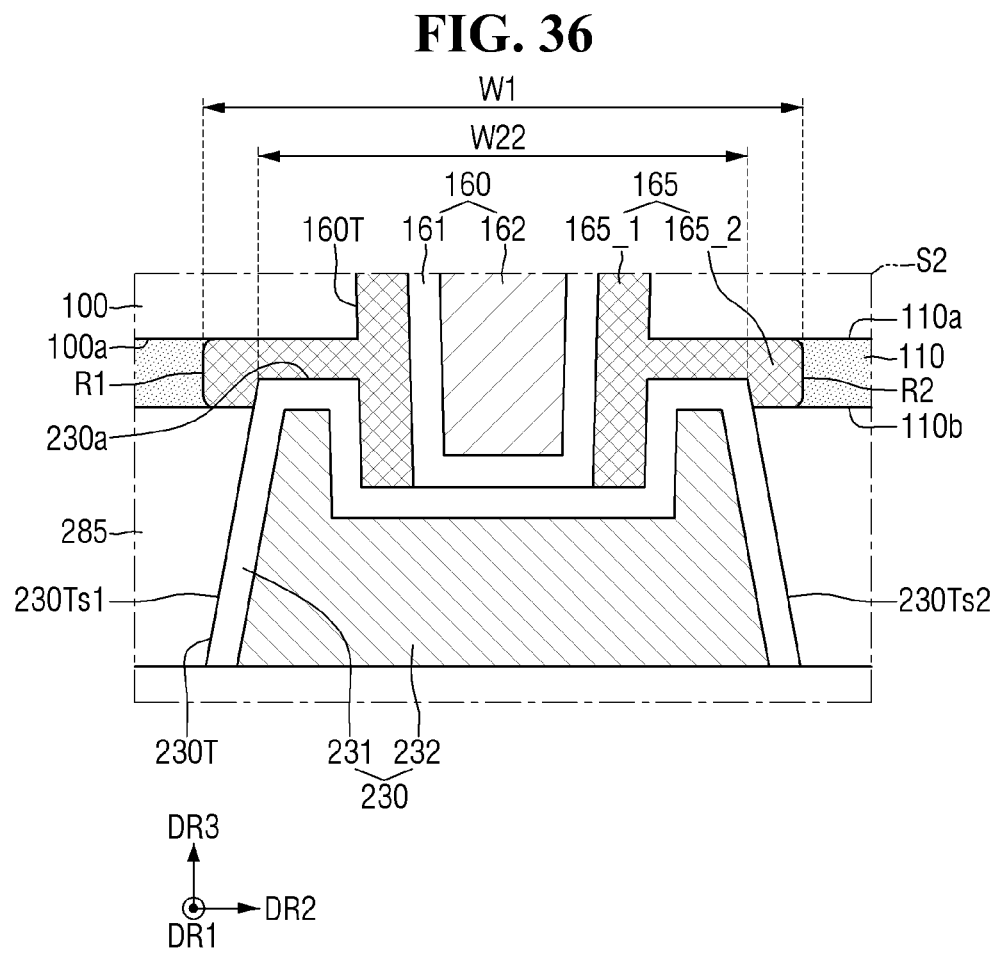
FIG. 36 is an enlarged view illustrating a region S2 of FIG. 35.

Referring to FIGS. 35 and 36, in the semiconductor device according to some other embodiments, a lower wiring layer 230 may be disposed inside a lower interlayer insulating layer 285. The lower interlayer insulating layer 285 may include at least one of, for example, silicon oxide, silicon nitride, silicon oxynitride, or a low dielectric constant material.

For example, the lower interlayer insulating layer 285 may be disposed on the lower surface 110b of the sacrificial layer 110. The lower interlayer insulating layer 285 may be in contact with the lower surface 110b of the sacrificial layer 110. A lower surface of the second portion 165_2 of the through via insulating layer 165 may be in contact with the lower interlayer insulating layer 285 disposed on a first sidewall 230Ts1 of a lower wiring trench 230T. In addition, the lower surface of the second portion 165_2 of the through via insulating layer 165 may be in contact with the lower interlayer insulating layer 285 disposed on a second sidewall 230Ts2 of the lower wiring trench 230T. For example, a width W22 of the through via trench 160T in the second horizontal direction DR2, which is adjacent to the second portion 165_2 of the through via insulating layer 165, may be smaller than the width W1 of the second portion 165_2 of the through via insulating layer 165 in the second horizontal direction DR2.

For example, at least a portion of the lower wiring layer 230 may be disposed inside the second portion 165_2 of the through via insulating layer 165. An uppermost surface 230a of the lower wiring layer 230 may be in contact with the second portion 165_2 of the through via insulating layer 165. Also, the lower wiring layer 230 may be in contact with each of the lowermost surface of the first portion 165_1 of the through via insulating layer 165 and the lowermost surface of the through via 160. For example, the lower wiring layer 230 may be in contact with the through via barrier layer 161 forming the bottom surface of the through via 160.

For example, the uppermost surface 230a of the lower wiring layer 230 may be formed to be lower than the upper surface of the second portion 165_2 of the through via insulating layer 165. That is, the uppermost surface 230a of the lower wiring layer 230 may be formed to be lower than the upper surface 110a of the sacrificial layer 110. In addition, the uppermost surface 230a of the lower wiring layer 230 may be formed to be higher than the lower surface of the second portion 165_2 of the through via insulating layer 165. That is, the uppermost surface 230a of the lower wiring layer 230 may be formed to be lower than the lower surface 110b of the sacrificial layer 110.

For example, the lower wiring layer 230 may include a lower wiring barrier layer 231 and a lower wiring filling layer 232. The lower wiring barrier layer 231 may be disposed along sidewalls and upper surface of the lower wiring trench 230T. For example, the lower wiring bather layer 231 may be disposed to be conformal. The lower wiring bather layer 231 may be in contact with the lower interlayer insulating layer 285. The lower wiring filling layer 232 may be disposed on the lower wiring barrier layer 231 inside the lower wiring trench 230T. The lower wiring filling layer 232 may fill the inside of the lower wiring trench 230T on the lower wiring barrier layer 231.

Hereinafter, a method of manufacturing the semiconductor device shown in FIGS. 35 and 36 will be described with reference to FIGS. 37 to 41. The following description will be based on differences from the method of manufacturing a semiconductor device, which is shown in FIGS. 6 to 34.

Referring to FIG. 37, after the manufacturing process shown in FIGS. 6 to 30 is performed, upper and lower portions may be inverted. In a state that the upper and lower portions are inverted, the second substrate (120 of FIG. 30) may be removed. Therefore, each of the sacrificial layer 110 and the through via insulating layer 165 may be exposed.

Figure 38:
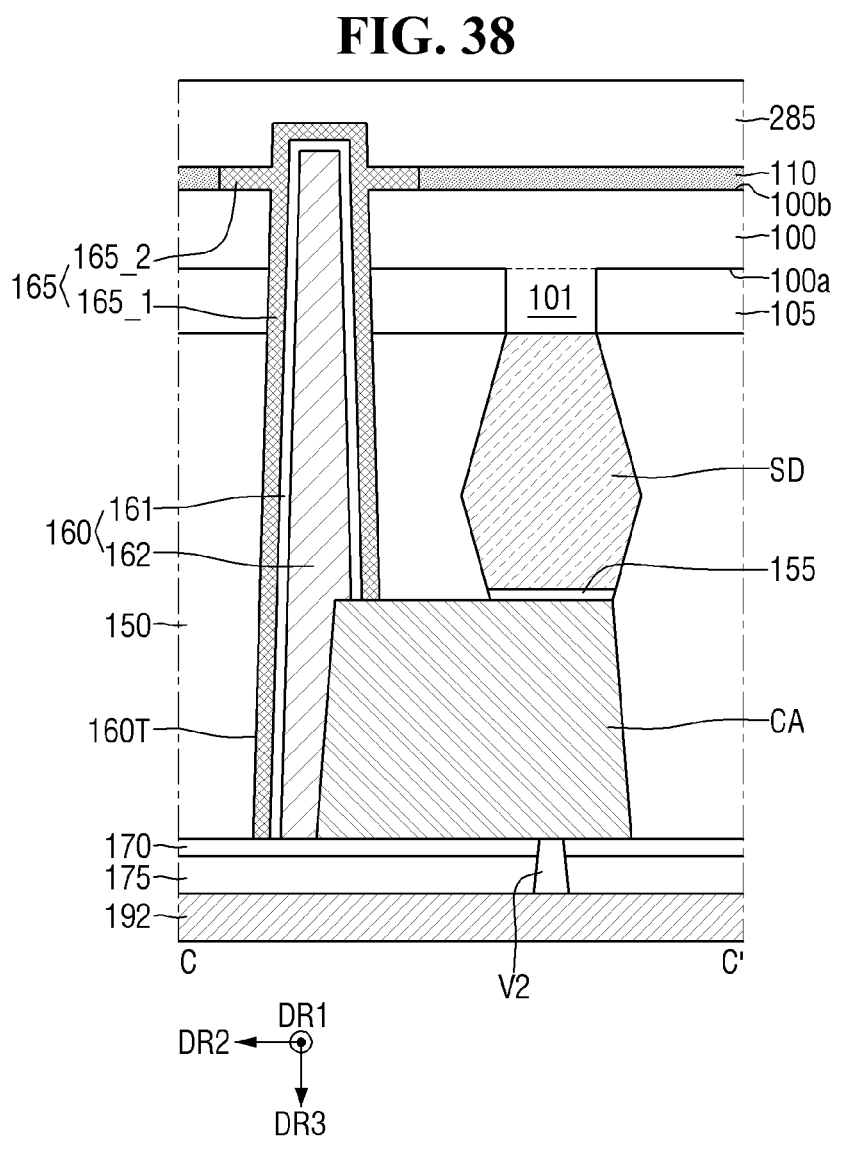

Referring to FIG. 38, a lower interlayer insulating layer 285 may be formed to cover the exposed sacrificial layer 110 and the exposed through via insulating layer 165.

Figure 39:
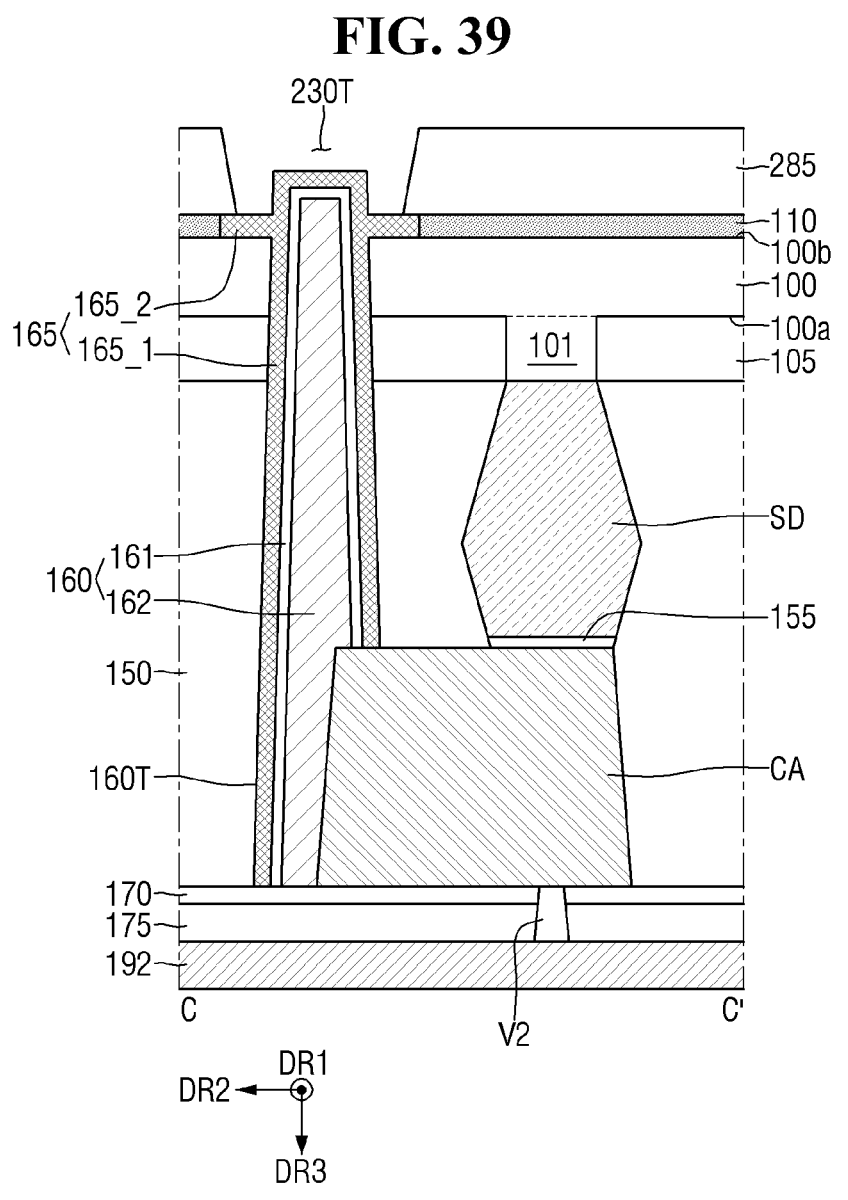

Referring to FIG. 39, a lower wiring trench 230T may be formed inside the lower interlayer insulating layer 285. The lower wiring trench 230T may be formed inside the lower interlayer insulating layer 285 overlapped with the second portion 165_2 of the through via insulating layer 165 in the vertical direction DR3. The through via insulating layer 165 may be exposed through the lower wiring trench 230T.

Figure 40:
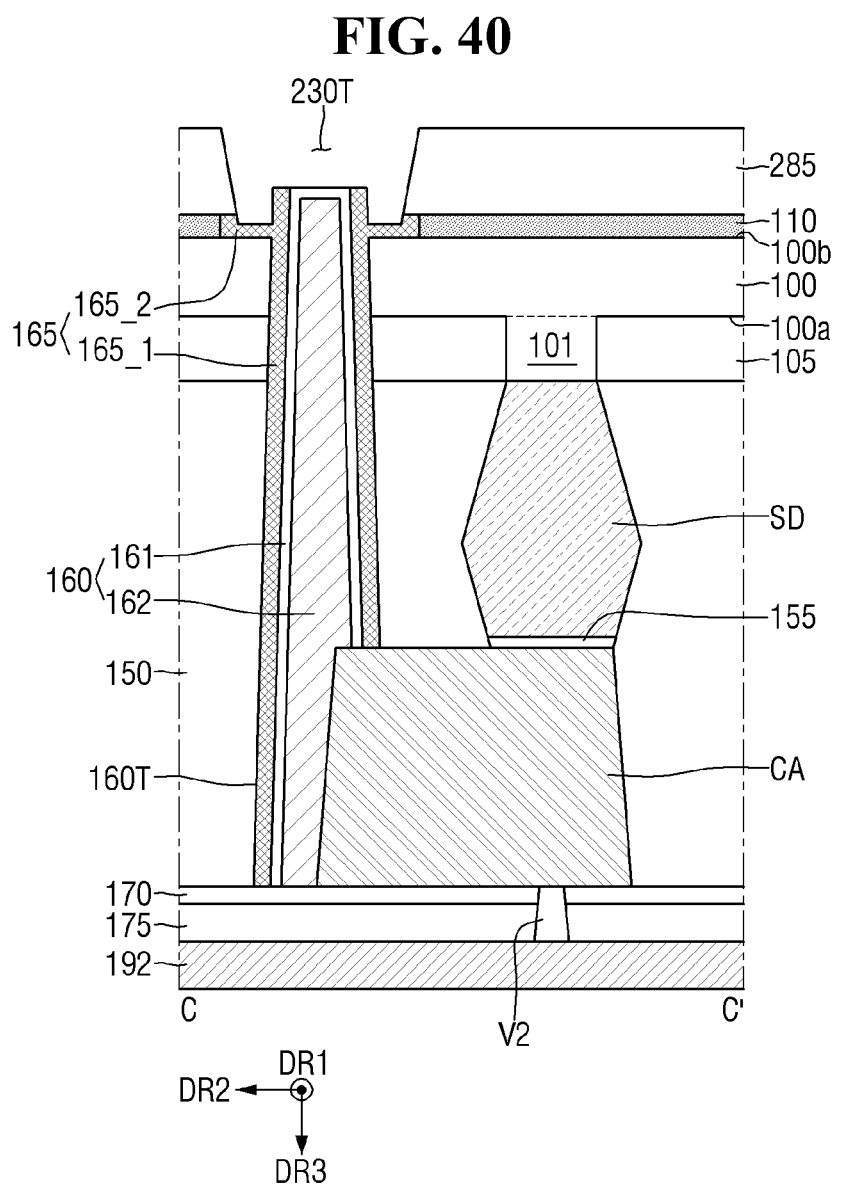

Referring to FIG. 40, for example, a portion of the through via insulating layer 165 may be removed by an etch-back etching process. For example, the through via insulating layer 165 formed on the through via 160 may be removed through the etch-back etching process, so that the through via barrier layer 161 may be exposed. For example, the second portion 165_2 of the through via insulating layer 165 may be also removed.

Figure 41:
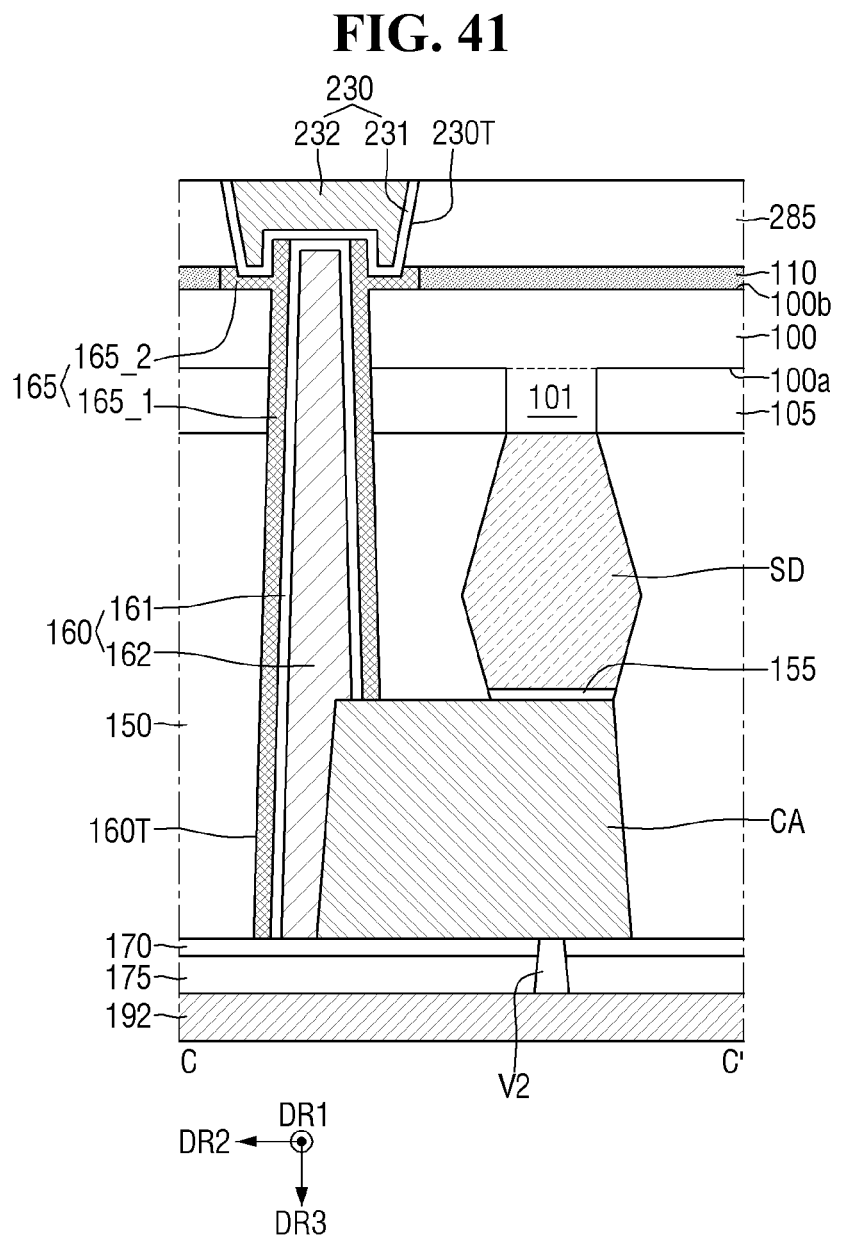

Referring to FIG. 41, a lower wiring barrier layer 231 and a lower wiring filling layer 232 may be sequentially formed inside the lower wiring trench 230T. Therefore, the lower wiring layer 230 may be formed inside the lower wiring trench 230T. After the manufacturing process is performed, the semiconductor device shown in FIGS. 35 and 36 may be manufactured by inversion of the upper and lower portions.

Hereinafter, a semiconductor device according to some other embodiments will be described with reference to FIGS. 42 and 43. The following description will be based on differences from the semiconductor device shown in FIGS. 1 to 5.

Figure 42:
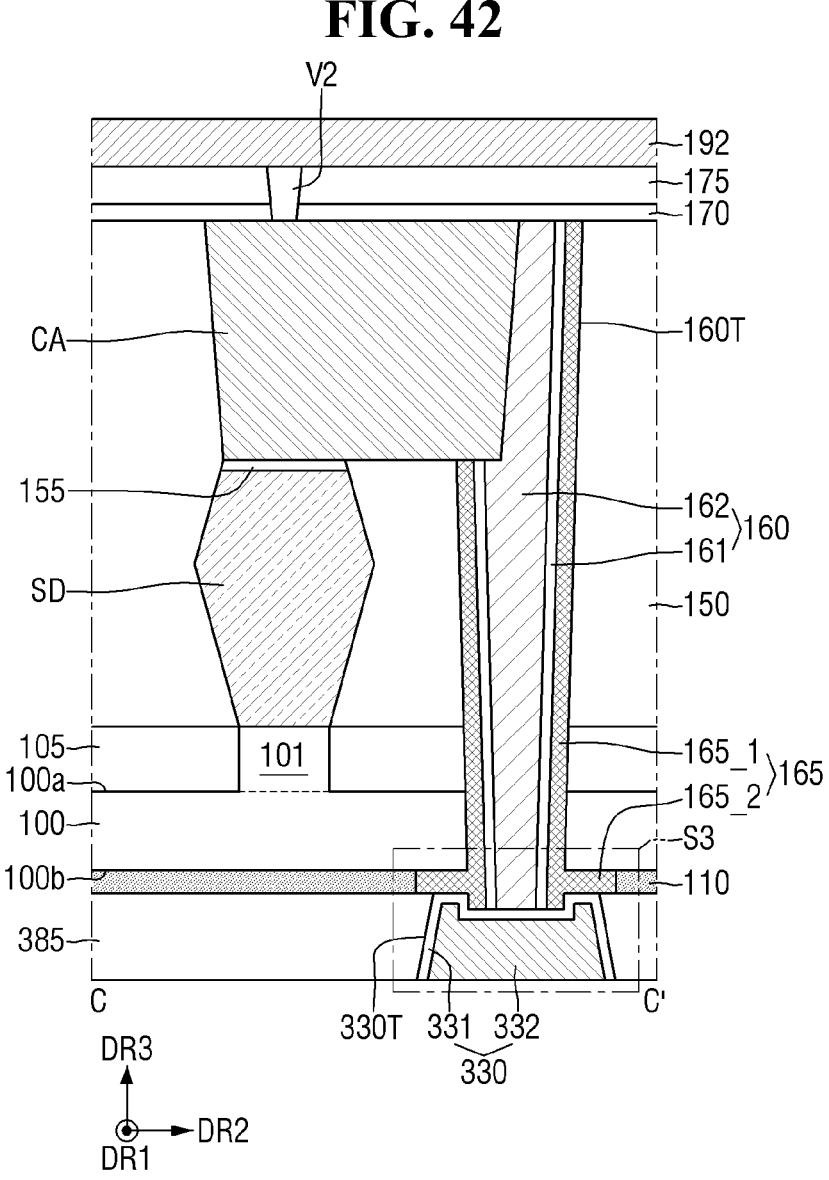
FIG. 42 is a cross-sectional view illustrating a semiconductor device according to some other embodiments.

FIG. 42 is a cross-sectional view illustrating a semiconductor device according to some other embodiments. FIG. 43 is an enlarged view illustrating a region S3 of FIG. 42.

Figure 43:
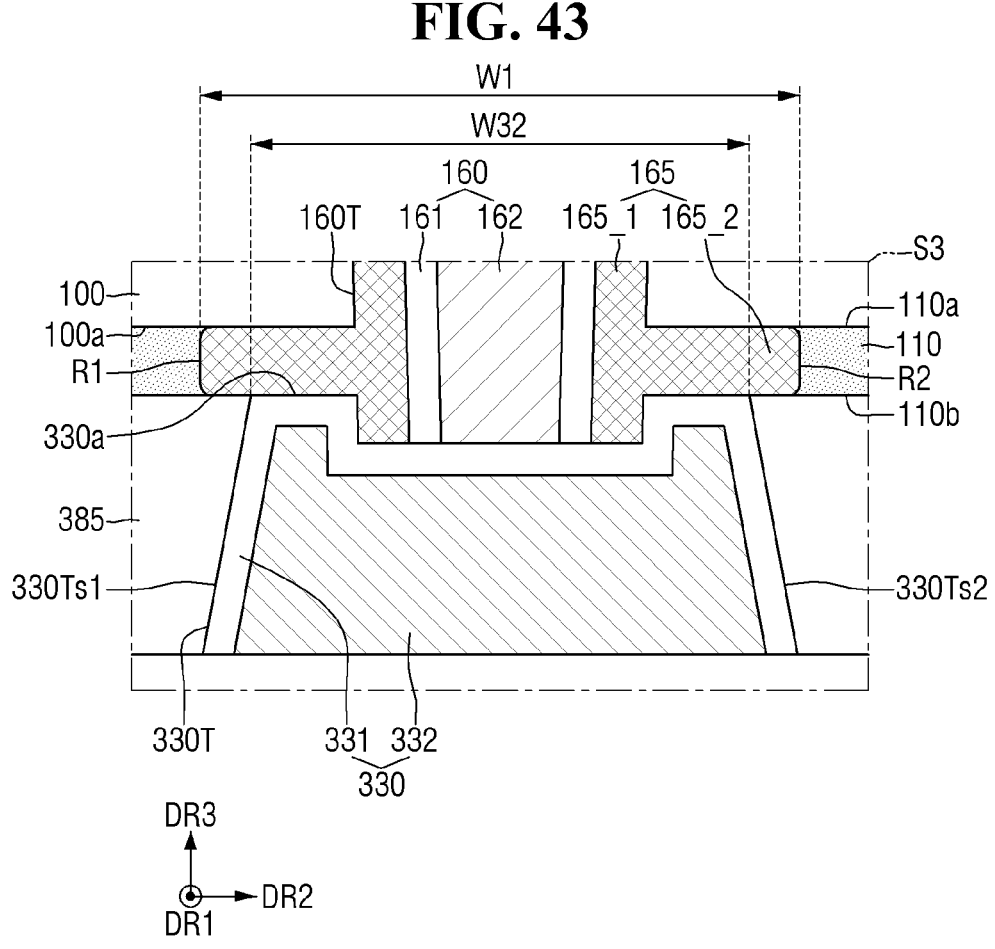
FIG. 43 is an enlarged view illustrating a region S3 of FIG. 42.

Referring to FIGS. 42 and 43, in the semiconductor device according to some other embodiments, a lower wiring layer 330 may be disposed inside a lower interlayer insulating layer 385. The lower interlayer insulating layer 385 may include at least one of, for example, silicon oxide, silicon nitride, silicon oxynitride, or a low dielectric constant material.

For example, the lower interlayer insulating layer 385 may be disposed on the lower surface 110b of the sacrificial layer 110. The lower interlayer insulating layer 385 may be in contact with the lower surface 110b of the sacrificial layer 110. A lower surface of the second portion 165_2 of the through via insulating layer 165 may be in contact with the lower interlayer insulating layer 385 disposed on a first sidewall 330Ts1 of a lower wiring trench 330T. In addition, the lower surface of the second portion 165_2 of the through via insulating layer 165 may be in contact with the lower interlayer insulating layer 385 disposed on a second sidewall 330Ts2 of the lower wiring trench 330T. For example, a width W32 of the through via trench 160T in the second horizontal direction DR2, which is adjacent to the second portion 165_2 of the through via insulating layer 165, may be smaller than the width W1 of the second portion 165_2 of the through via insulating layer 165 in the second horizontal direction DR2.

For example, an uppermost surface 330a of the lower wiring layer 330 may be in contact with the second portion 165_2 of the through via insulating layer 165. The uppermost surface 330a of the lower wiring layer 330 may be formed on the same plane as the upper surface of the lower interlayer insulating layer 385. Also, the lower wiring layer 330 may be in contact with each of the lowermost surface of the first portion 165_1 of the through via insulating layer 165 and the lowermost surface of the through via 160. For example, the lower wiring layer 330 may be in contact with each of the through via barrier layer 161 and the through via filling layer 162.

For example, the lower wiring layer 330 may include a lower wiring barrier layer 331 and a lower wiring filling layer 332. The lower wiring barrier layer 331 may be disposed along sidewalls and upper surface of the lower wiring trench 330T. For example, the lower wiring barrier layer 331 may be disposed to be conformal. The lower wiring barrier layer 331 may be in contact with the lower interlayer insulating layer 385. The lower wiring filling layer 332 may be disposed on the lower wiring barrier layer 331 inside the lower wiring trench 330T. The lower wiring filling layer 332 may fill the inside of the lower wiring trench 330T on the lower wiring barrier layer 331.

Hereinafter, a method of manufacturing the semiconductor device shown in FIGS. 42 and 43 will be described with reference to FIGS. 44 to 49. The following description will be based on differences from the method of manufacturing a semiconductor device, which is shown in FIGS. 6 to 34.

FIGS. 44 to 49 are views illustrating intermediate operations of a method of manufacturing a semiconductor device shown in FIGS. 42 and 43.

Figure 44:
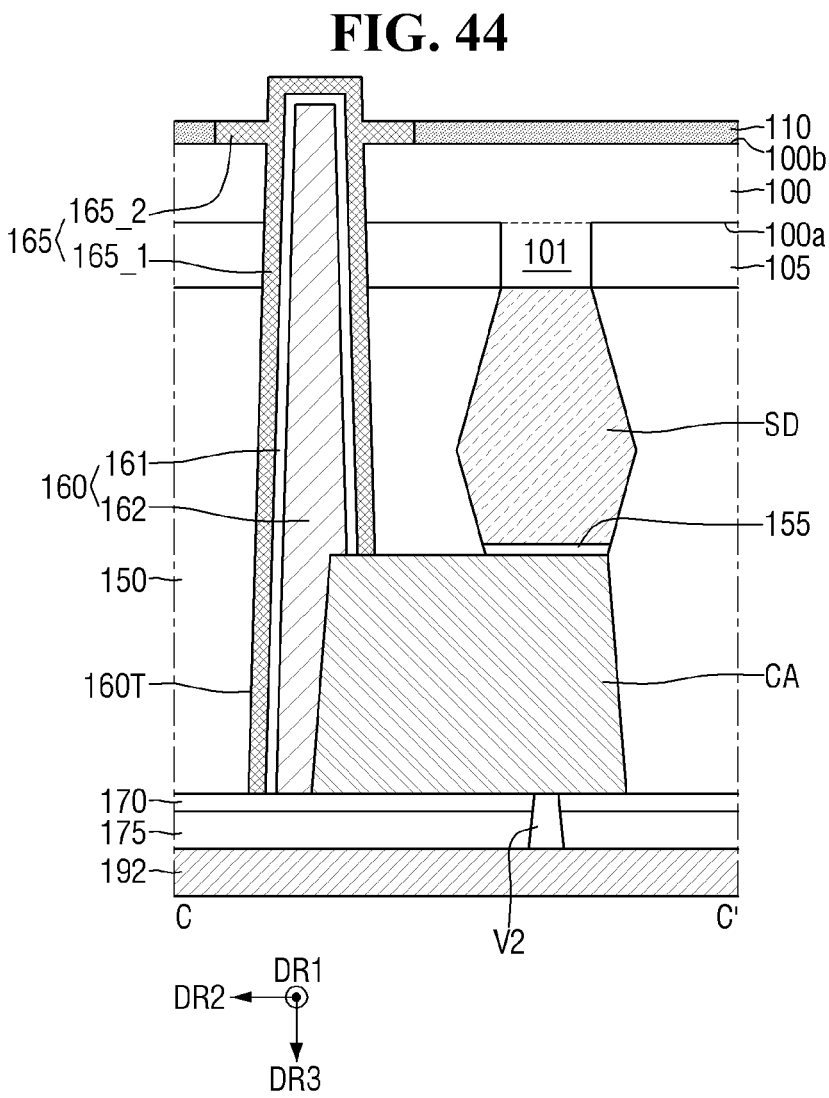

Referring to FIG. 44, after the manufacturing process shown in FIGS. 6 to 30 is performed, upper and lower portions may be inverted. In a state that the upper and lower portions are inverted, the second substrate (120 of FIG. 30) may be removed. Therefore, each of the sacrificial layer 110 and the through via insulating layer 165 may be exposed.

Figure 45:
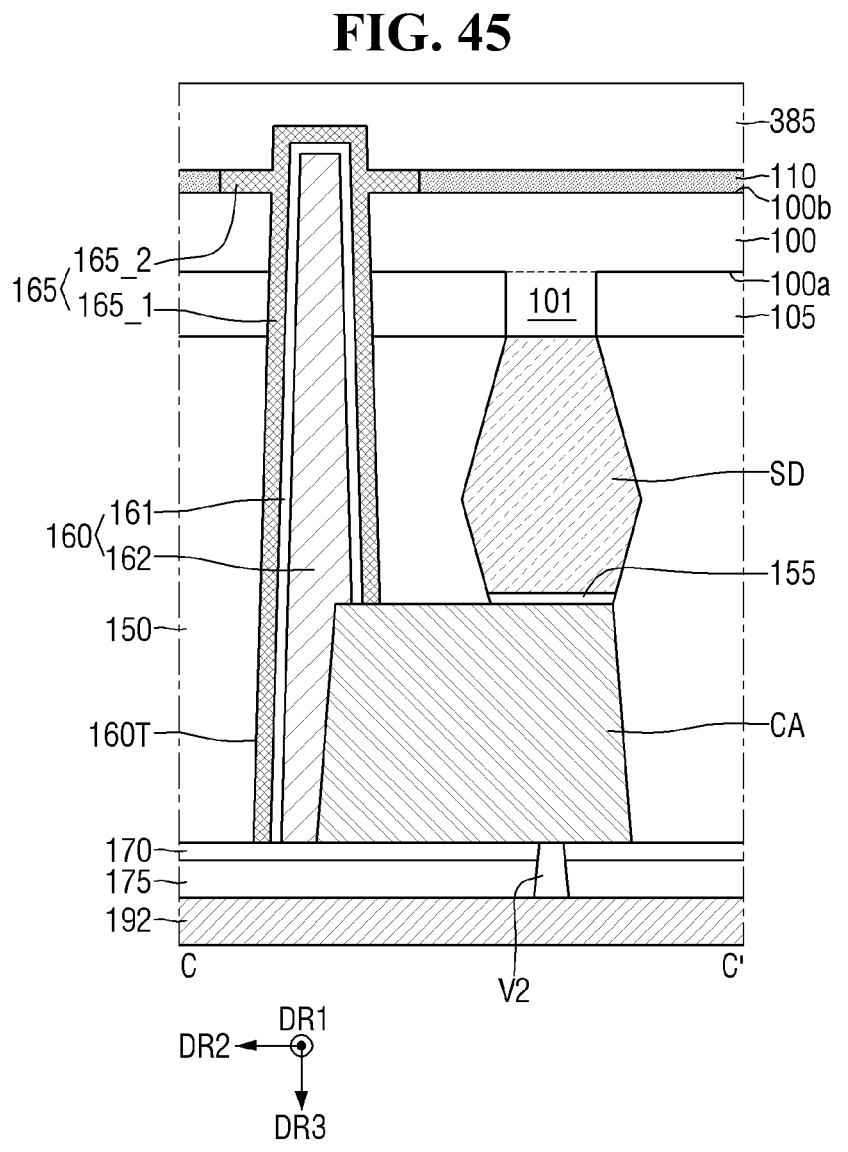

Referring to FIG. 45, a lower interlayer insulating layer 385 may be formed to cover the exposed sacrificial layer 110 and the exposed through via insulating layer 165.

Figure 46:
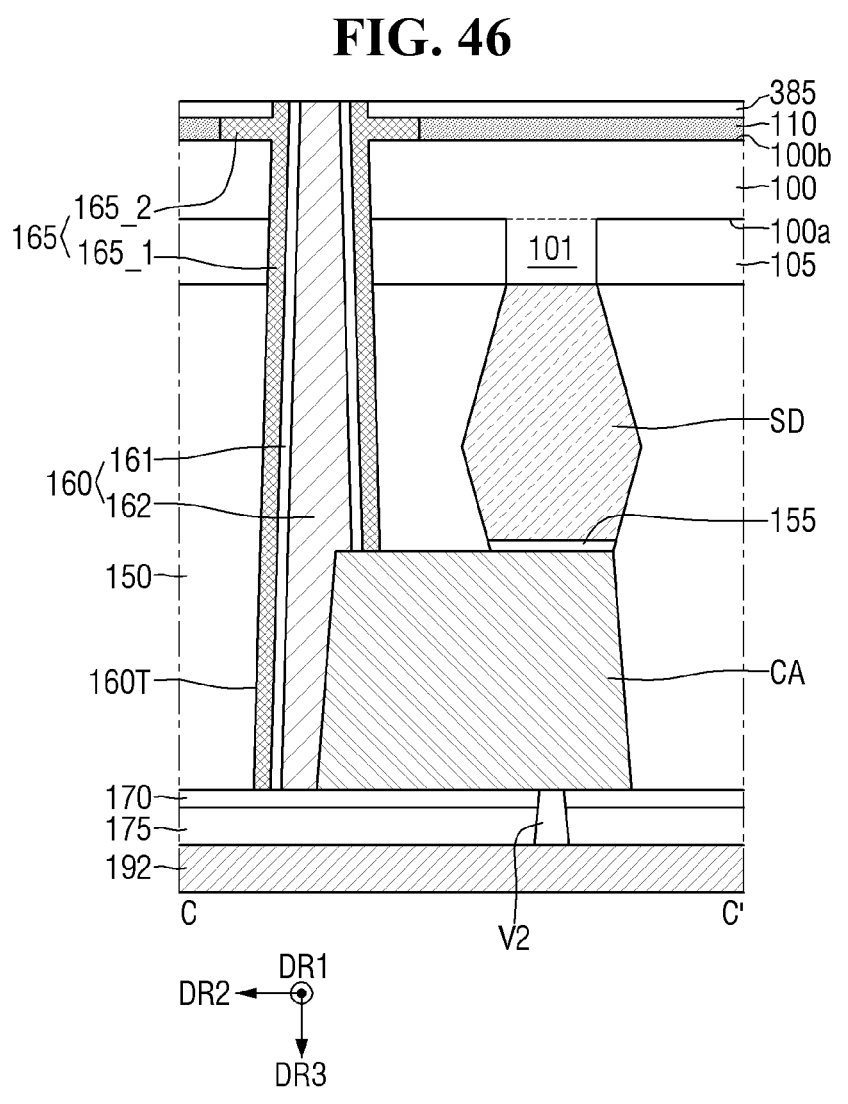

Referring to FIG. 46, a portion of the lower interlayer insulating layer 385 and a portion of the through via insulating layer 165 may be etched by a planarization process. For example, the through via barrier layer 161 formed on the through via filling layer 162 may be also etched. Therefore, the uppermost surface of the through via insulating layer 165, the uppermost surface of the through via barrier layer 161 and the uppermost surface of the through via filling layer 162 may be exposed, respectively. For example, a portion of the lower interlayer insulating layer 385 may remain on the second portion 165_2 of the through via insulating layer 165 and the sacrificial layer 110.

Figure 47:
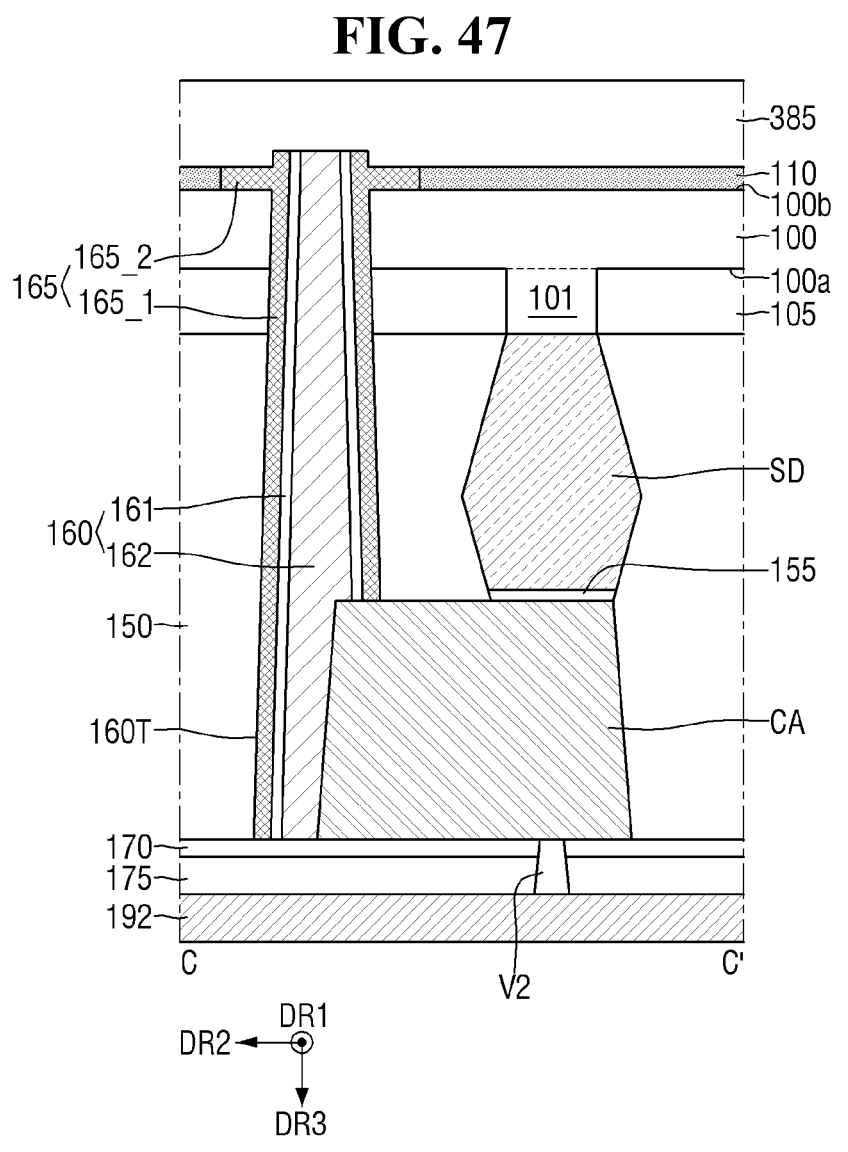

Referring to FIG. 47, a lower interlayer insulating layer 385 may be additionally formed on the uppermost surface of the through via insulating layer 165, the uppermost surface of the through via barrier layer 161, the uppermost surface of the through via filling layer 162, and the remaining lower interlayer insulating layer 385.

Figure 48:
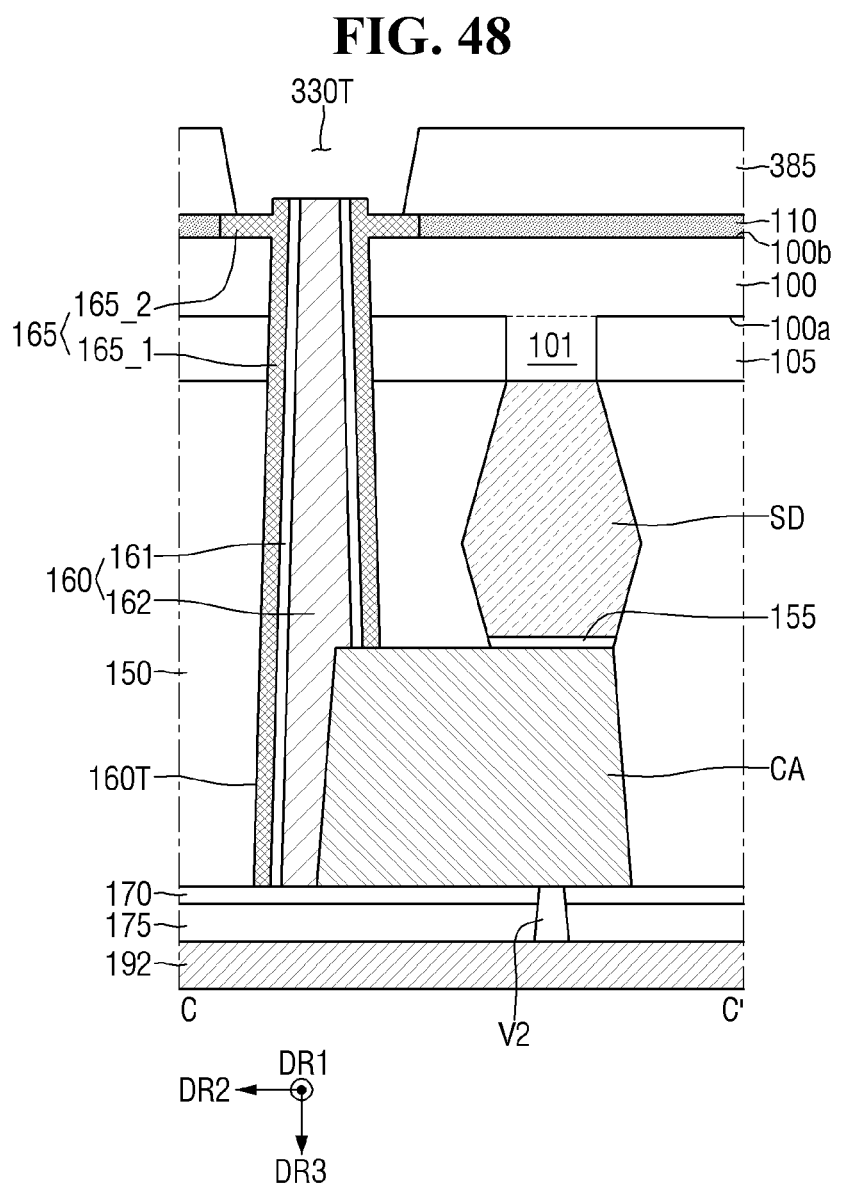

Referring to FIG. 48, a lower wiring trench 330T may be formed inside the lower interlayer insulating layer 385. The lower wiring trench 330T may be formed inside the lower interlayer insulating layer 385 overlapped with the second portion 165_2 of the through via insulating layer 165 in the vertical direction DR3. The through via insulating layer 165, the uppermost surface of the through via barrier layer 161 and the uppermost surface of the through via filling layer 162 may be respectively exposed through the lower wiring trench 330T.

Figure 49:
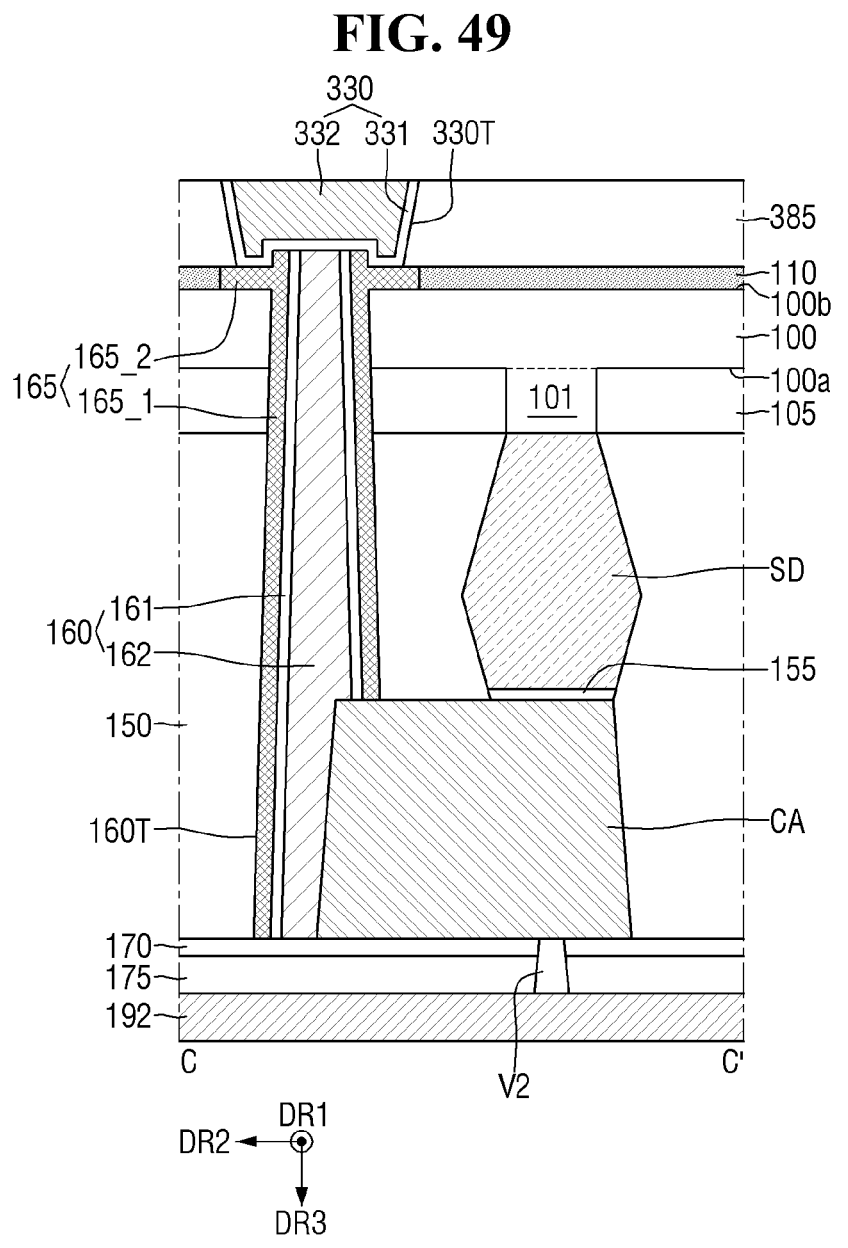

Referring to FIG. 49, a lower wiring barrier layer 331 and a lower wiring filling layer 332 may be sequentially formed inside the lower wiring trench 330T. Therefore, the lower wiring layer 330 may be formed inside the lower wiring trench 330T. After the manufacturing process is performed, the semiconductor device shown in FIGS. 42 and 43 may be manufactured by inversion of the upper and lower portions.

Hereinafter, a semiconductor device according to some other embodiments will be described with reference to FIGS. 50 and 51. The following description will be based on differences from the semiconductor device shown in FIGS. 1 to 5.

Figure 50:
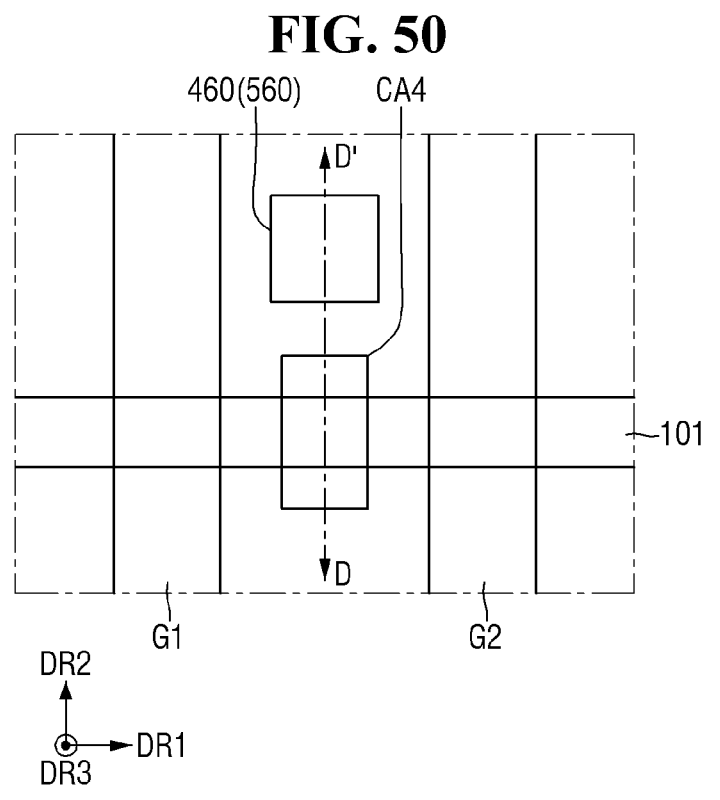

FIG. 50 is a schematic layout view illustrating a semiconductor device according to some other embodiments. FIG. 51 is a cross-sectional view taken along line D-D' of FIG. 50.

Figure 51:
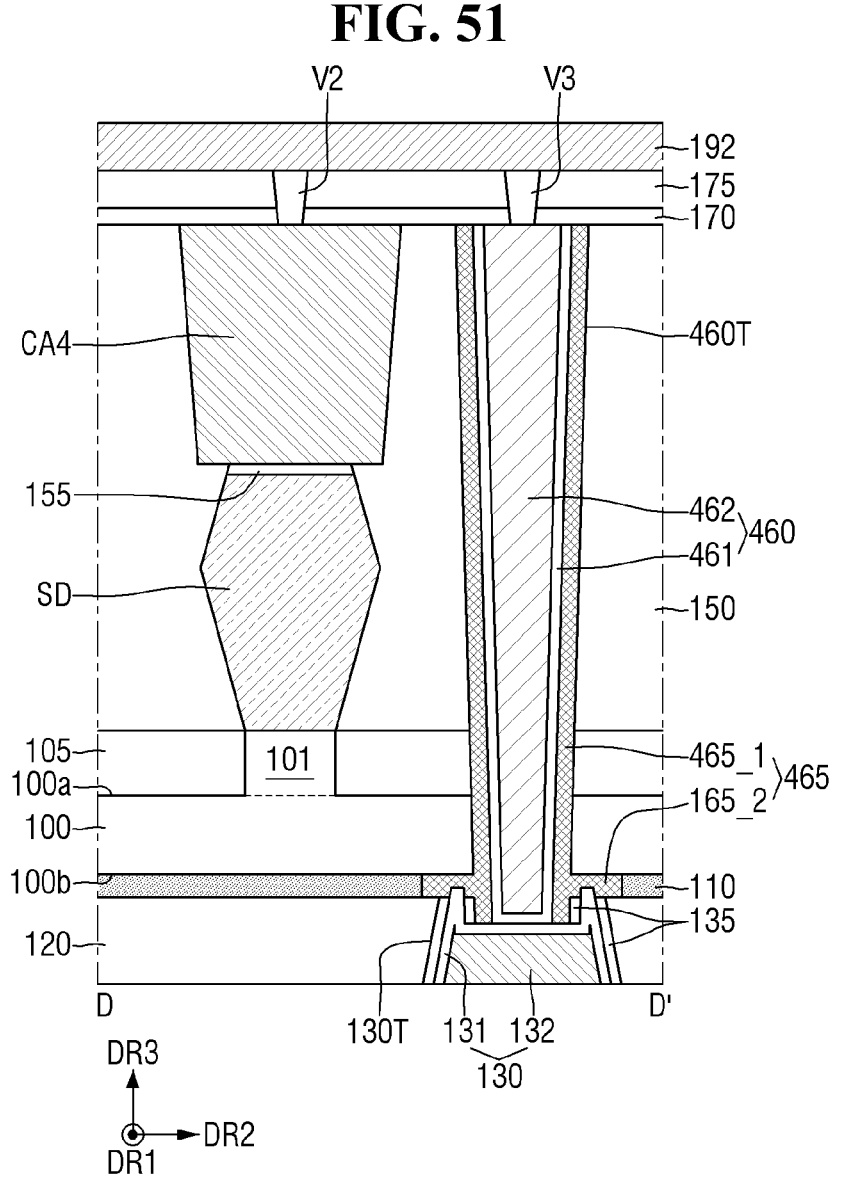
FIG. 51 is a cross-sectional view taken along line D-D' of FIG. 50.

Referring to FIGS. 50 and 51, in the semiconductor device according to some other embodiments, a through via 460 may be spaced apart from a source/drain contact CA4 in the second horizontal direction DR2.

For example, a through via trench 460T may extend into the second substrate 120 by passing through the first interlayer insulating layer 150, the field insulating layer 105, the first substrate 100, and the sacrificial layer 110 in the vertical direction DR3. A through via insulating layer 465 may be disposed along sidewalls of the through via trench 460T. That is, a first portion 465_1 of the through via insulating layer 465 may be disposed along the sidewalls of the through via trench 460T.

For example, the through via 460 may be disposed on the through via insulating layer 465 inside the through via trench 460T. The through via 460 may include a through via bather layer 461 disposed on the through via insulating layer 465 and a through via filling layer 462 disposed on the through via bather layer 461.

For example, an upper surface of each of the through via insulating layer 465 and the through via 460 may be formed on the same plane as the upper surface of the first interlayer insulating layer 150. The third via V3 may pass through the second interlayer insulating layer 175 and the etch stop layer 170 in the vertical direction DR3. The third via V3 may connect the through via 460 with the second upper wiring layer 192.

Hereinafter, a semiconductor device according to some other embodiments will be described with reference to FIG. 52. The following description will be based on differences from the semiconductor device shown in FIGS. 1 to 5.

Figure 52:
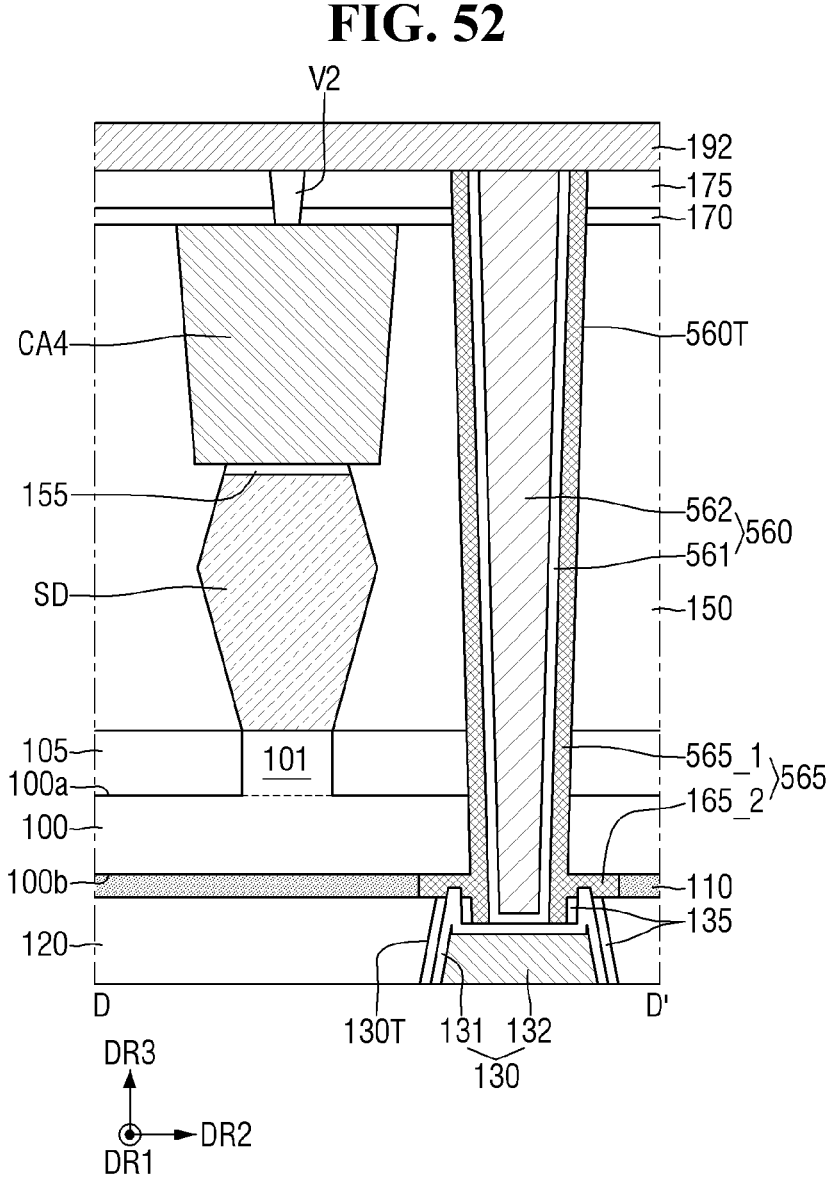
FIG. 52 is a cross-sectional view illustrating a semiconductor device according to some other embodiments.

FIG. 52 is a cross-sectional view illustrating a semiconductor device according to some other embodiments.

Referring to FIG. 52, in the semiconductor device according to some other embodiments, a through via 560 may be spaced apart from the source/drain contact CA4 in the second horizontal direction DR2.

For example, a through via trench 560T may extend into the second substrate 120 by passing through the second interlayer insulating layer 175, the etch stop layer 170, the first interlayer insulating layer 150, the field insulating layer

105, the first substrate 100 and the sacrificial layer 110 in the vertical direction DR3. A through via insulating layer 565 may be disposed along sidewalls of the through via trench 560T. That is, a first portion 565_1 of the through via insulating layer 565 may be disposed along the sidewalls of the through via trench 560T.

For example, the through via 560 may be disposed on the through via insulating layer 565 inside the through via trench 560T. The through via 560 may include a through via bather layer 561 disposed on the through via insulating layer 565 and a through via filling layer 562 disposed on the through via barrier layer 561.

For example, an upper surface of each of the through via insulating layer 565 and the through via 560 may be formed on the same plane as the upper surface of the second interlayer insulating layer 175. Each of the through via insulating layer 565 and the through via 560 may be in contact with the second upper wiring layer 192. That is, the through via 560 may be directly connected to the second upper wiring layer 192.

While aspects of embodiments have been particularly shown and described, it will be understood that various changes in form and details may be made therein without departing from the spirit and scope of the following claims.

What is claimed is:

1. A semiconductor device comprising:
a first substrate comprising a first surface and a second surface opposite the first surface;
an active pattern extending in a first horizontal direction on the first surface of the first substrate;
a gate electrode extending in a second horizontal direction different from the first horizontal direction on the active pattern;
a source/drain region on at least one side of the gate electrode on the active pattern;
a first interlayer insulating layer on the source/drain region;
a sacrificial layer on the second surface of the first substrate;
a lower wiring layer on a lower surface of the sacrificial layer;
a through via trench extending to the lower wiring layer by passing through the first interlayer insulating layer and the sacrificial layer in a vertical direction;
a through via inside the through via trench and connected to the lower wiring layer;
a recess inside the sacrificial layer and protruding from a sidewall of the through via trench in the second horizontal direction; and
a through via insulating layer comprising a first portion extending along the sidewall of the through via trench and a second portion in the recess,
wherein the second portion of the through via insulating layer is in contact with an uppermost surface of the lower wiring layer.

2. The semiconductor device of claim 1, wherein the uppermost surface of the lower wiring layer is lower than an upper surface of the sacrificial layer.

3. The semiconductor device of claim 1, wherein a sidewall of the second portion of the through via insulating layer, which is in contact with the sacrificial layer, extends past a sidewall of the lower wiring layer in the second horizontal direction.

4. The semiconductor device of claim 1, wherein an upper surface of the through via is and an upper surface of the first interlayer insulating layer are provided on a common plane.

5. The semiconductor device of claim 1, further comprising a second substrate surrounding a sidewall of the lower wiring layer on the lower surface of the sacrificial layer, the second substrate comprising silicon (Si).

6. The semiconductor device of claim 5, further comprising a lower wiring insulating layer between the lower wiring layer and the second substrate.

7. The semiconductor device of claim 6, wherein at least a portion of the lower wiring insulating layer is between the first portion of the through via insulating layer and the lower wiring layer.

8. The semiconductor device of claim 1, further comprising a lower interlayer insulating layer surrounding a sidewall of the lower wiring layer on the lower surface of the sacrificial layer.

9. The semiconductor device of claim 1, wherein the uppermost surface of the lower wiring layer is higher than the lower surface of the sacrificial layer.

10. The semiconductor device of claim 1, further comprising a source/drain contact inside the first interlayer insulating layer,
wherein the source/drain contact is connected to the source/drain region, and
wherein the source/drain contact is in contact with the through via.

11. The semiconductor device of claim 1, further comprising a source/drain contact extending into the first interlayer insulating layer,
wherein the source/drain contact is connected to the source/drain region, and
wherein the source/drain contact is spaced apart from the through via in the second horizontal direction.

12. The semiconductor device of claim 1, further comprising:
an etch stop layer on the first interlayer insulating layer;
a second interlayer insulating layer on the etch stop layer;
a third interlayer insulating layer on the second interlayer insulating layer; and
an upper wiring layer inside the third interlayer insulating layer,
wherein the through via is connected to the upper wiring layer and passes through the etch stop layer and the second interlayer insulating layer in the vertical direction.

13. A semiconductor device comprising:
a first substrate comprising a first surface and a second surface opposite the first surface;
an active pattern extending in a first horizontal direction on the first surface of the first substrate;
a gate electrode extending in a second horizontal direction different from the first horizontal direction on the active pattern;
an interlayer insulating layer surrounding a sidewall of the gate electrode;
a sacrificial layer on the second surface of the first substrate;
a lower wiring trench on a lower surface of the sacrificial layer;
a lower wiring layer inside the lower wiring trench and spaced apart from the sacrificial layer;
a through via connected to the lower wiring layer and passing through the interlayer insulating layer and the sacrificial layer in a vertical direction; and
a through via insulating layer comprising a first portion extending along a sidewall of the through via and a second portion protruding from the first portion in the second horizontal direction, wherein a lower surface of the second portion of the through via insulating layer and the lower surface of the sacrificial layer are provided on a first common plane, and an upper surface of the second portion of the through via insulating layer and an upper surface of the sacrificial layer are provided on a second common plane, and wherein the second portion of the through via insulating layer is in contact with an uppermost surface of the lower wiring layer.

14. The semiconductor device of claim 13, wherein the uppermost surface of the lower wiring layer is lower than the upper surface of the sacrificial layer.

15. The semiconductor device of claim 13, further comprising a second substrate surrounding a sidewall of the lower wiring layer on the lower surface of the sacrificial layer, the second substrate comprises silicon (Si).

16. The semiconductor device of claim 13, further comprising a lower interlayer insulating layer surrounding a sidewall of the lower wiring layer on the lower surface of the sacrificial layer.

17. The semiconductor device of claim 13, further comprising:

a source/drain region on at least one side of the gate electrode on the active pattern; and a source/drain contact inside the interlayer insulating layer, wherein the source/drain contact is connected to the source/drain region, and wherein the source/drain contact is in contact with the through via.

18. The semiconductor device of claim 13, further comprising:

a source/drain region on at least one side of the gate electrode on the active pattern; and a source/drain contact inside the interlayer insulating layer, wherein the source/drain contact is connected to the source/drain region, and wherein the source/drain contact is spaced apart from the through via in the second horizontal direction.

19. The semiconductor device of claim 13, wherein the sacrificial layer comprises silicon germanium (SiGe).

20. A semiconductor device comprising:

a first substrate comprising a first surface and a second surface opposite the first surface;

an active pattern extending in a first horizontal direction on the first surface of the first substrate;

a plurality of nanosheets spaced apart from each other in a vertical direction on the active pattern;

a gate electrode extending in a second horizontal direction different from the first horizontal direction on the active pattern, the gate electrode surrounding the plurality of nanosheets;

a source/drain region on at least one side of the gate electrode on the active pattern;

a first interlayer insulating layer on the source/drain region;

a sacrificial layer on the second surface of the first substrate, the sacrificial layer comprising silicon germanium (SiGe);

a second substrate on a lower surface of the sacrificial layer, the second substrate comprising silicon (Si);

a lower wiring layer inside the second substrate;

a lower wiring insulating layer between the lower wiring layer and the second substrate;

a through via trench extending through the first interlayer insulating layer and the sacrificial layer in the vertical direction to the lower wiring layer;

a through via inside the through via trench and connected to the lower wiring layer;

a source/drain contact inside the first interlayer insulating layer, the source/drain contact being connected to the source/drain region, and the source/drain contact being in contact with the through via;

a recess inside the sacrificial layer, the recess protruding from a sidewall of the through via trench in the second horizontal direction; and a through via insulating layer comprising a first portion along the sidewall of the through via trench and a second portion inside the recess, wherein the second portion of the through via insulating layer is in contact with an uppermost surface of the lower wiring layer, and wherein the uppermost surface of the lower wiring layer is lower than an upper surface of the sacrificial layer.

* * * * *